United States Patent
Fujii et al.

(10) Patent No.: US 10,879,303 B2
(45) Date of Patent: Dec. 29, 2020

(54) DETECTOR, PET SYSTEM AND X-RAY CT SYSTEM

(71) Applicant: HAMAMATSU PHOTONICS K.K., Hamamatsu (JP)

(72) Inventors: Yoshimaro Fujii, Hamamatsu (JP); Terumasa Nagano, Hamamatsu (JP); Kazuhisa Yamamura, Hamamatsu (JP); Kenichi Sato, Hamamatsu (JP); Ryutaro Tsuchiya, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 14/768,843

(22) PCT Filed: Feb. 19, 2014

(86) PCT No.: PCT/JP2014/053941
§ 371 (c)(1),
(2) Date: Aug. 19, 2015

(87) PCT Pub. No.: WO2014/129507
PCT Pub. Date: Aug. 28, 2014

(65) Prior Publication Data
US 2015/0380457 A1 Dec. 31, 2015

(30) Foreign Application Priority Data
Feb. 20, 2013 (JP) .................................. 2013-031555

(51) Int. Cl.
*H01L 27/144* (2006.01)
*H01L 27/146* (2006.01)
(Continued)

(52) U.S. Cl.
CPC ..... *H01L 27/14663* (2013.01); *G01N 23/046* (2013.01); *G01T 1/241* (2013.01);
(Continued)

(58) Field of Classification Search
CPC ......... H01L 27/14663; H01L 27/14636; H01L 27/14634; H01L 27/14661;
(Continued)

(56) References Cited

U.S. PATENT DOCUMENTS 5,972,788 A * 10/1999 Ryan ................. H01L 21/76838
257/E21.008
6,326,256 B1 12/2001 Bailey et al.
(Continued)

FOREIGN PATENT DOCUMENTS

CN 1685513 10/2005
EP 1755171 A1 2/2007
(Continued)

OTHER PUBLICATIONS

Al-sarawi et al. A review of 3-D packaging technology, IEEE Transactions on Components, Packaging, and Manufacturing Technology—Part B, vol. 21, No. 1, pp. 2-14 (Year: 1998).*
(Continued)

*Primary Examiner* — David P Porta
*Assistant Examiner* — Shun Lee
(74) *Attorney, Agent, or Firm* — Faegre Drinker Biddle & Reath LLP

(57) ABSTRACT

Each semiconductor chip of a detector comprises a semiconductor substrate having a plurality of photodetector units, an insulating layer formed on a front face of the semiconductor substrate, a common electrode arranged on the insulating layer, a readout line for electrically connecting a quenching resistance of each photodetector unit and the common electrode to each other, and a through electrode extending from the common electrode to a rear face of the semiconductor substrate through a through hole of the semiconductor substrate.

33 Claims, 76 Drawing Sheets

(51) Int. Cl.
*G01T 1/24* (2006.01)
*G01N 23/046* (2018.01)
*G01T 1/29* (2006.01)
*H01L 31/0224* (2006.01)
*H01L 31/115* (2006.01)

(52) U.S. Cl.
CPC ...... *G01T 1/2985* (2013.01); *H01L 27/14618* (2013.01); *H01L 27/14634* (2013.01); *H01L 27/14636* (2013.01); *H01L 27/14661* (2013.01); *H01L 31/022408* (2013.01); *H01L 31/115* (2013.01); *H01L 2224/13* (2013.01)

(58) Field of Classification Search
CPC ............. H01L 27/14618; H01L 31/115; H01L 31/022408; G01N 23/046; G01T 1/2985; G01T 1/241
See application file for complete search history.

(56) References Cited

U.S. PATENT DOCUMENTS

| | | | |
|---|---|---|---|
| 2002/0148967 A1* | 10/2002 | Iwanczyk | H01L 27/1463 250/370.11 |
| 2005/0124079 A1* | 6/2005 | Steinmann | G01R 31/2884 438/14 |
| 2005/0253132 A1* | 11/2005 | Marshall | H01L 27/14609 257/24 |
| 2006/0056581 A1 | 3/2006 | Hoffman et al. | |
| 2006/0071173 A1 | 4/2006 | Zeman et al. | |
| 2006/0175529 A1 | 8/2006 | Harmon et al. | |
| 2007/0104311 A1* | 5/2007 | Possin | A61B 6/032 378/19 |
| 2008/0240341 A1* | 10/2008 | Possin | A61B 6/032 378/19 |
| 2008/0277588 A1 | 11/2008 | Zeitler et al. | |
| 2008/0308738 A1 | 12/2008 | Li et al. | |
| 2009/0008566 A1* | 1/2009 | Agarwal | H01L 27/14658 250/370.11 |
| 2009/0184317 A1 | 7/2009 | Sanfilippo et al. | |
| 2010/0108893 A1 | 5/2010 | Flitsch et al. | |
| 2010/0108900 A1 | 5/2010 | Burr et al. | |
| 2010/0200763 A1* | 8/2010 | Thon | H01J 43/18 250/370.11 |
| 2012/0132817 A1 | 5/2012 | Shaw et al. | |

FOREIGN PATENT DOCUMENTS

| | | |
|---|---|---|
| JP | H01-205465 A | 8/1989 |
| JP | 2001-060677 | 3/2001 |
| JP | 2004-172228 | 6/2004 |
| JP | 2004-207505 | 7/2004 |
| JP | 2004-273848 | 9/2004 |
| JP | 2005-106703 | 4/2005 |
| JP | 2008-507124 | 3/2008 |
| JP | 2008-130733 | 6/2008 |
| JP | 2008-246206 A | 10/2008 |
| JP | 2010-170108 | 8/2010 |
| JP | 2011-053130 | 3/2011 |
| JP | 2013-089017 | 5/2013 |
| TW | 201232800 | 8/2012 |
| WO | WO-03/096427 A1 | 11/2003 |
| WO | WO 2004/030102 | 4/2004 |
| WO | WO 2012/057082 | 5/2012 |

OTHER PUBLICATIONS

Beica et al. Advanced metallization for 3D integration, 2008 10th Electronics Packaging Technology Conference, pp. 212-218 (Year: 2008).*

Downey, F., "IMD Stack Thermal Resistance Effects on SiCr Thin Film Resistor's Current Density Performance," Integrated Reliability Workshop Final Report, 2009, IRW '09, IEEE International, IEEE, Piscataway, NJ, USA, ISBN: 978-1-4244-3921-8, Oct. 18, 2009, pp. 148-150, XP031612266.

T. Nagano et al., "Improvement of Multi-Pixel Photon Counter (MPPC)," IEEE Nuclear Science Symposium and Medical Imaging Conference, Conference Publications, 2011, pp. 1657-1659.

"Engineered Thin Film Solutions Brochure", American Technical Ceramics , 2012, p. 1-p. 20.

Lee et al., "Effect on MIM structured parallel quenching capacitor of SiPMs," Nuclear Instruments and Methods in Physics Research A, vol. 650, No. 1, pp. 125-128 (2010).

* cited by examiner

Fig. 17
(A)
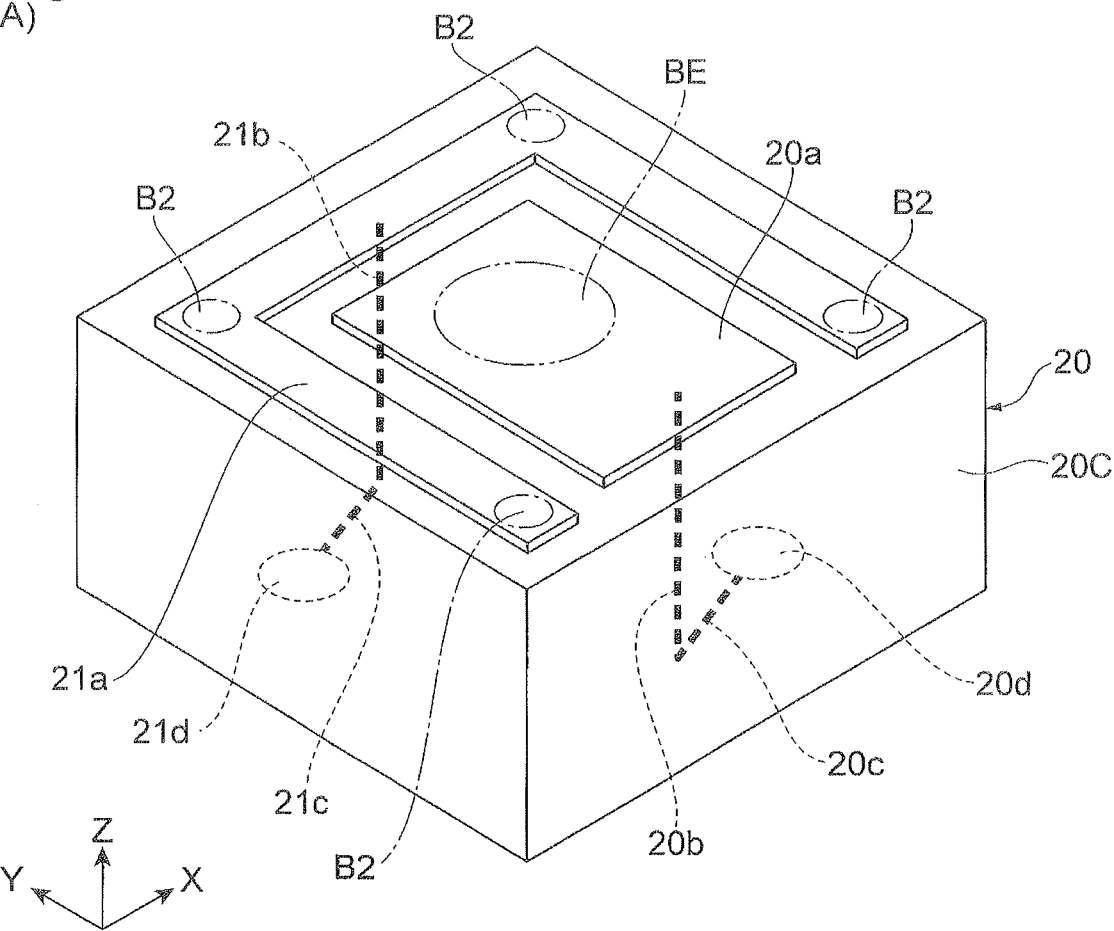
(B)
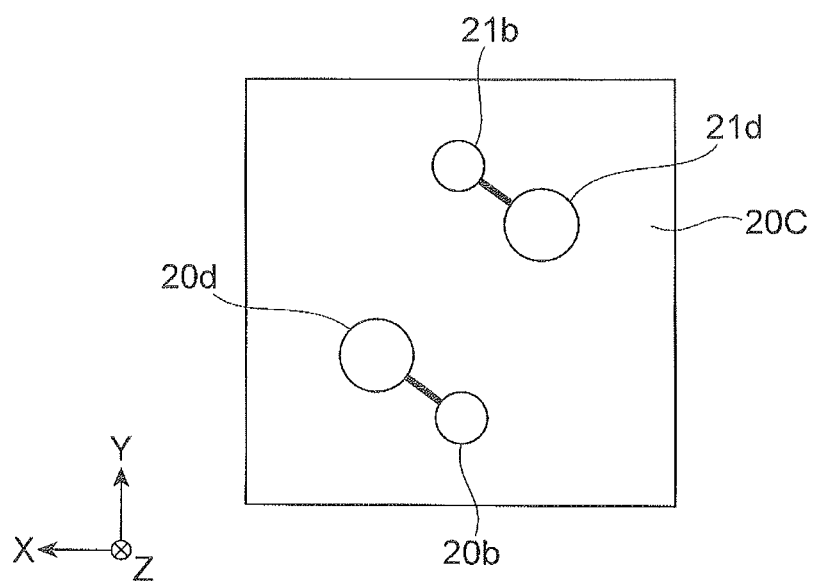

Fig. 18
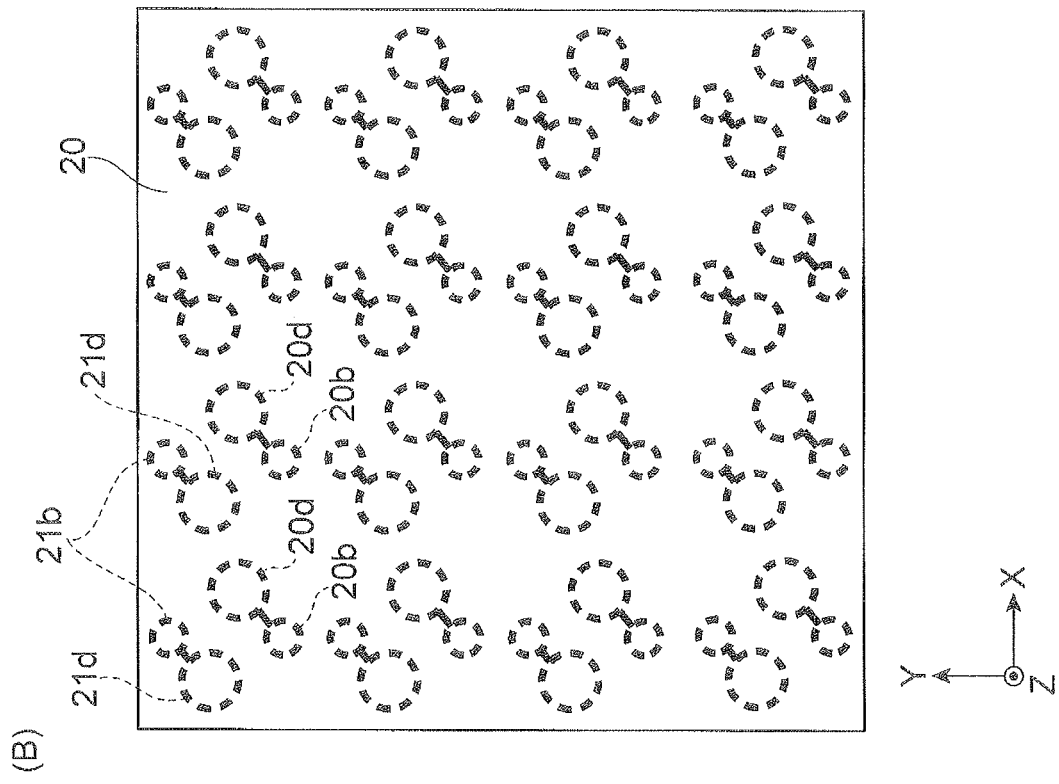
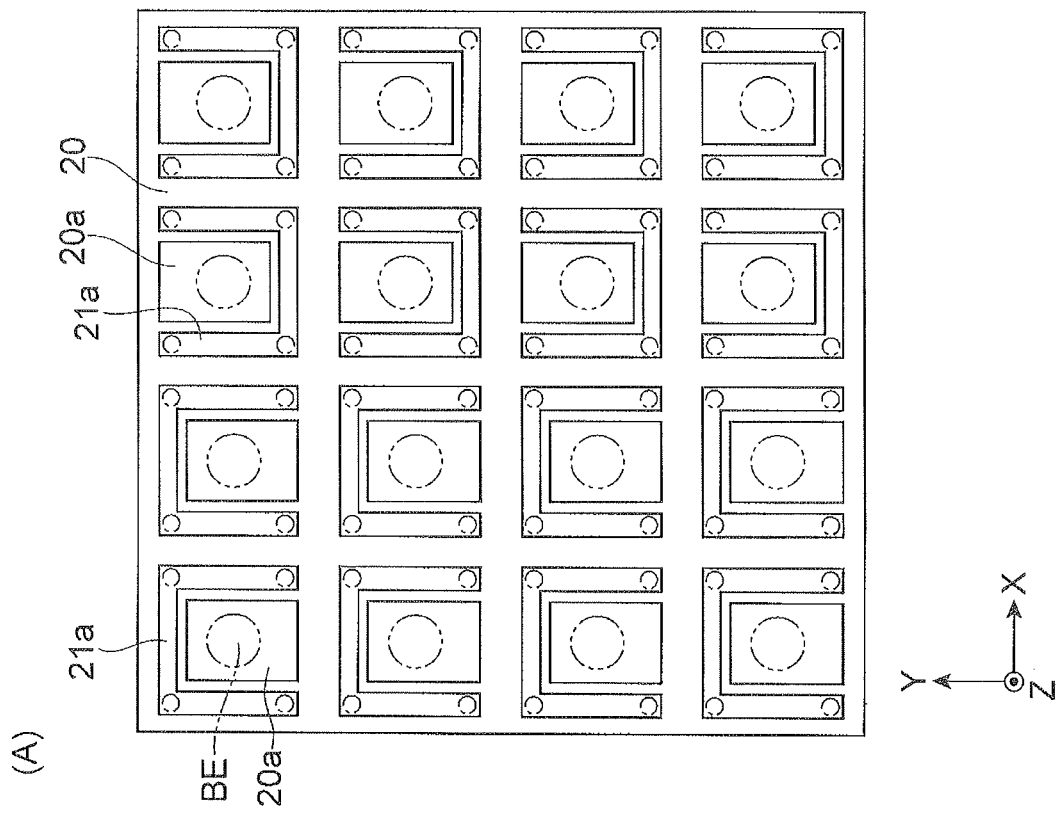

Fig. 19
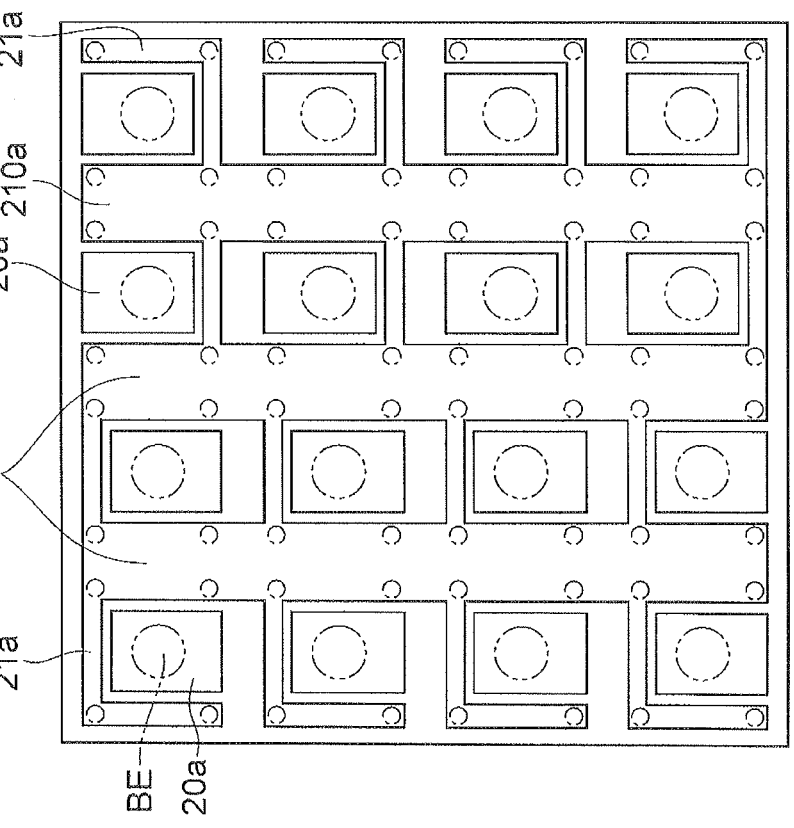
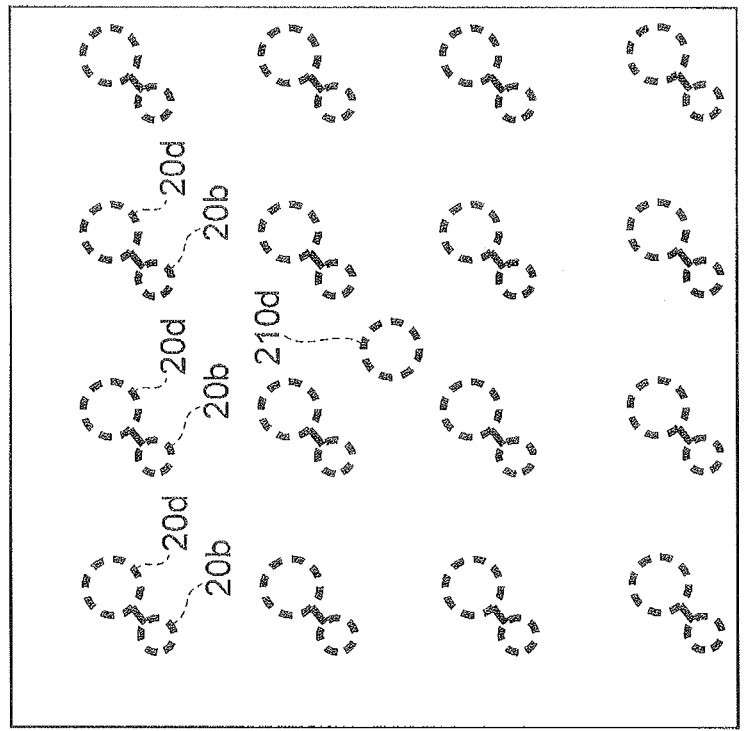

Fig.23
(A)
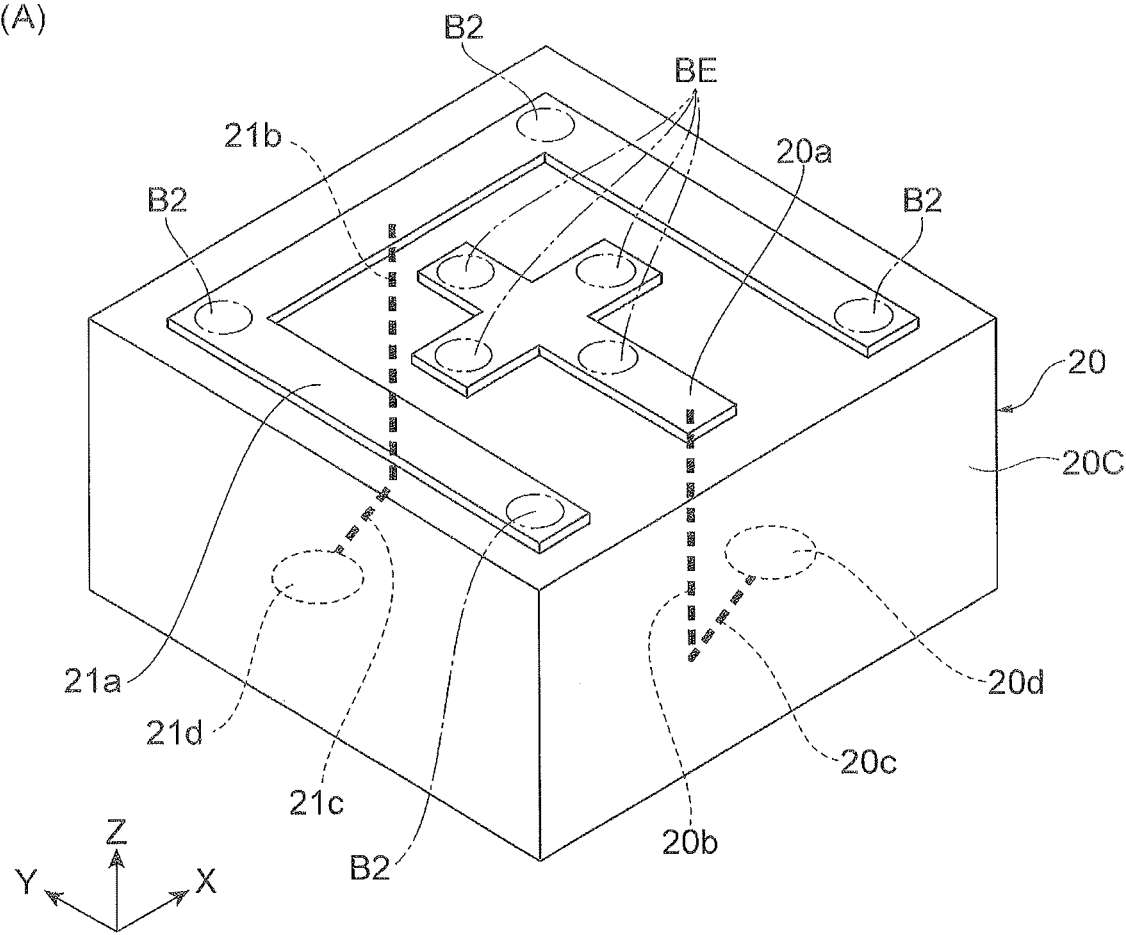
(B)
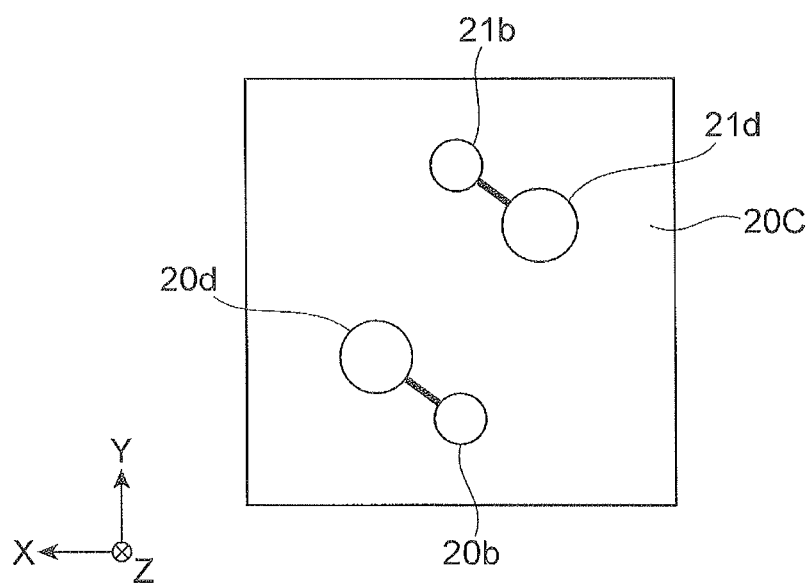

Fig. 26
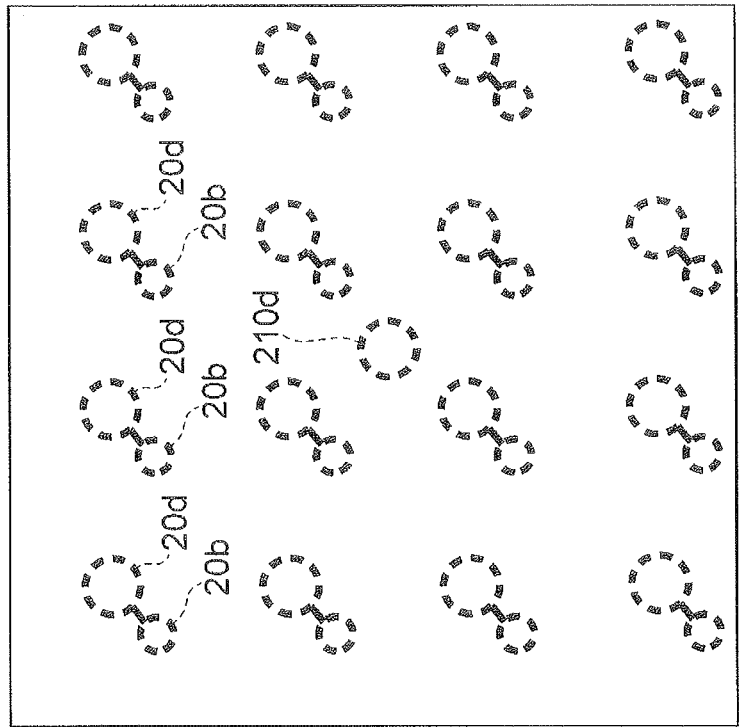
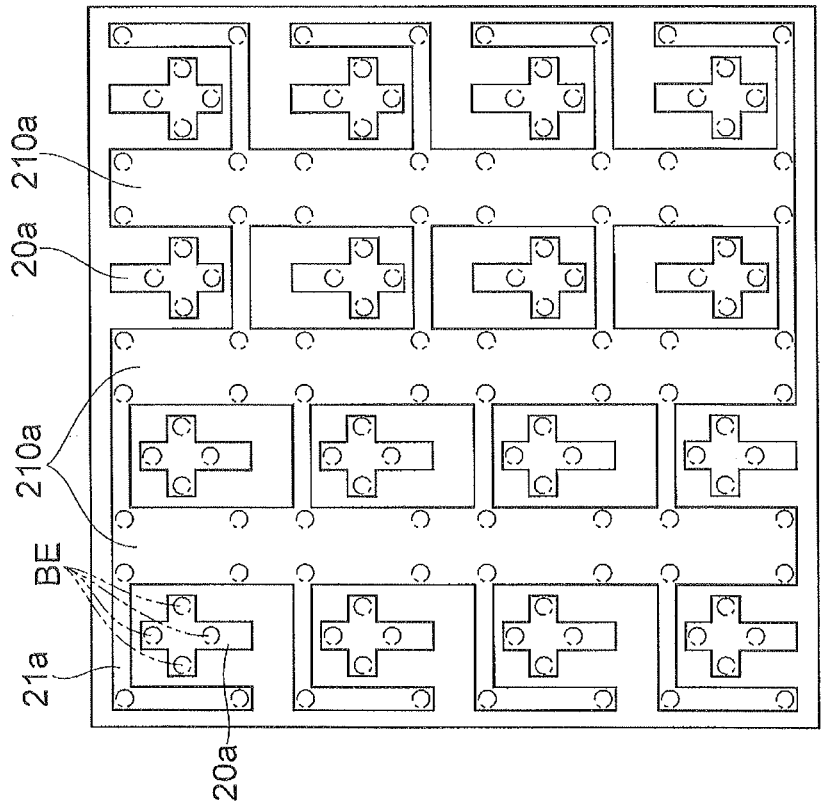

Fig.29
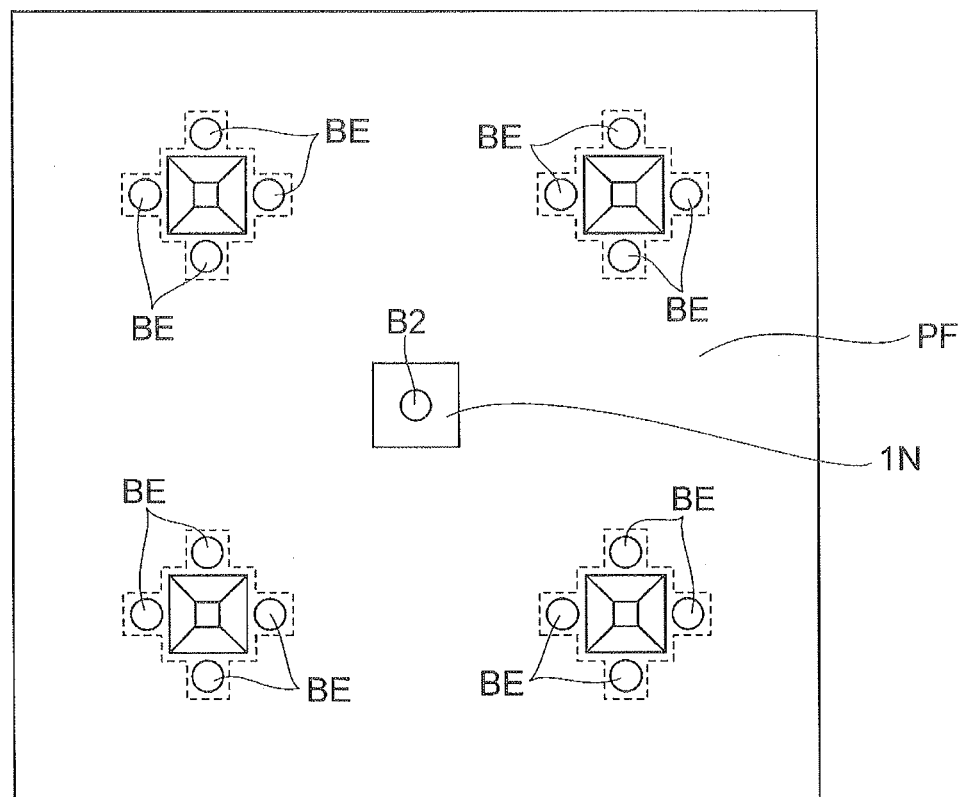
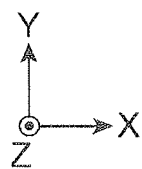

Fig.33
(A)
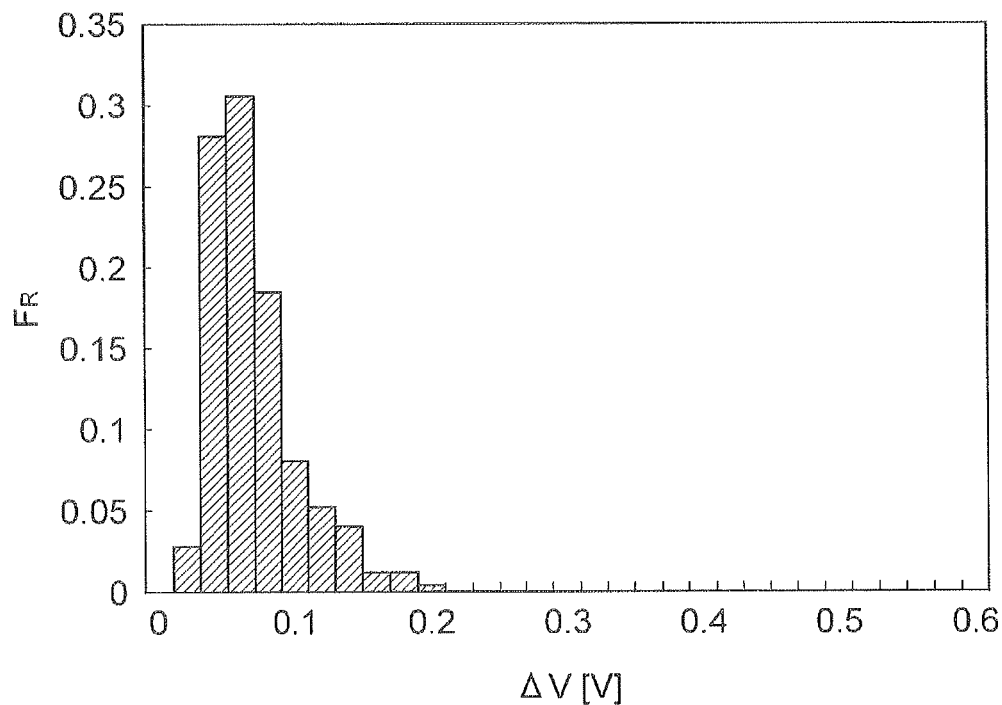
(B)
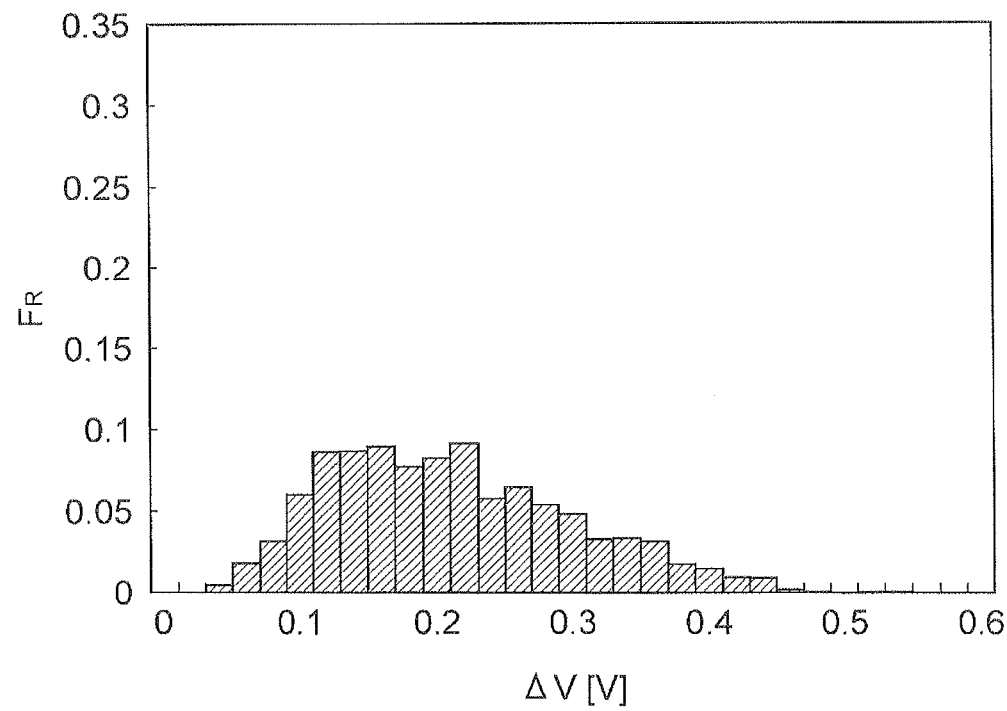

*Fig.39*
(A) 50μm interval
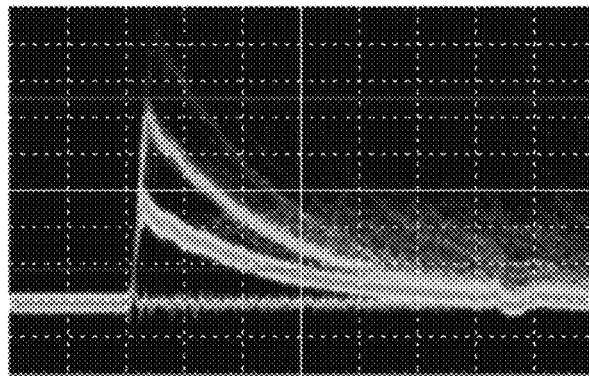
(B) 20μm interval
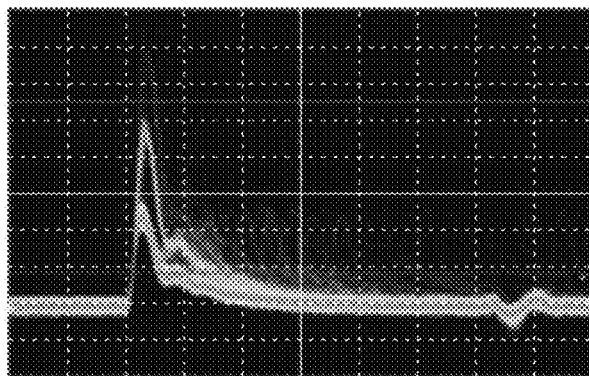
(C) 15μm interval
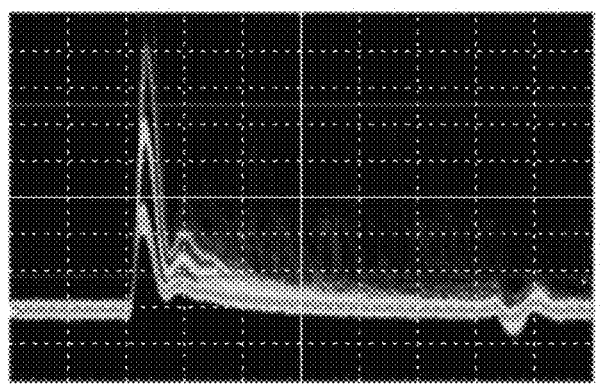
(D) 10μm interval
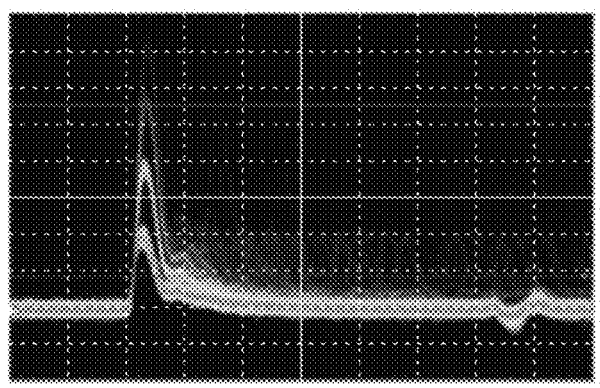

DETECTOR, PET SYSTEM AND X-RAY CT SYSTEM

TECHNICAL FIELD

The present invention relates to a detector and a PET system and an X-ray CT system which use the same.

BACKGROUND ART

An X-ray CT (Computed Tomography) system irradiates an organism with X-rays from the outside and detects the X-rays transmitted through the organism with detectors. The CT system comprises a ring-shaped gantry (frame), a cradle (bed), and a computer for operation. An X-ray source and a plurality of detectors are arranged within the gantry, and imaging is performed while rotating them within the gantry.

On the other hand, a positron CT system (Positron Emission Tomography (PET) system) introduces a drug labeled with an isotope adapted to emit positrons (positive electrons) into an organism and detects γ-rays derived from the drug with a plurality of detectors. The PET system also comprises a ring-shaped gantry (frame), a cradle (bed), and a computer for operation, while the gantry contains therewithin a plurality of detectors arranged about the organism.

An efficient detector for X-rays or γ-rays can be constructed by combining a scintillator and a photodetector.

A CT/PET system combining an X-ray CT system and a PET system together and a composite diagnostic system combining an MRI (magnetic resonance imaging) system with them have also been considered.

Photodetectors (photodiode arrays) employed in diagnostic systems such as those mentioned above are described in Patent Literatures 1 and 2, for example. A photodiode array such as an SiPM (Silicon Photon Multiplier) or PPD (Pixelated Photon Detector) has a structure in which APDs (avalanche photodiodes) are arranged in a matrix, a plurality of APDs are connected in parallel, and the sum of APD outputs is read out. When operated in Geiger mode, the APD can detect weak light. That is, when a photon is incident on the APD, a carrier generated within the APD is outputted to the outside through a quenching resistance and a wiring pattern for signal readout. A current flows through a pixel where an electron avalanche is generated in the APD, while a voltage drop occurs in a quenching resistance on the order of several hundred kΩ connected in series to the pixel. This voltage drop lowers the voltage applied to an amplification region of the APD, thereby terminating the multiplication action caused by the electron avalanche. Thus, the APD outputs one pulse signal when one photon is incident thereon. Some improvements have been made on photodiode structures (see Non Patent Literature 1).

CITATION LIST

Patent Literature

Patent Literature 1: European Patent Application Publication 1755171
Patent Literature 2: U.S. Patent Application Publication 2006/175529

Non Patent Literature

Non Patent Literature 1: "Improvement of Multi-Pixel Photon Counter (MPPC)", T. Nagano, K. Yamamoto, K. Sato, N. Hosokawa, A. Ishida, T. Baba, IEEE Nuclear Science Symposium and Medical Imaging Conference, Conference Publications, p. 1657-1659, 2011.

SUMMARY OF INVENTION

Technical Problem

However, the conventional detectors have been problematic in that characteristics such as time resolution are insufficient in the detector as a whole. In view of such a problem, it is an object of the present invention to provide a detector which can improve the above-mentioned characteristics and a PET system and an X-ray CT system which use the same.

Solution to Problem

For achieving the above-mentioned object, the detector in accordance with the present invention is a detector comprising a wiring board, a plurality of semiconductor chips arranged on the wiring board while being two-dimensionally separated from each other, and first and second bump electrodes arranged between each of the semiconductor chips and the wiring board; each of the semiconductor chips comprising a semiconductor substrate having a plurality of photodetector units arranged two-dimensionally, an insulating layer formed on a front face of the semiconductor substrate, a common electrode arranged on the insulating layer, a readout line for electrically connecting a quenching resistance of each of the photodetector units and the common electrode to each other, and a through electrode extending from the common electrode to a rear face of the semiconductor substrate through a through hole of the semiconductor substrate; each of the photodetector units comprising an APD having a first semiconductor region of a first conduction type and a second semiconductor region of a second conduction type for constructing a p-n junction with the first semiconductor region and outputting a carrier, and the quenching resistance electrically connected to the second semiconductor region of the APD; the first bump electrode electrically connecting the through electrode and the wiring board to each other; the second bump electrode electrically connecting the first semiconductor region of the APD and the wiring board to each other.

A bias voltage for operation in Geiger mode is applied through the first and second bump electrodes to both ends of the APD (avalanche photodiode) included in each photodetector unit. Carriers generated in a plurality of APDs when light (an energy line) is incident thereon flow through their respective quenching resistances to the common electrode on the semiconductor substrate and travel from the common electrode through the through electrode and first bump electrode to the wiring board, so as to be taken out.

Thus constructed APD has a structure for shortening the carrier transmission path by using the through electrode and the like, thereby lowering its wiring resistance. This improves the carrier transmission speed from the APD, i.e., time resolution. When a plurality of photons are incident on one semiconductor chip comprising a plurality of such APDs, the improvement in time resolution enables photon detection with higher accuracy. While the same time resolution is not guaranteed in different semiconductor chips because of variations and errors in their manufacture and the like, fluctuations in characteristics among the semiconductor chips can be reduced by selecting semiconductor chips having a product characteristic within a fixed range and bonding them to the wiring board through bump electrodes at the time of assembly.

Since the two-dimensionally arranged semiconductor chips are separated from each other, light incident on a specific semiconductor chip is less likely to leak to another semiconductor chip and generate crosstalk, while gaps between the semiconductor chips can hinder warps of the wiring board caused by its expansion/contraction from affecting the semiconductor chips. That is, characteristics such as time resolution, crosstalk, and tolerance to temperature changes in the detector as a whole are ameliorated remarkably.

A scintillator may be disposed on a front face of each of the semiconductor chips with an insulator interposed therebetween.

The scintillator generates light having a wavelength longer than that of a radiation such as X-rays and γ-rays incident thereon. When visible light or infrared light is incident on Si, photoelectric conversion efficiently occurs within Si. Constructing the APD from Si can improve the sensitivity for visible light and infrared light. The insulator is made of a glass sheet or a resin and can slightly diffuse light from the scintillator before it reaches the APD, while protecting the front face of the APD. The resin can also function to bond the scintillator and the semiconductor chip to each other.

Each of the photodetector units may comprise a surface electrode which is electrically connected to the second semiconductor region while surrounding the second semiconductor region along an outer edge thereof.

Carriers generated in response to light incident on the first and second semiconductor regions travel from the second semiconductor region to the common electrode through the surface electrode, quenching resistance, and readout line in sequence. The surface electrode can generate a fixed electric field in the outer edge of the second semiconductor region and improve the output stability of the APD.

Letting a plane including the front face of the second semiconductor region be a reference plane, the distance from the reference plane to the readout line may be longer than that from the reference plane to the surface electrode, the readout line being located between the APDs adjacent to each other. The readout line is formed as a layer located higher than the surface electrode and thus is free of spatial restrictions imposed by the surface electrode, which enables it to increase its width and the like, thereby lowering the time constant and improving the signal readout speed.

The detector may comprise a first contact electrode in contact with the second semiconductor region and a second contact electrode, arranged at such a position as to overlap the first contact electrode while in contact with the first contact electrode, including a material different from that of the first contact electrode; the quenching resistance being continuous with the second contact electrode. Carriers generated at the p-n junction by photons incident thereon flow to the quenching resistance through the first and second contact electrodes and reach the wiring board through the readout line, common electrode, and through electrode connected to the quenching resistance.

Arranging the second contact electrode at such a position as to overlap the first contact electrode can minimize the space required for connecting the quenching resistance and the first contact electrode to each other. Inevitably, the first and second contact electrodes are not flush with each other and have positions in the height direction different from each other, whereby the quenching resistance continuously extends from the second contact electrode. This can save wiring within the photodetector unit, thereby remarkably increasing the aperture ratio of the photodetector unit.

Preferably, the second contact electrode and quenching resistance comprise SiCr. SiCr has such a high light transmittance that, even when the quenching resistance exists within the photodetector unit, incident photons pass through the quenching resistance, whereby the effective aperture ratio can be increased.

The PET system comprises a cradle and a gantry having an opening for placing the cradle, while a plurality of any of the above-mentioned detectors are arranged so as to surround the opening of the gantry. A subject is arranged in the cradle. Since the detectors are arranged so as to surround the opening of the gantry, γ-rays emitted from the subject can be detected by a plurality of detectors, and an image concerning internal information of the subject can be obtained by image processing of detected signals. Since the overall characteristics of the detectors are improved remarkably, this PET system can acquire high-quality images.

The X-ray CT system comprises a cradle and a gantry having an opening for placing the cradle and incorporating an X-ray source for emitting an X-ray within the opening, while a plurality of any of the above-mentioned detectors are arranged at positions where the X-ray from the X-ray source is incident. A subject is arranged in the cradle located within the opening of the gantry and is irradiated with X-rays from the X-ray source. The X-rays transmitted through the subject can be detected by a plurality of detectors, and an image concerning internal information of the subject can be obtained by image processing of detected signals. Since the overall characteristics of the detectors are improved remarkably, this X-ray CT system can acquire high-quality images.

Advantageous Effects of Invention

Characteristics such as time resolution of the detector of the present invention as a whole can be improved, whereby the PET system and X-ray CT system using the same can yield high-quality images and thus can improve their system characteristics.

BRIEF DESCRIPTION OF DRAWINGS

FIG. 17 is a perspective view (A) and bottom view (B) of basic constituents of a wiring board;

FIG. 18 is a plan view (A) and bottom view (B) of a wiring board;

FIG. 19 is a plan view (A) and bottom view (B) of a wiring board;

FIG. 23 is a perspective view (A) and bottom view (B) of basic constituents of a wiring board;

FIG. 26 is a plan view (A) and bottom view (B) of a wiring board;

FIG. 29 is a bottom view of the semiconductor chip S1 in accordance with an improvement;

FIG. 33 is a graph illustrating the relationship between the variation ΔV of operation voltage (V) and the relative frequency (product number ratio) $F_R$ ((A): discrete array; (B): monolithic array);

FIG. 39 is a graph illustrating the relationship between the photodiode output and time;

FIG. 45 is a diagram illustrating the relationship of connections among electrodes, lines, and the like;

FIG. 46 is a diagram illustrating the relationship of connections among electrodes, lines, and the like;

FIG. 53 is a diagram illustrating the relationship of connections among electrodes, lines, and the like;

DESCRIPTION OF EMBODIMENTS

In the following, the detector, PET system, and Xray CT system in accordance with embodiments of the present invention will be explained. The same signs will be used for the same constituents or those having the same functions while omitting their overlapping descriptions.

Figure 1:
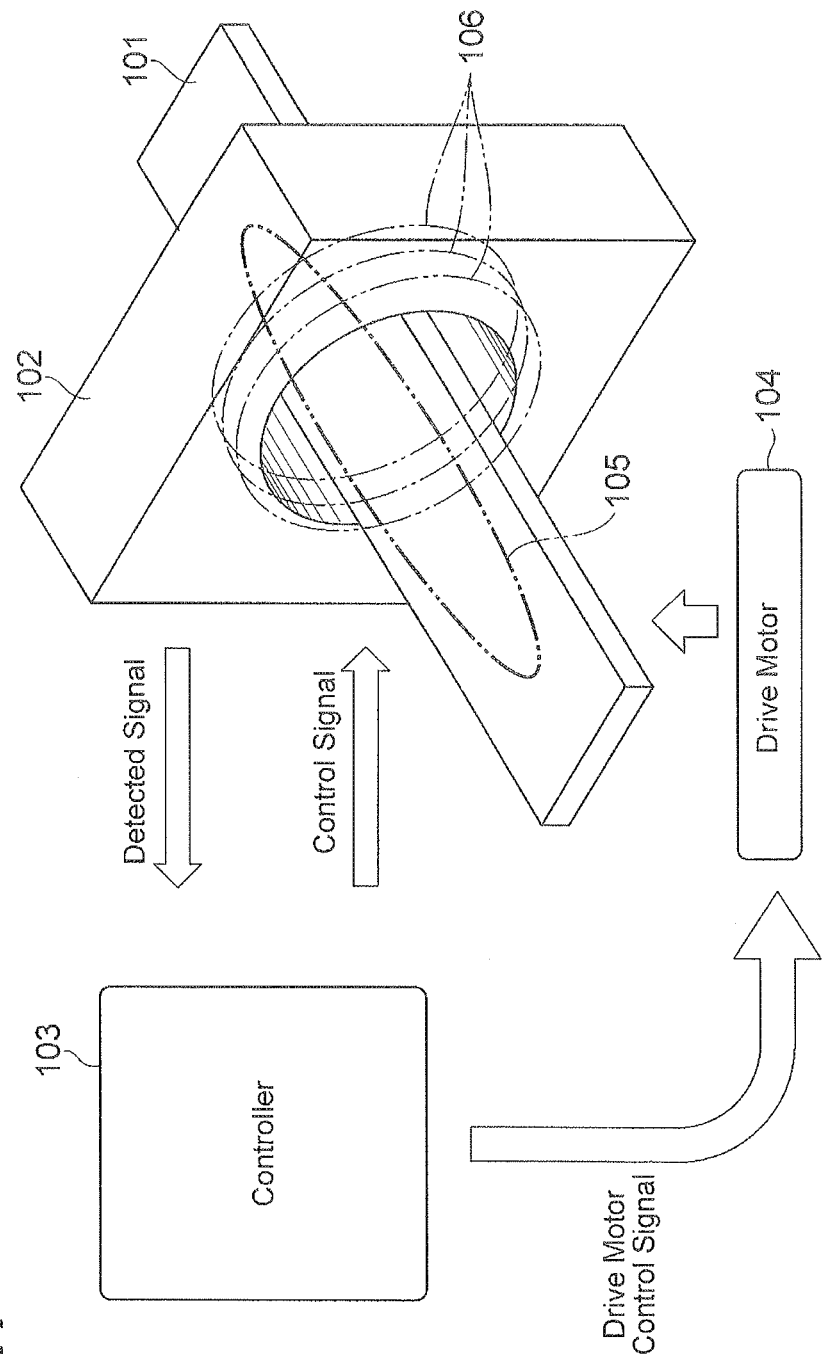
FIG. 1 is a sectional view of a subject diagnostic system such as a PET system or CT system.

FIG. 1 is a schematic view of a subject diagnostic system such as a PET system or CT system.

The subject diagnostic system comprises a cradle 101, a gantry 102 having an opening for placing the cradle 101 therewithin, and a controller 103. The controller 103 controls a drive motor 104 for moving the cradle 101 with a drive motor control signal, so as to change the relative position of the cradle 101 with respect to the gantry 102. A subject 105 to be diagnosed is arranged on the cradle 101. The subject 105 is driven by the drive motor 104, so as to be transported into the opening of the gantry 102. The drive motor 104 may move either the cradle 101 or the gantry 102.

A plurality of detection devices 106 are arranged so as to surround the opening of the gantry 102. Each of the detection devices 106 has a plurality of detectors (see FIGS. 2 and 3). The controller 103 outputs control signals for controlling the detection devices 106 to the gantry 102 and inputs from the gantry 102 detected signals from the detection devices 106.

Figure 2:
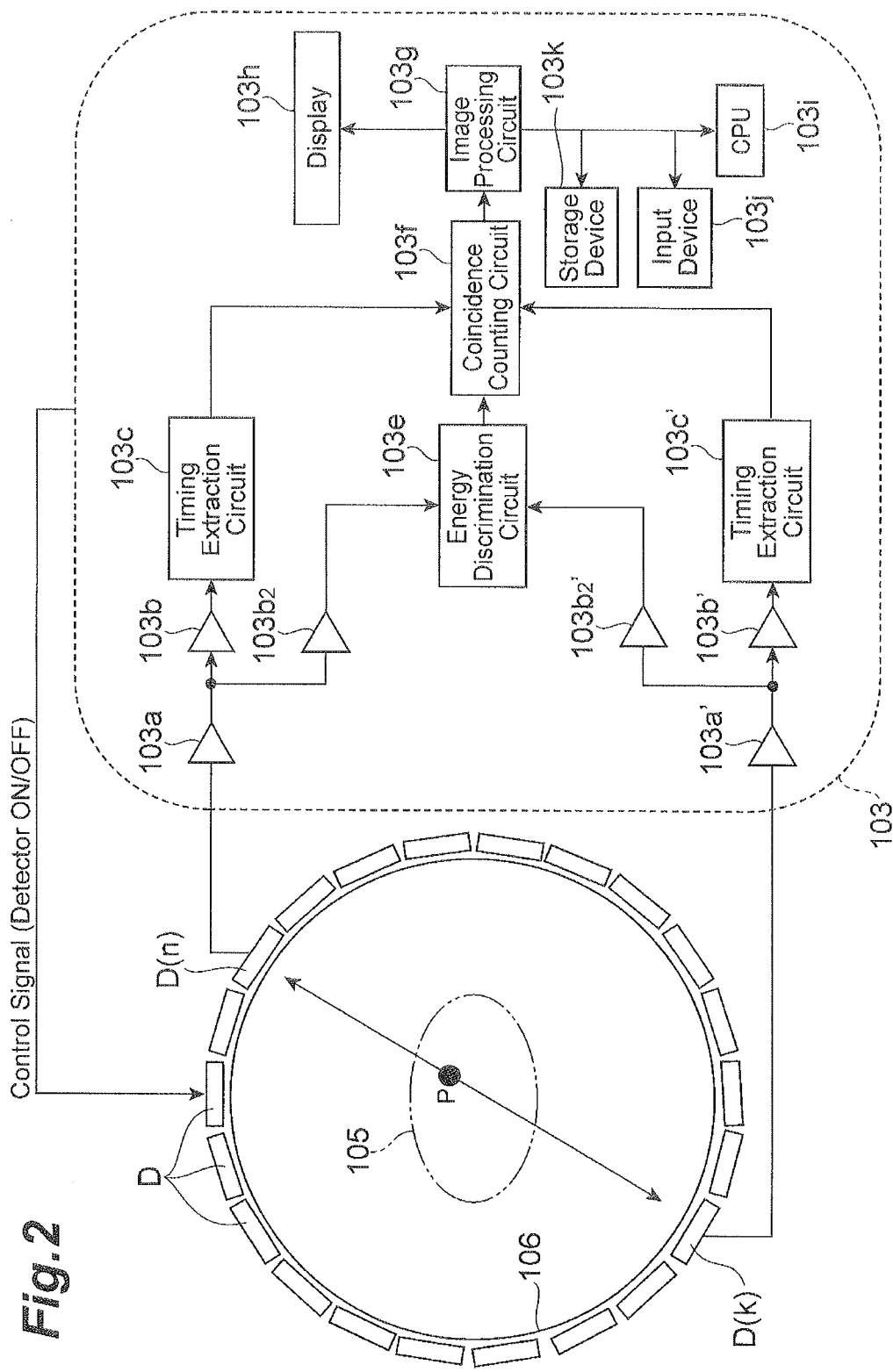
FIG. 2 is a block diagram of a PET system.

FIG. 2 is a block diagram of a PET system equipped with the structure of FIG. 1.

In the PET system, a plurality of detectors D are arranged like a ring so as to surround the opening of the gantry. Injected into the subject 105 is a radioisotope (RI) of such a type as to emit positive electrons (positrons) (positron-emitting radionuclide). The positive electrons combine with negative electrons within a body and generate annihilation radiation (γ-rays). That is, the subject 105 emits γ-rays. The detectors D detect the emitted γ-rays, and an image processing circuit 103g in the controller 103 performs image processing of the detected signals, so as to produce an image concerning internal information of the subject 105, i.e., a tomographic image. The RI used in the PET system is an element existing in an organism such as carbon, oxygen, fluorine, and nitrogen.

The γ-rays emitted from the subject 105 can be detected by the plurality of detectors D. Since the overall characteristics of the detectors D are improved remarkably, this PET system can acquire high-quality images. The detectors D will be explained later.

From an RI position P within the subject 105, γ-rays are emitted in one direction and a direction opposite thereto. While the plurality of detectors D are arranged like a ring, the γ-rays are incident on a specific detector D(n) and a detector D(k) opposite thereto across the RI position. When N detectors D are arranged on one ring, the γ-rays are incident on the $n^{th}$ detector D(n) and $k^{th}$ detector D(k) counted clockwise from the detector D located at the highest position. Assuming that the RI position P is located at the center of the ring, and the γ-rays are directed to directions opposite to each other, k=n+(2/N). Here, n, k, and N are natural numbers.

When the PET system is of TOF (Time Of Flight) type, a substance containing the RI is administered to a human body, an animal, a plant, or the like, and radiation pairs (γ-rays) generated by annihilation of electron/positive electron pairs are measured, so as to obtain information about distribution and movement of the administered subject within the subject for measurement. The TOF-PET system comprises a radiation detector array (detection devices 106) constituted by a plurality of detectors D, a plurality of preamplifiers 103a, 103a', a plurality of summing amplifiers 103b, 103b', an energy discrimination circuit 103e, timing extraction circuits 103c, 103', and a coincidence counting circuit 103f.

The subject 105 is placed at substantially the center of the radiation detector array (detection device 106). The subject 105 emits a γ-ray pair. The pair of γ-rays are emitted in respective directions opposite to each other. The plurality of detectors D are arranged on a circle whose center is substantially at the subject 105. Each detector D is constituted by a scintillator which converts a radiation (such as γ-rays and X-rays) into fluorescence and a photodetector for detecting the fluorescence.

Connected to one detector D on which the γ-rays are incident are a plurality of preamplifiers 103a (represented by one of them in the drawing), while each of the preamplifiers 103a is connected to both of summing amplifiers 103b, 103b2. The preamplifier 103a amplifies output signals from the photodetector D at a high speed, while each of the summing amplifiers 103b, 103b2 outputs the logical sum of the output signals of the preamplifier 103a.

Connected to the other detector D on which the γ-rays are incident are a plurality of preamplifiers 103a' (represented by one of them in the drawing), while each of the preamplifiers 103a' is connected to both of summing amplifiers 103b', 103b2'. The preamplifier 103a' amplifies output signals from the photodetector D at a high speed, while each of the summing amplifiers 103b', 103b2' outputs the logical sum of the output signals of the preamplifier 103a'.

While these structures are employed in all of the detectors D arranged like a ring, only one set is illustrated in the drawing for clarification of the explanation.

The energy discrimination circuit 103e is connected to the summing amplifiers 103b2, 103b2'. The energy discrimination circuit 103e discriminates a signal at a predetermined threshold (hereinafter referred to as threshold SH) or higher as a signal caused by incidence of γ-rays and outputs the result of discrimination to the coincidence counting circuit 103f. That is, the results of logical sum calculations by the summing amplifiers 103b2, 103b2' are outputted to the energy discrimination circuit 103e, which determines whether or not the signals inputted from the summing amplifiers are signals caused by the γ-rays having an energy at the threshold SH or higher and outputs the results of determination to the coincidence counting circuit 103f.

For example, the threshold SH is set near 511 keV, which is a photon energy of a pair of γ-rays occurring when an electrode/positive electrode pair is annihilated. This eliminates electric noise signals, noise signals derived from scattering γ-rays (one or both of annihilation γ-rays having their directions changed by scattering substances and their energy reduced by scattering), and the like. The energy discrimination circuit 103e includes a circuit which integrates signals outputted from the preamplifiers 103a, 103a' through the summing amplifiers 103b2, 103b2' and shapes such a waveform that its amplitude is proportional to energy.

The timing extraction circuits 103c, 103c' output first and second timing signals according to the signals outputted from the summing amplifiers 103b, 103b', respectively. The first and second timing signals are inputted to the coincidence counting circuit 103f. As a timing extraction method, leading edge and constant fraction schemes can be used.

The coincidence counting circuit 103f is connected to the energy discrimination circuit 103e and timing extraction circuits 103c, 103c'. The coincidence counting circuit 103f determines whether or not the γ-ray pair detected by the detectors D(n), D(k) is a γ-ray pair generated upon the same electron/positive electron pair annihilation. This determination is done by whether or not the γ-ray is detected by the other detector D(k) during a fixed time interval before and after a time at which the γ-ray is detected by one detector D(n). When detected under this condition, the γ-ray can be determined to be the one generated upon the same electrode/positive electrode pair annihilation.

In the signals determined by the energy discrimination circuit 103e to have an energy level at the threshold SH or higher, those determined by the coincidence counting circuit 103f to be derived from the γ-ray pairs generated by the electron/positive electron annihilation are employed as true data.

The true data is inputted to the image processing circuit 103g and creates a tomographic image which is an image concerning internal information of the subject. The created image is stored in a storage device 103k and can be displayed on a display 103h. The storage device 103k stores programs for performing image processing and the like, and the programs are executed according to instructions from a central processing unit (CPU) 103i. A series of operations required for an examination (outputting control signals (for turning the detectors ON/OFF) to the detectors D, taking in detected signals from the detectors D, image processing after coincidence counting, storing the created image into the storage device, and displaying onto the display) can be performed by an input device 103j.

Figure 3:
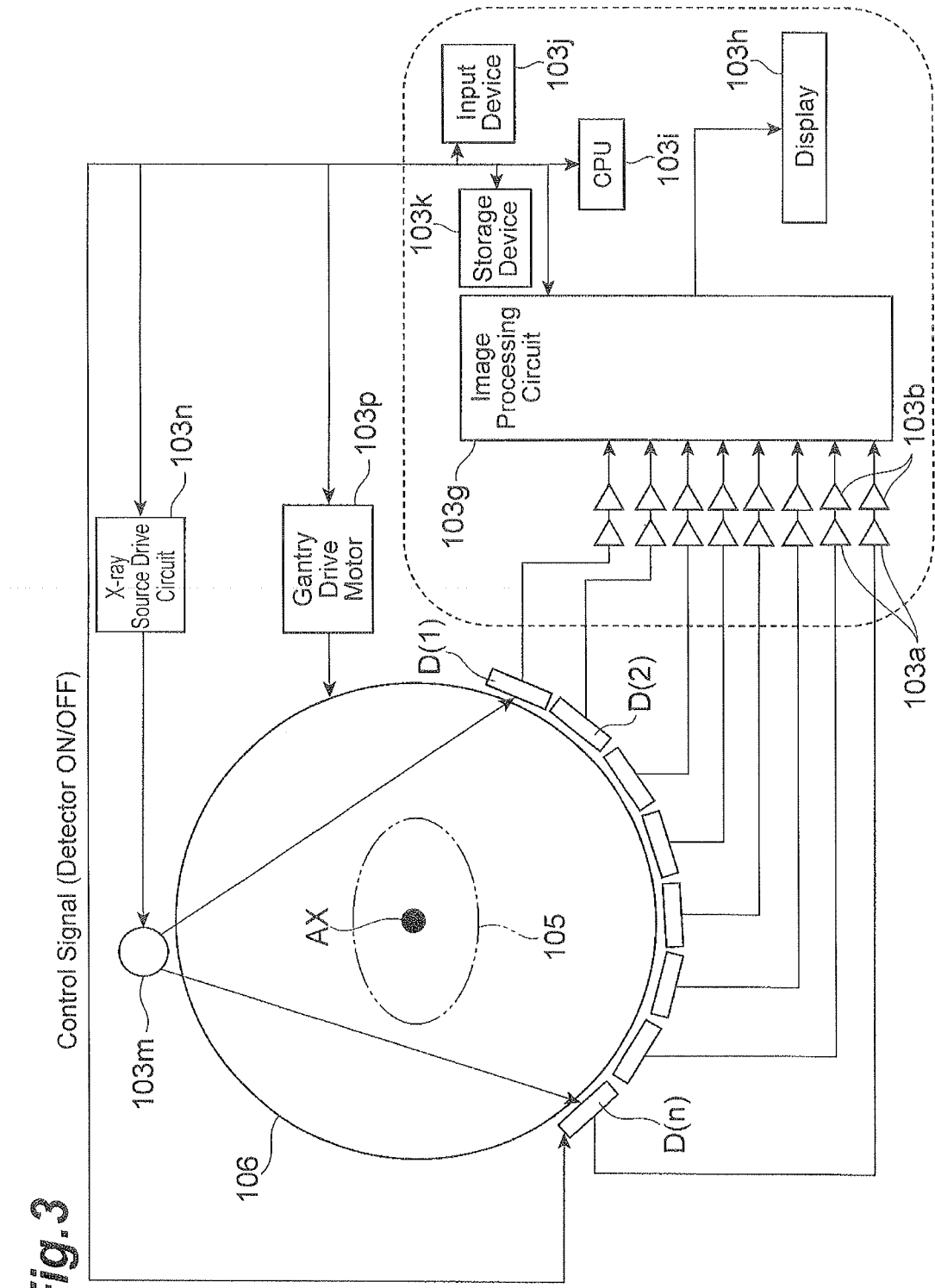
FIG. 3 is a block diagram of an X-ray CT system.

FIG. 3 is a block diagram of an X-ray CT system equipped with the structure of FIG. 1.

While the X-ray CT system comprises a cradle and a gantry which have the above-mentioned structures, the gantry incorporates therein an X-ray source 103m for emitting X-rays. A plurality of detectors D are arranged at positions where the X-rays from the X-ray source 103m are incident, whereby the detection device 106 is constructed.

The subject 105 is arranged in the cradle 101 located within the opening of the gantry 102 of FIG. 1 and is irradiated with the X-rays from the X-ray source 103m. The X-rays transmitted through the subject 105 are detected by a plurality of detectors D, and their detected signals are image-processed, whereby an image concerning internal information of the subject, i.e., a computed tomographic image, can be obtained. When the PET system and the X-ray CT system are integrated with each other, the controller 103 can superpose images obtained by the PET system and X-ray CT system. The X-ray CT system uses the detectors D whose overall characteristics are improved remarkably and thus can acquire high-quality images.

The subject 105 is placed at the center of the detection device 106 arranged like a ring. The detection device 106 rotates about a rotary axis AX. The subject 105 is irradiated with X-rays from the X-ray source 103m, and the X-rays transmitted therethrough are incident on a plurality of detectors D(n). The output of each detector is inputted to the image processing circuit 103g through the preamplifier 103a and summing amplifier 103b. The controller 103 of the X-ray CT system comprises the display 103h, CPU 103i, storage device 103k, and input device 103j, which function as in the PET device. When a start of imaging is ordered by the input device 103j, a program stored in the storage device 103k is started, so as to control an X-ray source drive circuit 103n, whereupon the drive circuit outputs a drive signal to the X-ray source 103m. The X-ray source 103m emits X-rays. A program stored in the storage device 103k also starts, so as to drive a gantry drive motor 103p, thereby rotating the detection device 106 about the rotary axis AX, and output a control signal (for turning the detectors ON/OFF) to the detectors D to turn them ON, thereby inputting detected signals into the image processing circuit 103g through the preamplifiers 103a and summing amplifiers 103b. The image processing circuit 103g creates a computed tomographic image according to a tomographic image creation program inputted to the storage device 103k. The created image is stored in the storage device 103k and can be displayed on the display 103h.

As mentioned above, the storage device 103k stores programs for performing image processing and the like, and the programs operate according to instructions from the central processing unit (CPU) 103i. A series of operations required for an examination (outputting control signals (for turning the detectors ON/OFF) to the detectors D, controlling various drive motors, taking in detected signals from the detectors D, image processing of detected signals, storing the created image into the storage device, and displaying onto the display) can be performed by the input device 103j.

As various programs, those installed in conventional systems can be used.

Figure 4:
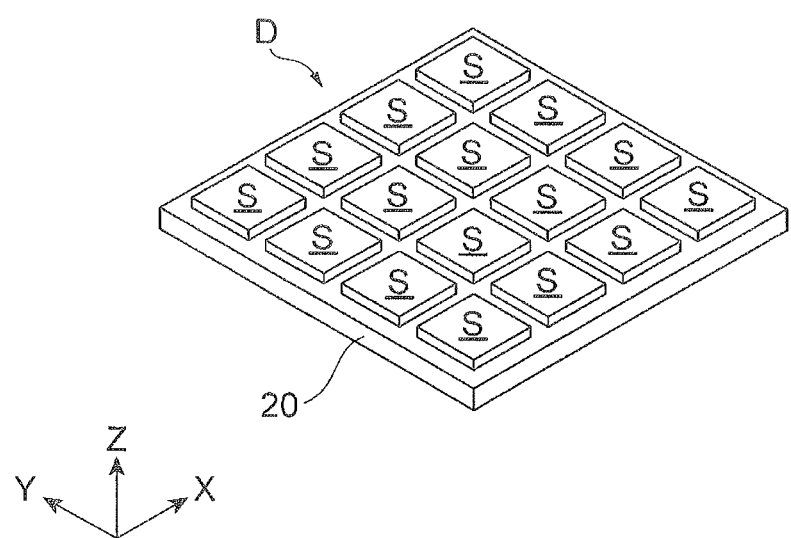
FIG. 4 is a perspective view of a detector D.

FIG. 4 is a perspective view of the detector D.

The detector D comprises a wiring board 20 and a plurality of detector chips S (semiconductor chips S1) arranged and secured onto the wiring board 20 while being separated two-dimensionally from each other. Here, a first bump electrode BE and second bump electrodes B2 (see FIG. 15) are interposed between each detector chip S (semiconductor chip S1) and the wiring board 20. While 4×4 detector chips S are arranged in this drawing, any number of detector chips S can naturally be employed as long as they are plural. While an XYZ three-dimensional coordinate system is illustrated in the drawing, the opening center (subject 105) is located on an extension in the +Z direction. That is, γ-rays or X-rays advance in the negative direction of the Z axis and enter the detector chip S, whose output signals are inputted to the wiring board 20 through the bump electrodes, and the output from the wiring board 20 is inputted to the above-mentioned preamplifier.

Figure 5:
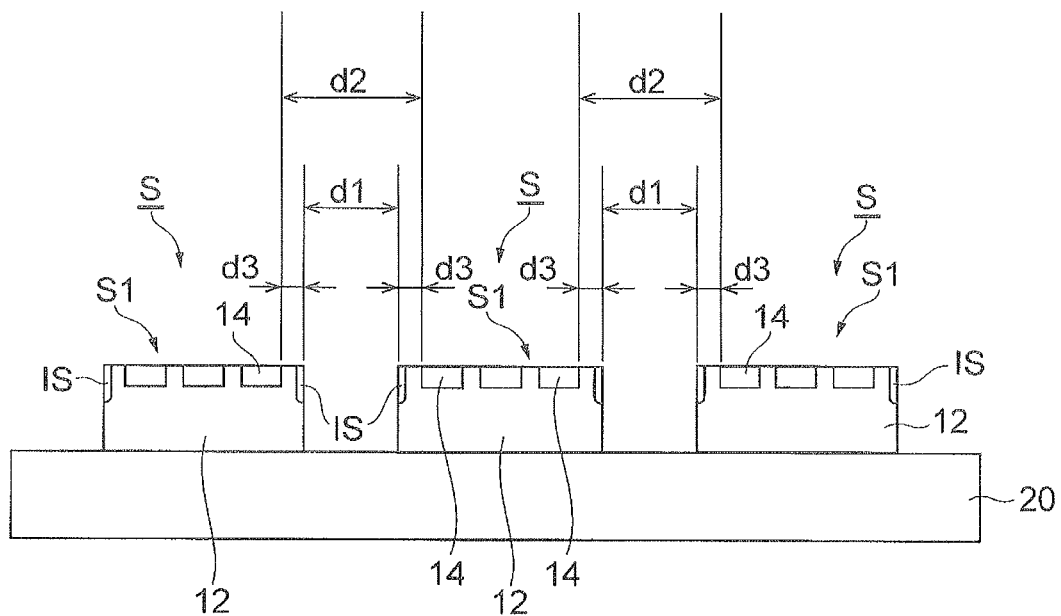
FIG. 5 is a diagram for explaining intervals of detector chips S in the detector D.

FIG. 5 is a diagram for explaining intervals of detector chips S in the detector D.

The detector chips S are arranged as being separated from each other by a distance d1 in both X and Y directions. The detector chip S comprises a scintillator, which is not depicted, on the semiconductor chip S. The semiconductor chip S1 has semiconductor regions 14, which serve as a detection channel, on the front face side. Each semiconductor region 14 is a region on the front face side of a region constituting a p-n junction with a semiconductor substrate in the semiconductor chip S1.

Let d2 be the minimum value of clearance of the semiconductor regions 14 between the semiconductor chips S1 adjacent to each other.

The distance d1 (distance between side faces of the semiconductor chip S1), the distance d2, and the minimum value d3 of clearance between the side face of the semiconductor chip S1 and the semiconductor region 14 may be set to 100 μm, 200 to 300 μm, and 50 to 100 μm, respectively. Assuming that the distance d1=X1 μm, d2=X1+2×d3=X1+100 to 200 μn holds.

While one semiconductor chip S1 comprises a plurality of semiconductor detection regions 14 two-dimensionally, the detector D constructs a discrete array when having a single detection channel composed of a group of semiconductor regions 14. When one semiconductor chip S1 comprises a plurality of detection channels, it constructs a monolithic array. In the discrete array, highly concentrated impurities (in the same conduction type as with the semiconductor substrate: n type) are added to a side face of the semiconductor chip, so as to construct an impurity-doped region IS. In the monolithic array, highly concentrated impurities (in the same conduction type as with the semiconductor substrate: n type) are added between the side face of the semiconductor chip and the detection channel, so as to construct the impurity-doped region IS.

The clearance between the detection channels (the minimum value of the distance between the semiconductor regions 14 in the detection channels adjacent to each other) in the monolithic array may be set equal to the distance d1. This is advantageous in that all the semiconductor regions 14 have the same clearance.

Figure 6:
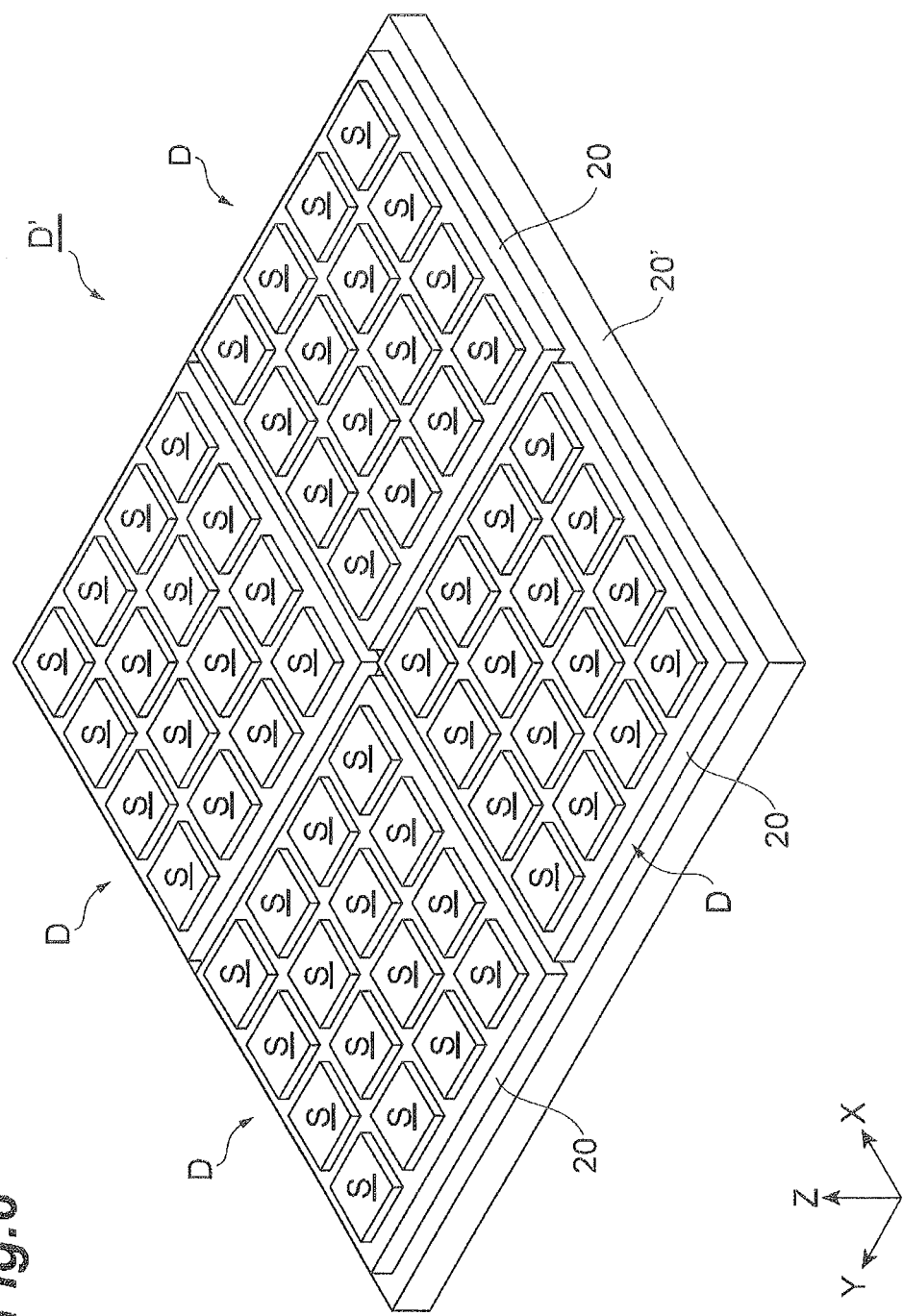
FIG. 6 is a perspective view of a detector D'.

FIG. 6 is a perspective view of a detector D'.

A plurality of wiring boards 20 illustrated in FIG. 4 are arranged and secured onto a main wiring board or support board 20', whereby 8×8 detector chips S are juxtaposed in total. Employing such a structure enables the detector to have a larger size.

Figure 7:
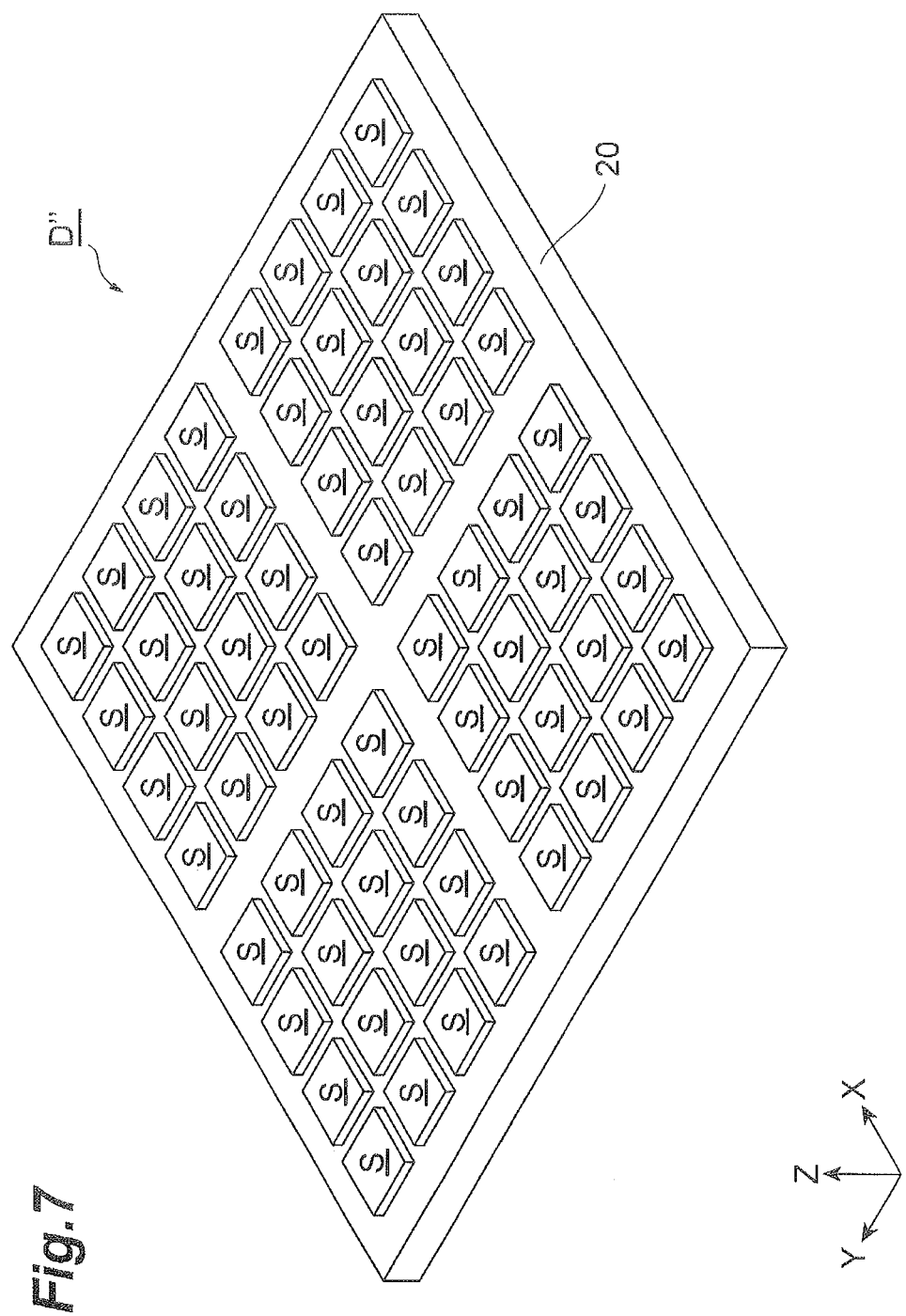
FIG. 7 is a perspective view of a detector D"

FIG. 7 is a perspective view of a detector D".

Figure 76:
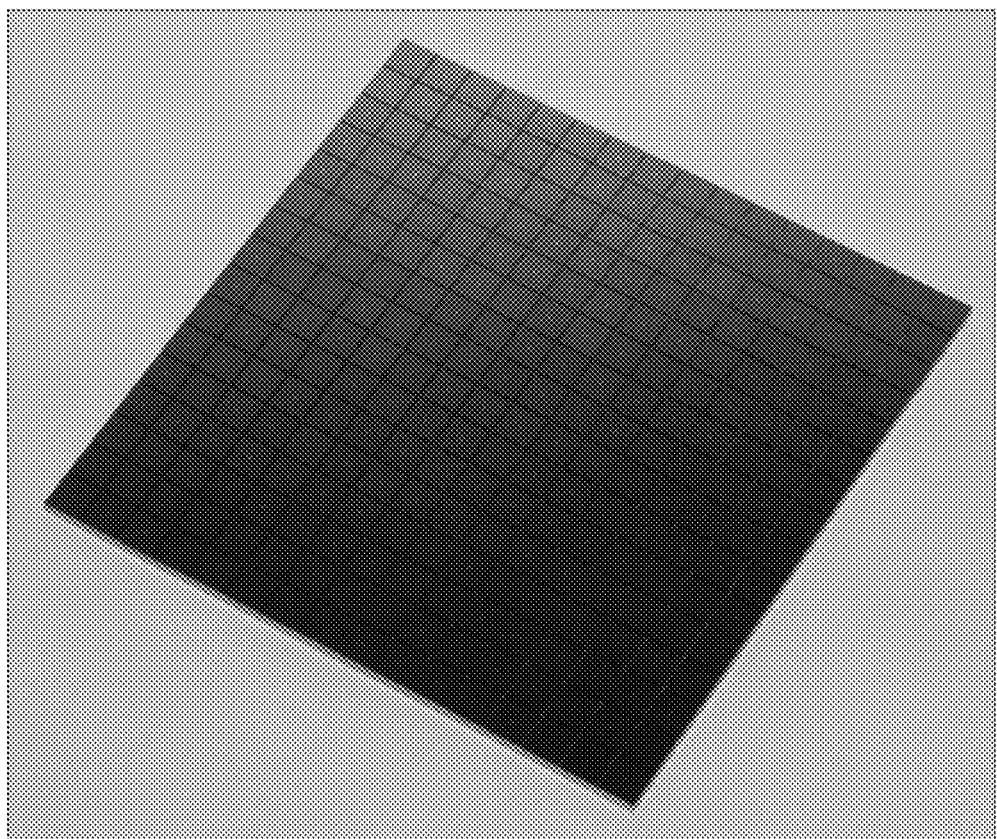
FIG. 76 is a picture of a photograph illustrating a perspective structure of the detector.

While the wiring board 20 illustrated in FIG. 4 is used in common, 8×8 detector chips S in total are arranged side by side and secured onto the wiring board 20. Employing such a structure enables the detector to have a larger size. FIG. 76 is a picture of a photograph illustrating a perspective structure of the detector, showing that it was possible to produce a detector having a larger area as a prototype.

The detector chip will now be explained.

Figure 8:
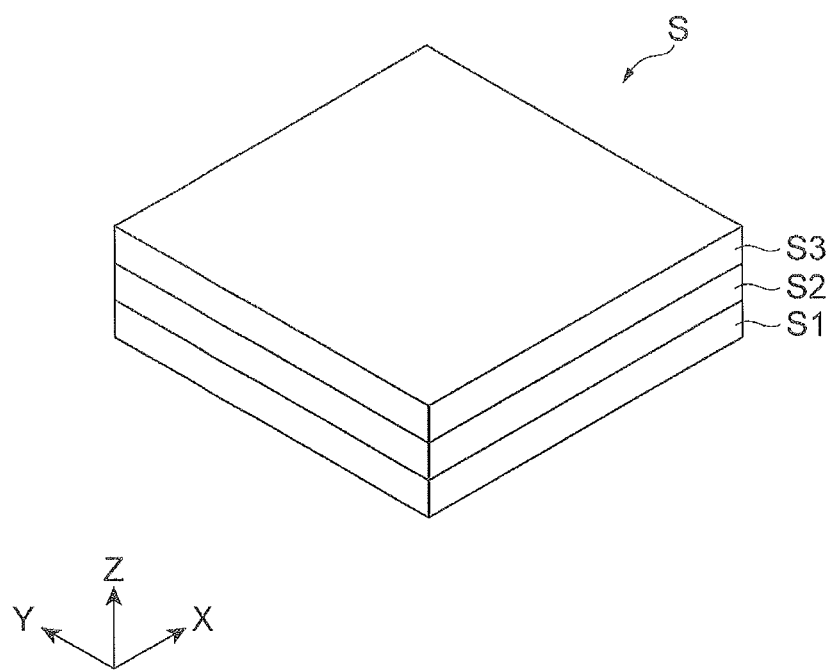
FIG. 8 is a perspective view of the detector chip S.

FIG. 8 is a perspective view of the detector chip S.

A scintillator S3 is disposed on the semiconductor chip S1 with a bonding layer S2 interposed therebetween. Examples of the bonding layer 52 include resins such as Epo-Tek 301 (trademark) manufactured by Epoxy Technologies. The scintillator S3 includes at least one or a mixed material of at least two selected from the group consisting of $Lu_{2-x}Y_xSiO_5$ Ce (LYSO), gadolinium aluminum gallium garnet (GAGG), NaI (TI), Pr:LuAG, $LaBr_2$, $LaBr_3$, and $(Lu_xTb_{1-x-y}Ce_y)_3Al_5O_{12}$ (i.e., LuTAG). The composition ratios "x" and "y" of Lu and Ce in LuTAG fall within the ranges of 0.5 to 1.5 and 0.01 to 0.15, respectively. The scintillator S3 converts the radiation incident thereon into fluorescence, which enters the semiconductor chip S1 through the bonding layer S2.

Figure 9:
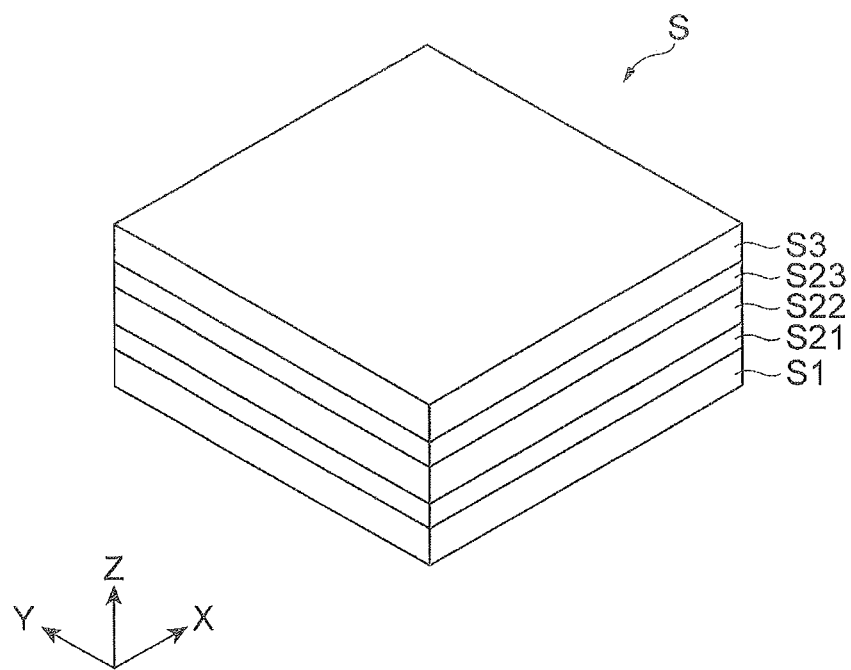
FIG. 9 is a perspective view of the detector chip S.

FIG. 9 is a perspective view of the detector chip S having another structure.

A glass sheet S22 is disposed on the semiconductor chip S1 with a bonding layer S21 interposed therebetween. The scintillator S3 is disposed on the glass sheet S22 with a bonding layer S23 interposed therebetween. Materials for the bonding layers and scintillator are as mentioned above. The scintillator S3 converts the radiation incident thereon into fluorescence, which enters the semiconductor chip S1 through the bonding layer S23, glass sheet S22, and bonding layer S21.

As in the foregoing, the scintillator S3 is placed on the front face of each semiconductor chip S1 with an insulator (S2, S21, S22, S23) interposed therebetween. The scintillator S3 generates light having a wavelength longer than that of the radiation such as X-rays or γ-rays incident thereon. When visible light or infrared light is incident on Si, photoelectric conversion efficiently occurs within Si. Constructing an APD within the semiconductor chip S1 from Si can improve the sensitivity for visible light and infrared light. The insulator is made of a glass sheet or a resin as mentioned above and can slightly diffuse light from the scintillator before it reaches the APD, while protecting the front face of the APD. The resin can also function to bond the scintillator and the semiconductor chip to each other.

Figure 10:
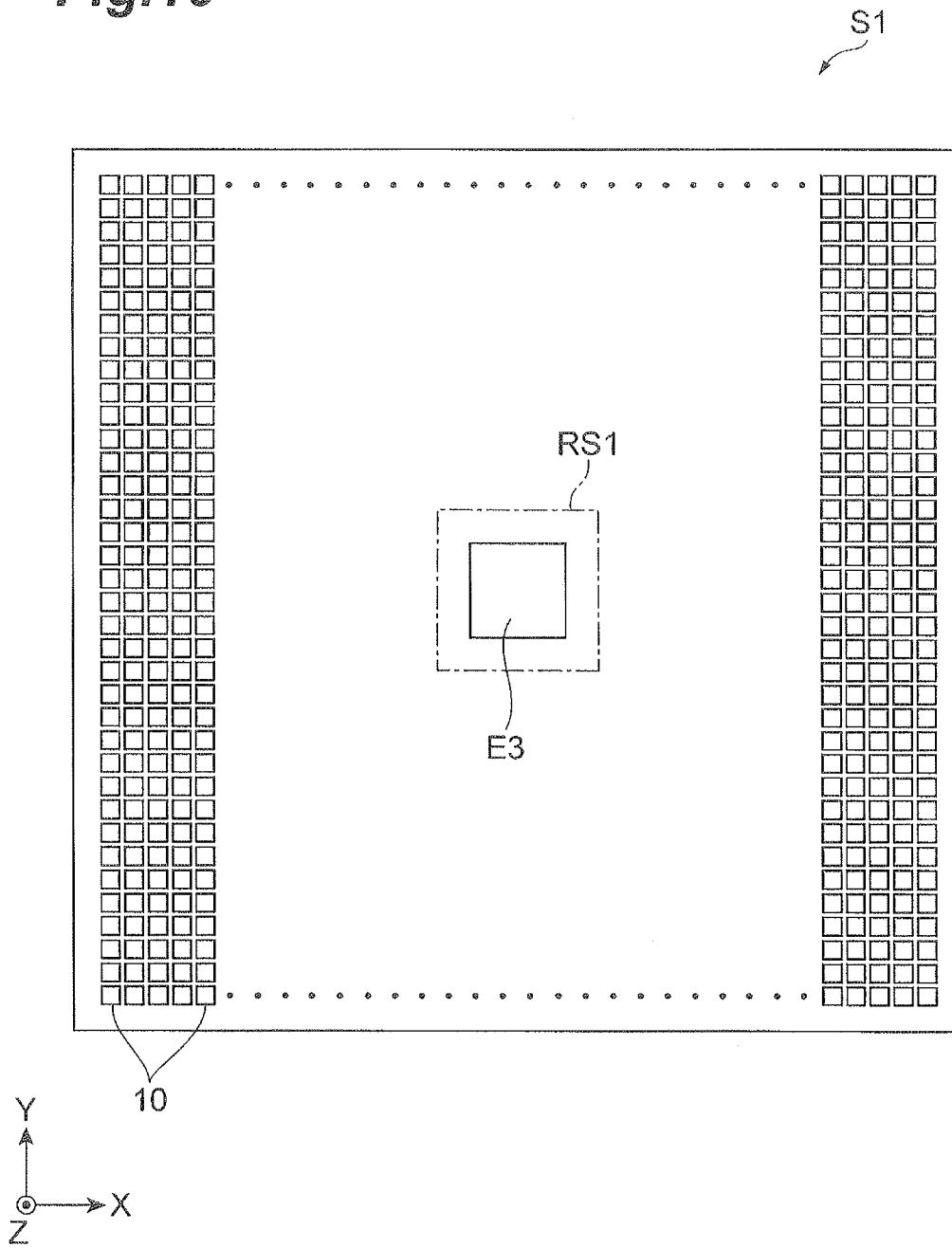
FIG. 10 is a plan view of a semiconductor chip S1.

FIG. 10 is a plan view of the semiconductor chip S1.

A plurality of photodetector units 10 are arranged on the front face of the semiconductor chip S1 along the X and Y axes. Placed at a center part of the semiconductor chip S1 is a common electrode E3 which collects signals from the photodetector units 10. The photodetector units 10 are formed all over the surface of the semiconductor chip S1, but are depicted only near both end parts in this drawing in order to clarify the common electrode.

Figure 11:
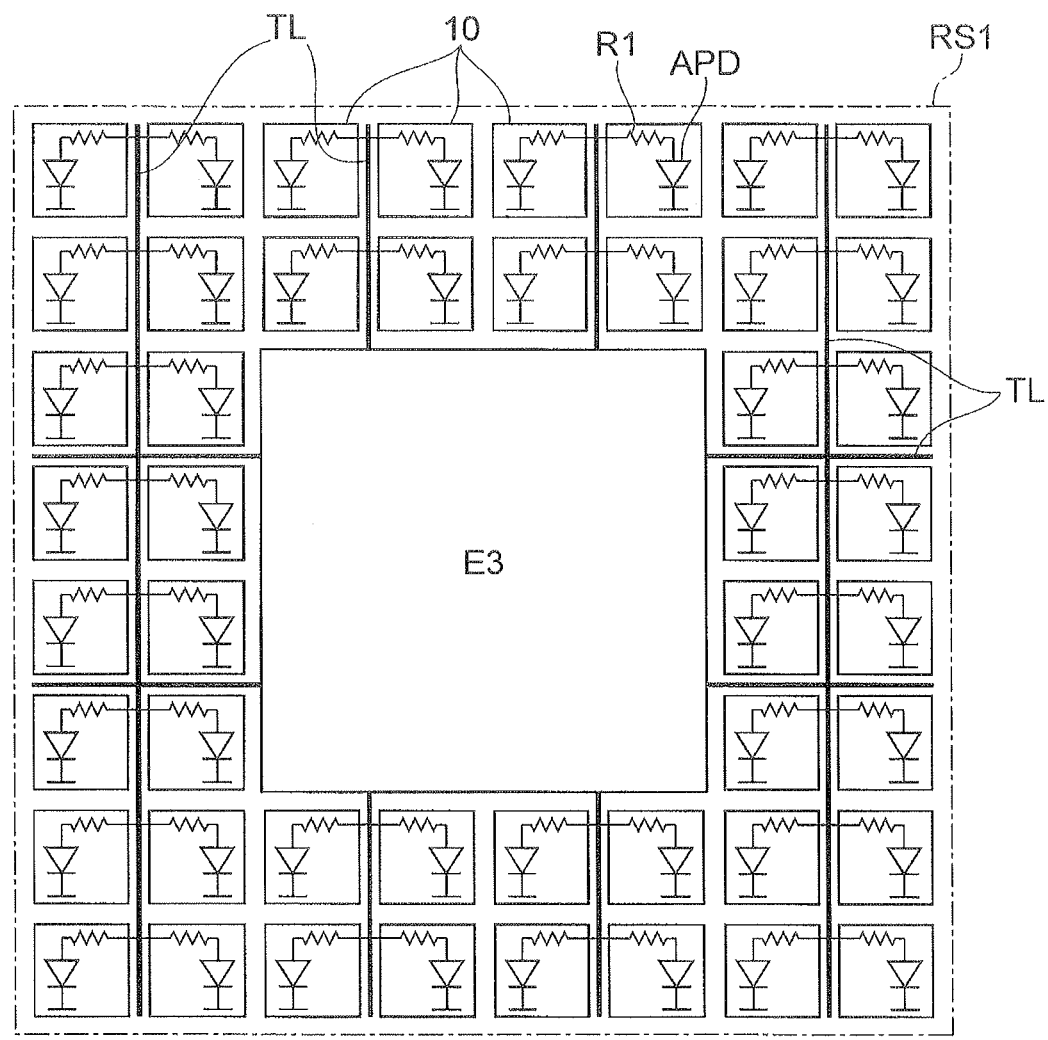
FIG. 11 is an enlarged view of a part in the vicinity of a common electrode in the semiconductor chip S1.

FIG. 11 is an enlarged view of a part in the vicinity of the common electrode (a region RS1 in FIG. 10) of the semiconductor chip S1.

Each photodetector unit 10 comprises an APD and a quenching resistance R1 (resistance layer) connected to one end (anode) of the APD. The quenching resistance R1 is connected to the common electrode E3 through a readout line TL. That is, all the APDs in the plurality of photodetector units 10 are connected to the common electrode E3 through their corresponding quenching resistances R1 and readout lines TL.

Figure 12:
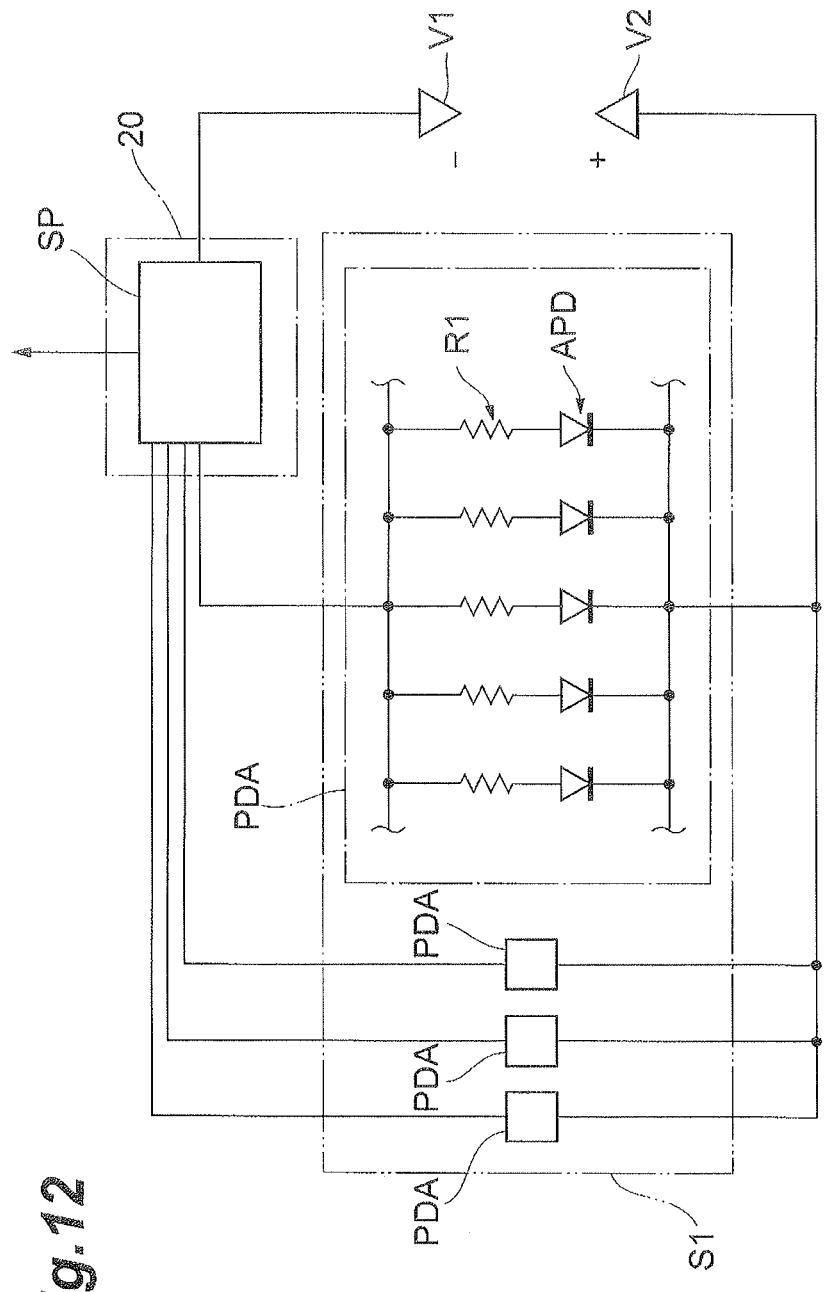
FIG. 12 is a circuit diagram of a detector.

FIG. 12 is a circuit diagram of the detector.

The semiconductor chip S1 includes a plurality of photodiode arrays PDA. Each photodiode array PDA is constituted by a plurality of photodetector units 10 (each composed of the APD and quenching resistance R1). In the photodetector array PDA, each APD is operated in Geiger mode. In Geiger mode, a reverse voltage (reverse-bias voltage) higher than the breakdown voltage of the APD is applied between the anode and cathode of the APD, That is, a (−) potential V1 and a (+) potential V2 are applied to the anode and cathode, respectively. The polarities of the potentials are relative to each other, so that one of the potentials can be the ground potential.

The wiring board 20 may be provided with a signal processing unit SP for processing signals from the photodiode arrays PDA. The signal processing unit SP constitutes an ASIC (Application Specific Integrated Circuit). The signal processing unit SP may include a CMOS circuit for converting output signals from the photodiode arrays PDA (channels) into digital pulses.

Figure 13:
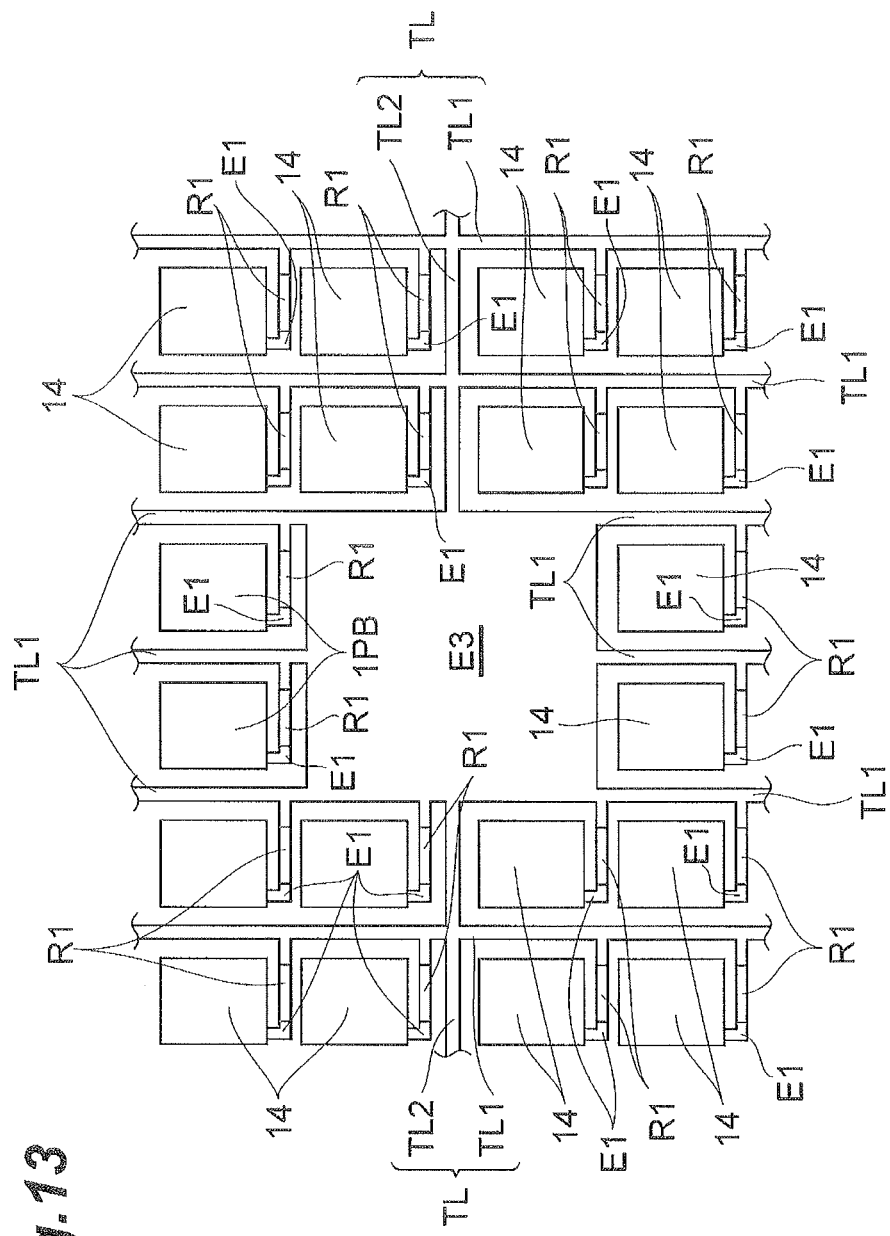
FIG. 13 is a plan view of a photodetector unit in the part in the vicinity of the common electrode.

FIG. 13 is a plan view of a photodetector unit in the part in the vicinity of the common electrode.

The APDs have electrodes E1 each arranged on the principal surface side of the semiconductor substrate. Each electrode E1 is electrically connected to the second semiconductor region 14. The first semiconductor region located directly under the second semiconductor region 14 is electrically connected to the electrode E1 through the second semiconductor region 14.

The readout line (signal line) TL and common electrode E3 are formed on the semiconductor substrate on the outside of the second semiconductor region 14 with an insulating layer interposed therebetween. The common electrode E3 is located in a center region of the channels (photodiode arrays PDA).

The readout lines TL include a plurality of signal lines TL1 and a plurality of signal lines TL2. Each signal line TL1 extends along the Y axis between the APDs adjacent to each other in planar view. Each readout line TL2 extends along the X axis between the APDs adjacent to each other and electrically connects a plurality of readout lines TL1 to each other. The readout lines TL2 are connected to the common electrode E1 The readout lines TL1 are electrically connected to the common electrode E3 through the readout lines TL2 except for those directly connected to the common electrode E3.

For each APD, the photodiode array PDA has the quenching resistance R1 formed on the semiconductor substrate on the outside of the second semiconductor region 14 with an insulating layer interposed therebetween. That is, the quenching resistance R1 is arranged on the principal surface side of the semiconductor substrate. The quenching resistance R1 has one end connected to the electrode E1 and the other end connected to the readout line TL1.

Figure 14:
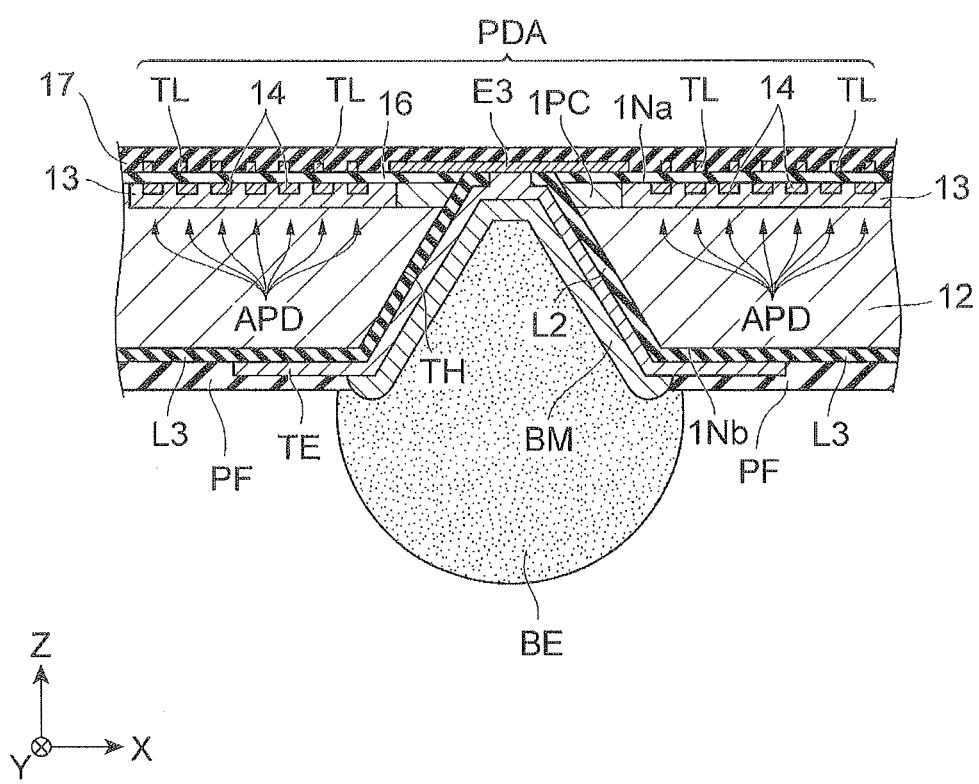
FIG. 14 is a sectional view of the part in the vicinity of the common electrode.

FIG. 14 is a sectional view of the part in the vicinity of the common electrode.

A semiconductor region 12 constituting the semiconductor substrate includes principal surfaces 1Na, 1Nb opposing each other. The semiconductor region 12 is an n-type (first conduction type) semiconductor substrate constituted by Si.

Each photodiode array PDA includes a plurality of APDs formed in the semiconductor region 12. The anode and cathode of each APD are the p-type semiconductor region 13 (14) and the n-type semiconductor region 12, respectively. When a photon is incident on the APD, photoelectric conversion is performed within the substrate, so as to generate a photoelectron. Avalanche multiplication is carried out in a region near a p-n junction interface of the first semiconductor region 13, whereupon an amplified electron group flows toward an electrode formed on the rear face of the semiconductor region 12. That is, a photon incident on a given pixel (avalanche photodiode APD) of the photodiode array PDA is multiplied, so as to be taken out as a signal from the electrode E3 (through electrode TE).

The quenching resistance R1 is connected in series to each APD. One APD constitutes one pixel in each photodiode array PDA. All the APDs, each connected in series to the quenching resistance R1, are connected in parallel, and a reverse-bias voltage from a power supply is applied thereto.

Each APD has the p-type (second conduction type) first semiconductor region 13 and the p-type (second conduction type) second semiconductor region 14. The first semiconductor region 13 is formed on the principal surface 1Na side of the semiconductor region 12. The second semiconductor region 14 is formed within the first semiconductor region 13 and has an impurity concentration higher than that in the first semiconductor region 13. The form of the second semiconductor region 14 in planar view is polygonal (quadrangular in this embodiment), for example. The depth of the first semiconductor region 13 is greater than that of the second semiconductor region 14.

The semiconductor region 12 has an n-type (first conduction type) semiconductor region 1PC. The semiconductor region 1PC is formed on the principal surface 1Na side of the semiconductor region 12. The semiconductor region 1PC prevents the p-n junction formed between the n-type semiconductor region and p-type first semiconductor region 13 from being exposed to a through hole TH in which the through electrode TE is arranged. The semiconductor region 1PC is formed at a position corresponding to the through hole TH (through electrode TE).

The common electrode E3 and readout lines TL are formed on an insulating layer 16 which is formed on the front face of the second semiconductor regions 14. The common electrode E3 and readout lines TL are covered with an insulating layer 17. The rear face 1Nb of the semiconductor region 12 is covered with an insulating layer L3. The insulation L3 has an opening, through which the through electrode TE passes. The common electrode E3 is in contact with the through electrode TE so as to be electrically connected thereto, while the first bump electrode BE is in contact with the through electrode TE with an under bump metal BM interposed therebetween. The inner face of the through hole TH is covered with an insulating layer L2, which is continuous with the insulating layer L3. The through electrode TE and insulating layer L3 are covered with a passivation film (protective film) PF. As a method for forming the BM, electroless plating may be used. As a method for forming the bump electrode BE, a technique for mounting a solder ball or printing may be used.

As in the foregoing, each semiconductor chip comprises the semiconductor region 12 having a plurality of photodetector units 10 arranged two-dimensionally, the insulating film 16 formed on the front face of the semiconductor region 12, the insulating layer 16 formed on the front face of the semiconductor region 12, the common electrode E3 arranged on the insulating layer 16, the readout lines TL for electrically connecting the quenching resistances R1 of the photodetector units 10 to the common electrode E3, and the through electrode TE extending from the common electrode E3 to the rear face of the semiconductor region 12 through the through hole TH of the semiconductor region 12.

Each photodiode array PDA includes the through electrode TE. The through electrode TE is provided for each photodiode array PDA, i.e., for each channel. The through electrode TE is formed such as to penetrate through the semiconductor region 12 from the principal surface 1Na side to the principal surface 1Nb side. That is, the through electrode TE is arranged within the through hole TH penetrating through the semiconductor region 12. The insulating layer L2 is also formed within the through hole TH. Therefore, the through electrode TE is arranged within the through hole TH with the insulating layer L2 interposed therebetween. The through electrode TE has one end connected to the common electrode E3, whereby the readout lines TL are connected to the through electrode TE.

Each photodetector unit 10 is equipped with the APD, which comprises the first conduction type semiconductor region 12 (first semiconductor region) and the second conduction type second semiconductor regions (13, 14) constructing the p-n junction with the semiconductor region 12 and outputting carriers. The quenching layer R1 is electrically connected to the second semiconductor region 14 of the APD.

The first bump electrode BE electrically connects the through electrode TE and the wiring board 20 to each other, while the second bump electrode B2 (see FIG. 15 and the like) electrically connects the semiconductor region 12 (first semiconductor region) of the APD and the wiring board 20 to each other.

The quenching resistance R1 has a resistivity higher than that of the electrode E1 and common electrode E3 connected thereto. The quenching resistance R1 is made of polysilicon, for example. As a method for forming the quenching resistance R1, CVD (Chemical Vapor Deposition) may be used. Other examples of resistive materials constituting the quenching resistance R1 include SiCr, NiCr, TaNi, and FeCr.

The electrodes E1, E3 and through electrode TE are constituted by a metal such as aluminum. When the semiconductor substrate is made of Si, not only aluminum but AuGe/Ni and the like are often used as an electrode material. Sputtering may be used as a method for forming the electrodes E1, E3 and through electrode TE.

When Si is used, a group 3 element such as B is employed as p-type impurities, while a group 5 element such as N, P, or As is employed as n-type impurities. The n and p types, which are conduction types of the semiconductors, are interchangeable when constructing a device and enabling it to function. As a method for adding these impurities, diffusion or ion implantation may be used.

$SiO_2$ or SiN may be used as a material for the above-mentioned insulating layers, while thermal oxidation or sputtering may be used as a method for forming the insulating layers when each insulating layer is made of $SiO_2$.

In the above-mentioned structure, the APD is formed by constructing the p-n junction between the n-type semiconductor region 12 and p-type first semiconductor region 13. The semiconductor region 12 is electrically connected to the rear face of the substrate 1N directly or to an electrode (not depicted) formed on the rear face. The first semiconductor region 13 is connected to the wiring board 20 through the second semiconductor region 14, electrode E1, quenching resistance R1, readout line TL, common electrode E3, through electrode TE, and bump electrode BE in sequence. The rear face of the semiconductor region 12 is connected to the wiring board 20 through the bump electrode B2. The quenching resistance R1 is connected in series to the APD.

Figure 15:
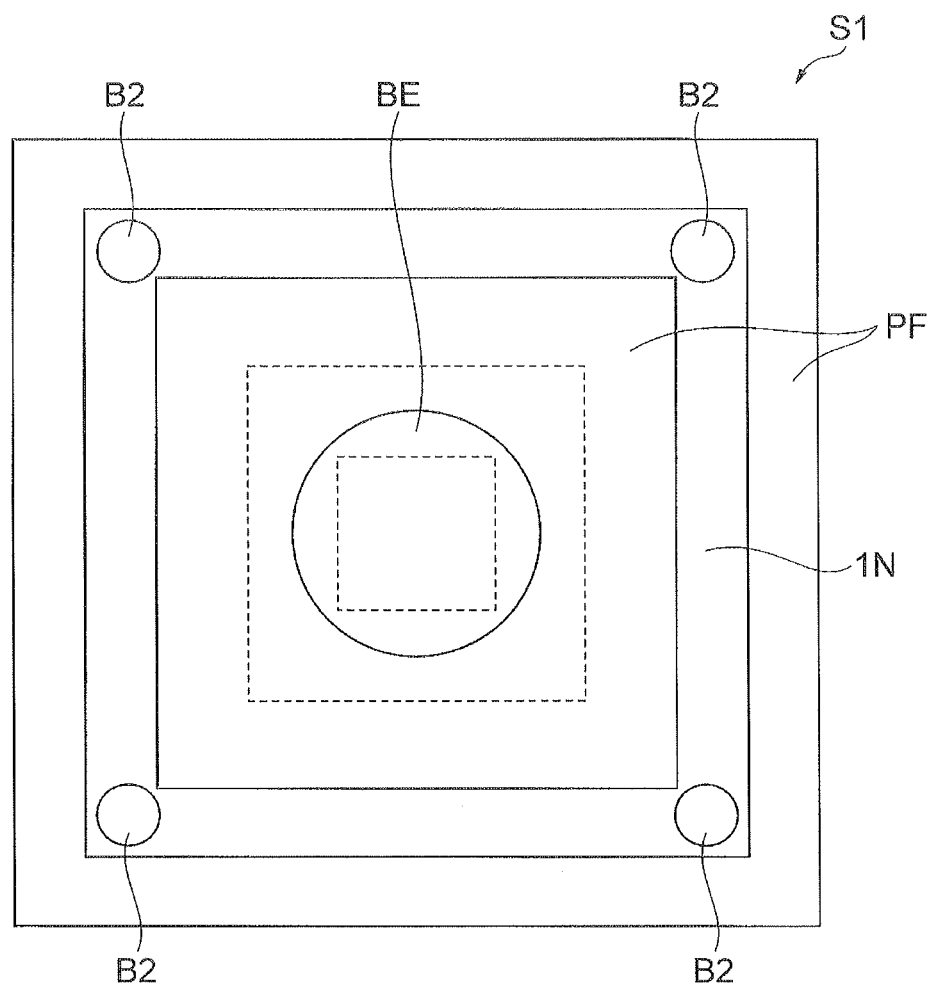
FIG. 15 is a bottom view of the semiconductor chip S1 of FIG. 14.

FIG. 15 is a bottom view of the semiconductor chip S1 of FIG. 14.

The passivation film PF on the rear face of the semiconductor substrate is partly removed, so as to expose the rear face of the semiconductor region 12. The second bump electrodes B2 are arranged in thus exposed area. The first bump electrode BE is located at the center of the semiconductor region 12. The second bump electrodes B2 are arranged at positions corresponding to four corners of the quadrangular semiconductor region 12.

Figure 16:
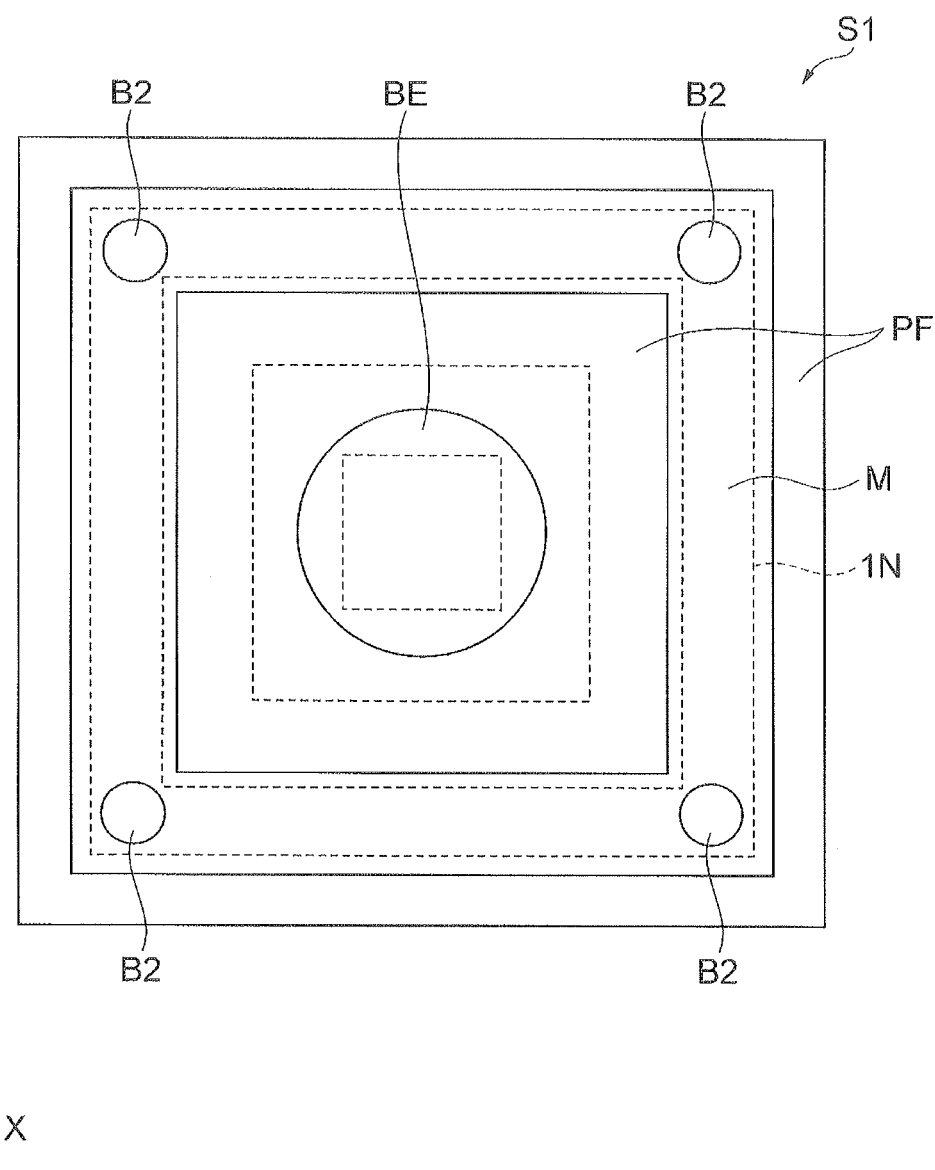
FIG. 16 is a bottom view of the semiconductor chip S1 in accordance with an improvement.

FIG. 16 is a bottom view of the semiconductor chip S1 in accordance with an improvement.

This structure is the same as the one illustrated in FIG. 15 except that a conductive film M is formed on the rear face of the semiconductor region 12 exposed by removing the passivation film PF and that the bump electrodes B2 are arranged on the conductive film M. The conductive film M is formed into a rectangular ring and may be made of the same material as with the electrodes. Solder may be used as a material for the bump electrodes.

As in the foregoing, through the first bump electrode BE and second bump electrodes B2, a bias voltage for operation in Geiger mode is applied to both ends of the APD included in each photodetector unit 10. Carriers generated in a plurality of APDs in response to light (energy line) incident thereon flow through their corresponding quenching resistances R1 to they common electrode E3 on the semiconductor region 12 and travel from the common electrode E3 through the through electrode TE and first bump electrode BE to the wiring board 20, so as to be taken out.

Thus constructed APD has a structure for shortening the carrier transmission path by using the through electrode and the like, thereby lowering its wiring resistance. This improves the carrier transmission speed from the APD, i.e., time resolution. When a plurality of photons are incident on one semiconductor chip comprising a plurality of such APDs, the improvement in time resolution enables photon detection with higher accuracy. While the same time resolution is not guaranteed in different semiconductor chips because of variations and errors in their manufacture and the like, fluctuations in characteristics among the semiconductor chips can be reduced by selecting semiconductor chips having a product characteristic within a fixed range and bonding them to the wiring board through bump electrodes at the time of assembly.

Since the two-dimensionally arranged semiconductor chips S1 are separated from each other, light incident on a specific semiconductor chip is less likely to leak to another semiconductor chip and generate crosstalk, while gaps between the semiconductor chips can hinder warps of the wiring board caused by its expansion/contraction from affecting the semiconductor chips. That is, characteristics such as time resolution, crosstalk, and tolerance to temperature changes in the detector as a whole are ameliorated remarkably.

FIG. 17 is a perspective view (A) and bottom view (B) of basic constituents of a wiring board.

The wiring board 20 has an electrode 20a, with which the first bump electrodes BE come into contact, and an electrode 21a, with which the four second bump electrodes B2 come into contact, both being disposed on a front face of an insulating substrate 20C. An electrode pad 20d electrically connected to the electrode 20a through a through electrode 20b passing through the insulating substrate 20C is disposed on the rear face of the insulating substrate 20C. The through electrode 20b and electrode pad 20d are connected to each other through a connection electrode 20c.

An electrode pad 21d electrically connected to the electrode 21a through a through electrode 21b passing through the insulating substrate 20C is disposed on the rear face of the insulating substrate 20C. The through electrode 21b and electrode pad 21d are connected to each other through a connection electrode 21c.

Each of the electrodes provided in the insulating substrate 20C is a printed wiring pattern.

The first electrode 20a on the front face is quadrangular, while the second electrode 21a is disposed adjacent to three sides of the first electrode 20a so as to surround it.

FIG. 18 is a plan view (A) and bottom view (B) of a wiring board.

This wiring board 20 is one in which a plurality of wiring patterns each illustrated in FIG. 17 are arranged along the X and Y axes. The second electrodes 21a in the two columns on the left are arranged so as to open on the downside, whereas the second electrodes 21a in the two columns on the right are obtained when those in the two columns on the left are rotated by 180° about an axis parallel to the thickness of the wiring board, i.e., they are arranged so as to open on the upside.

FIG. 19 is a plan view (A) and bottom view (B) of a wiring board.

In this wiring board 20, a plurality of wiring patterns each illustrated in FIG. 17 are arranged along the X and Y axes while, in the second electrodes 21a, those adjacent to each other in the X direction are made continuous with each other so as to form an electrode 210a. The electrode 210a extends along the Y axis and has a structure in which all the second electrodes 21a are electrically connected together on the front face side. In this case, it is sufficient for the through electrode 210d to be disposed directly under one location of the electrode 210a and exposed to the rear face, which is advantageous in that the structure becomes simple.

Figure 20:
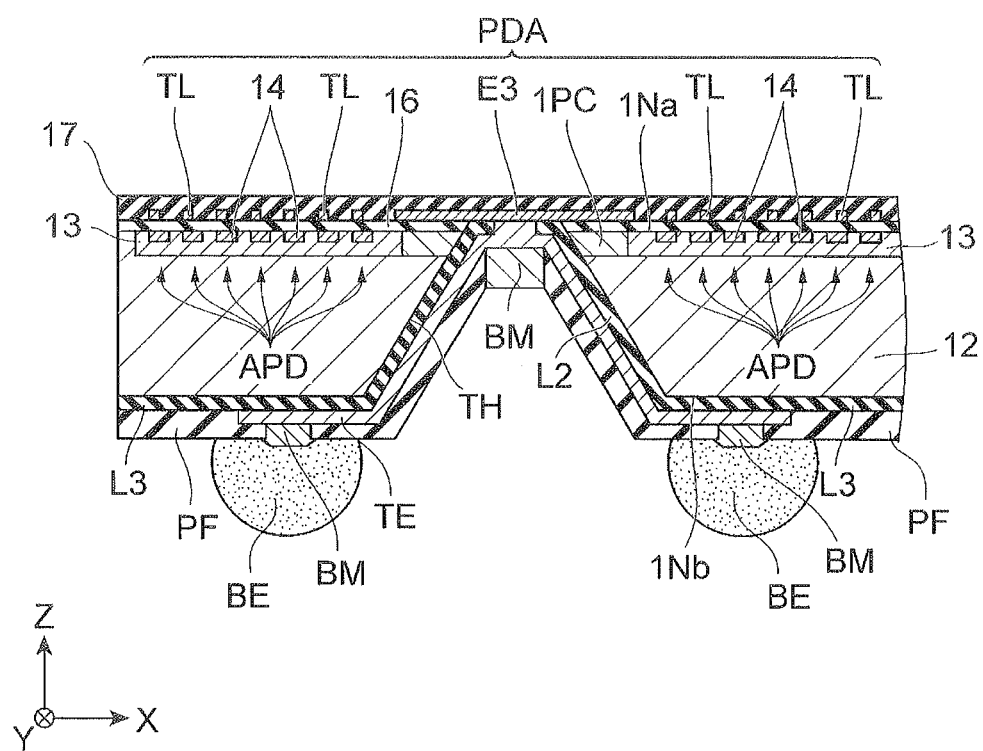
FIG. 20 is a sectional view of the part in the vicinity of the common electrode.

FIG. 20 is a sectional view of the part in the vicinity of the common electrode.

The first bump electrode BE, which is arranged within the through hole provided in the semiconductor region 12 in the above, may be disposed at a different position. The through electrode TE extends along the inner face of the through hole, so as to be located on the insulating layer L3 on the rear face of the semiconductor substrate. A contact hole may be formed in the insulating layer L3, so as to expose the through electrode TE, and the first bump electrode BE may be disposed on the exposed surface with the under bump electrode metal BM. The passivation film PF may be removed from the bottom part of the through hole TH, so as to expose a region where the under bump metal BM is disposed in contact with the through electrode TE. Depending on the design, a bump electrode may also be arranged on the under bump metal BM in the bottom part.

Figure 21:
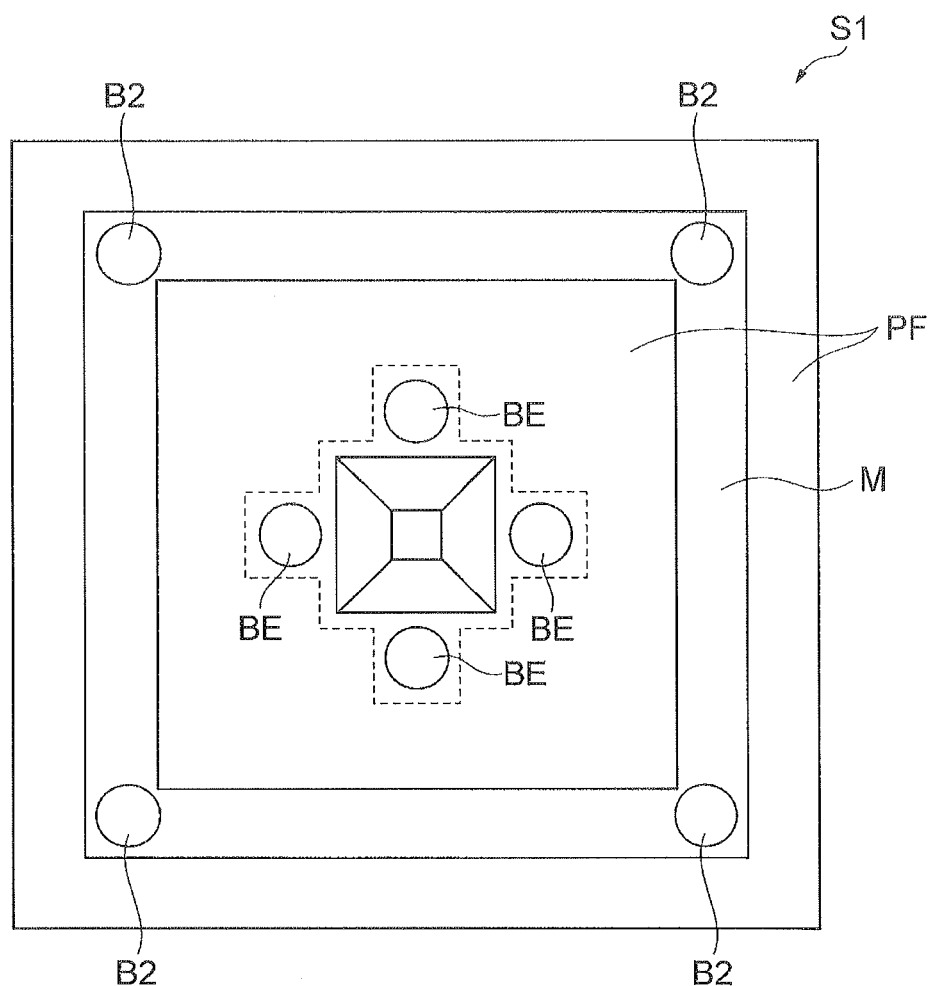
FIG. 21 is a bottom view of the semiconductor chip S1 of FIG. 20.

FIG. 21 is a bottom view of the semiconductor chip S1 of FIG. 20.

The passivation film PF is partly removed from the rear face of the semiconductor region 12 so as to expose a part of the rear face. The second bump electrodes B2 are arranged in thus exposed region. Four first bumps BE are located in the vicinity of the center of the semiconductor region 12. The second bump electrodes B2 are arranged at respective positions corresponding to the four corners of the quadrangular semiconductor region 12. The first bump electrodes BE are disposed adjacent to the respective sides of a through hole having a quadrangular opening. The through hole is formed into a truncated quadrangular pyramid.

Figure 22:
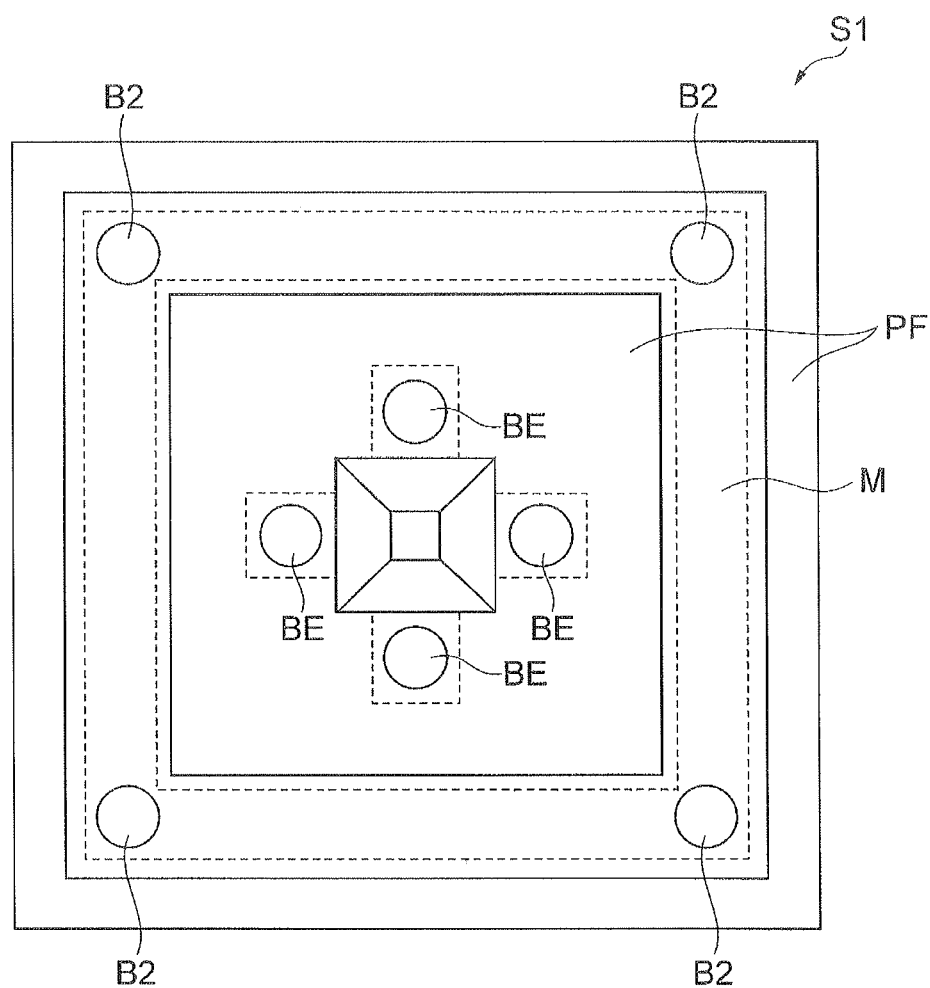
FIG. 22 is a bottom view of the semiconductor chip S1 in accordance with an improvement.

FIG. 22 is a bottom view of the semiconductor chip S1 in accordance with an improvement.

This structure is the same as the one illustrated in FIG. 21 except that the conductive film M is formed on the rear face of the semiconductor region 12 exposed by removing the passivation film PF, so that the bump electrodes B2 are arranged on the conductive film M. The conductive film M is formed into a rectangular ring and may be made of the same material as with the electrodes. Solder may be used as a material for the bump electrodes.

FIG. 23 is a perspective view (A) and bottom view (B) of basic constituents of a wiring board.

The wiring board 20 comprises the electrode 20a, with which the four first bump electrode BE come into contact, and the electrode 21a, with which the four second bump electrodes B2 come into contact, both being disposed on the front face of the insulating substrate 20C. The electrode pad 20d electrically connected to the electrode 20a through a through electrode 20b passing through the insulating substrate 20C is disposed on the rear face of the insulating substrate 20C. The through electrode 20b and electrode pad 20d are connected to each other through the connection electrode 20c.

The electrode pad 21d electrically connected to the electrode 21a through the through electrode 21b passing through the insulating substrate 20C is disposed on the rear face of the insulating substrate 20C. The through electrode 21b and electrode pad 21d are connected to each other through the connection electrode 21c.

Each of the electrodes provided in the insulating substrate 20C is a printed wiring pattern.

The first electrode 20a on the front face is formed into a cross, while the second electrode 21a has a substantially U-shaped form which is disposed adjacent to the first electrode 20a so as to surround it, while opening one end.

Figure 24:
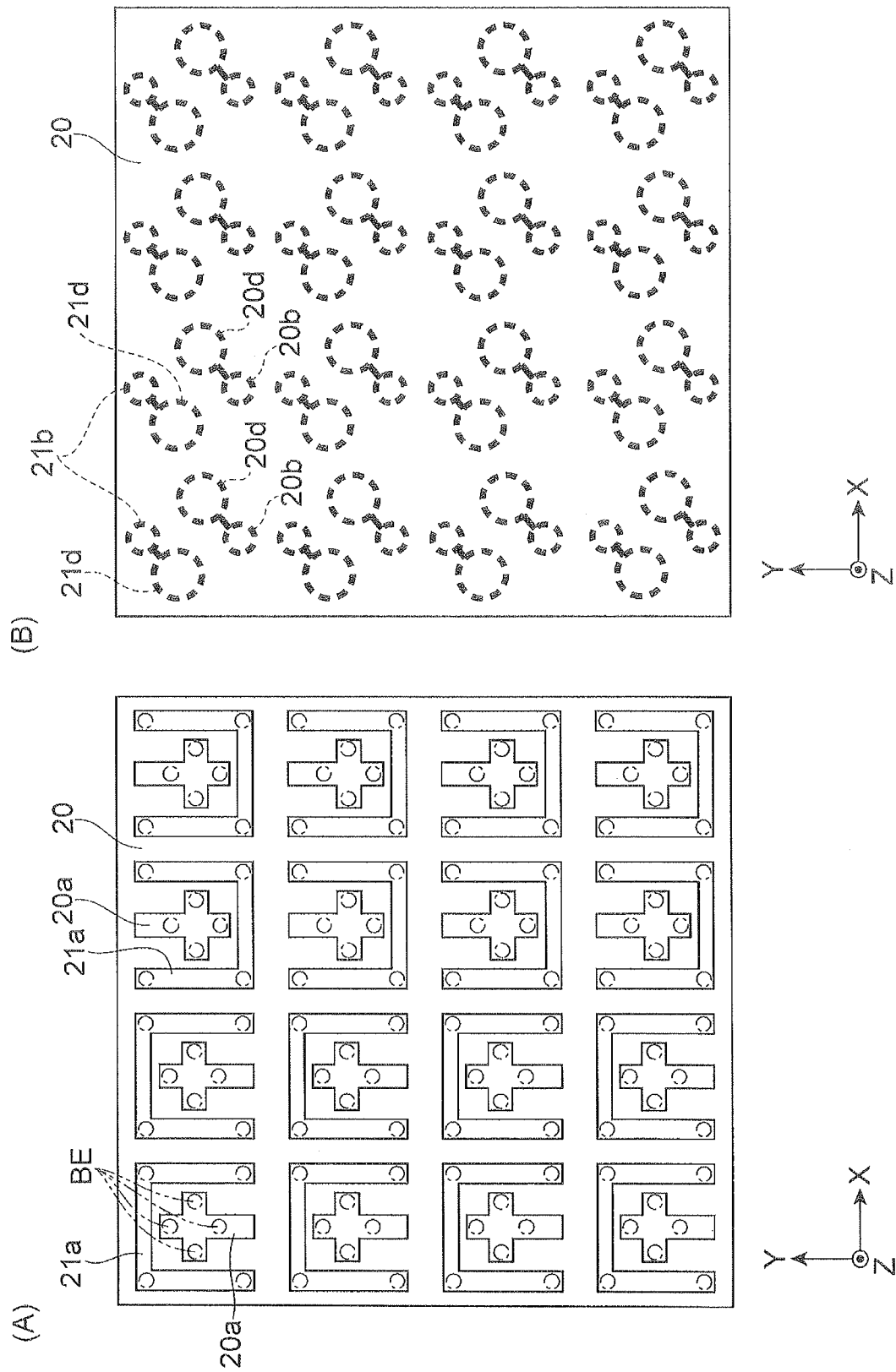
FIG. 24 is a plan view (A) and bottom view (B) of a wiring board.

FIG. 24 is a plan view (A) and bottom view (B) of a wiring board.

This wiring board 20 is one in which a plurality of wiring patterns each illustrated in FIG. 23 are arranged along the X and Y axes. The second electrodes 21a in the two columns on the left are arranged so as to open on the downside, whereas the second electrodes 21a in the two columns on the right are obtained when those in the two columns on the left are rotated by 180° about an axis parallel to the thickness of the wiring board, so as to open on the upside.

Figure 25:
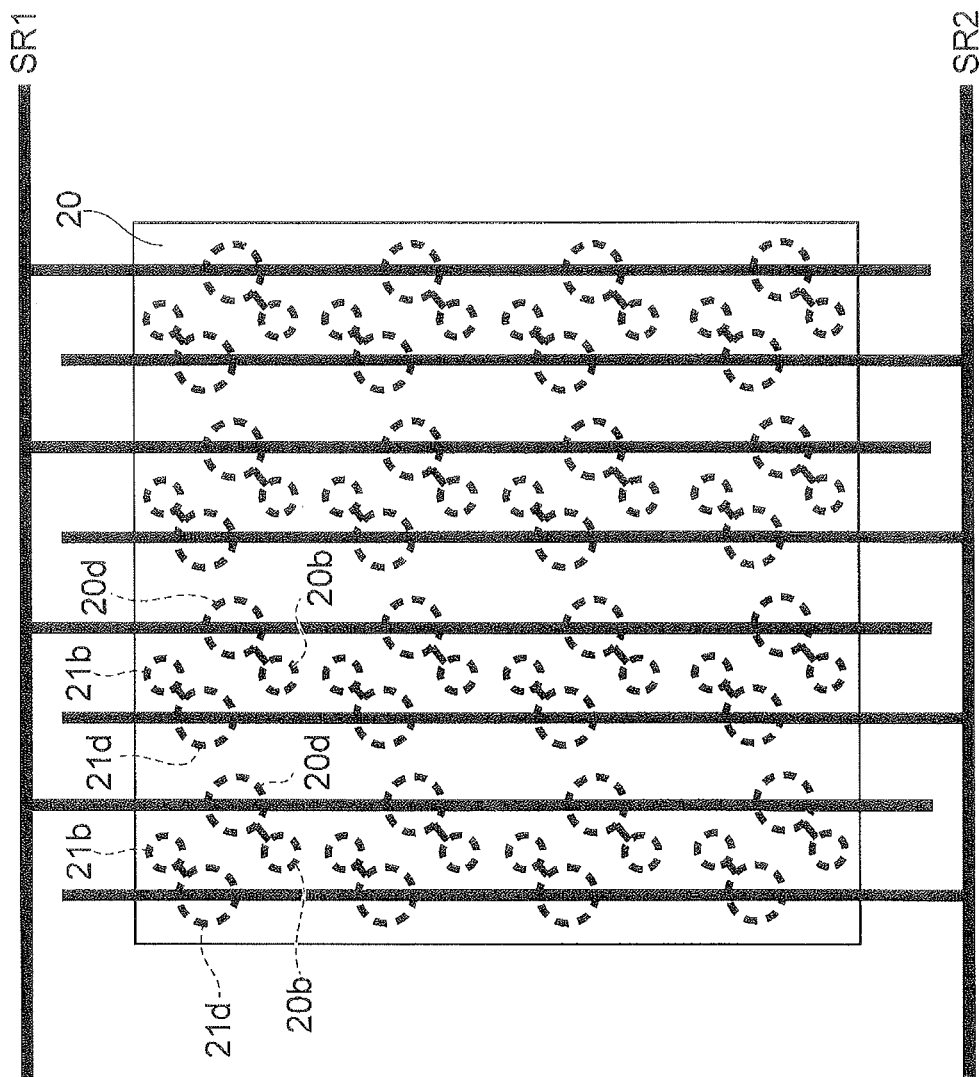
FIG. 25 is a bottom view of a wiring board.

FIG. 25 is a bottom view of a wiring board.

The above-mentioned wiring board may be provided with a line SR1 for connecting the electrode pads 20d to each other and a line SR2 for connecting the electrode pads 21d to each other. As a consequence, outputs from the first bump electrodes BE can be outputted to the outside through the line SR1, and outputs from the second bump electrodes B2 can be outputted to the outside through the line SR2.

FIG. 26 is a plan view (A) and bottom view (B) of a wiring board.

This wiring board 20 is one in which a plurality of wiring patterns each illustrated in FIG. 23 are arranged along the X and Y axes while, in the second electrodes 21a, those adjacent to each other in the X direction are made continuous with each other so as to form the electrode 210a. The electrode 210a extends along the Y axis and has a structure in which all the second electrodes 21a are electrically connected together on the front face side. In this case, it is sufficient for the through electrode 210d to be disposed directly under one location of the electrode 210a and exposed to the rear face, which is advantageous in that the structure becomes simple.

Figure 27:
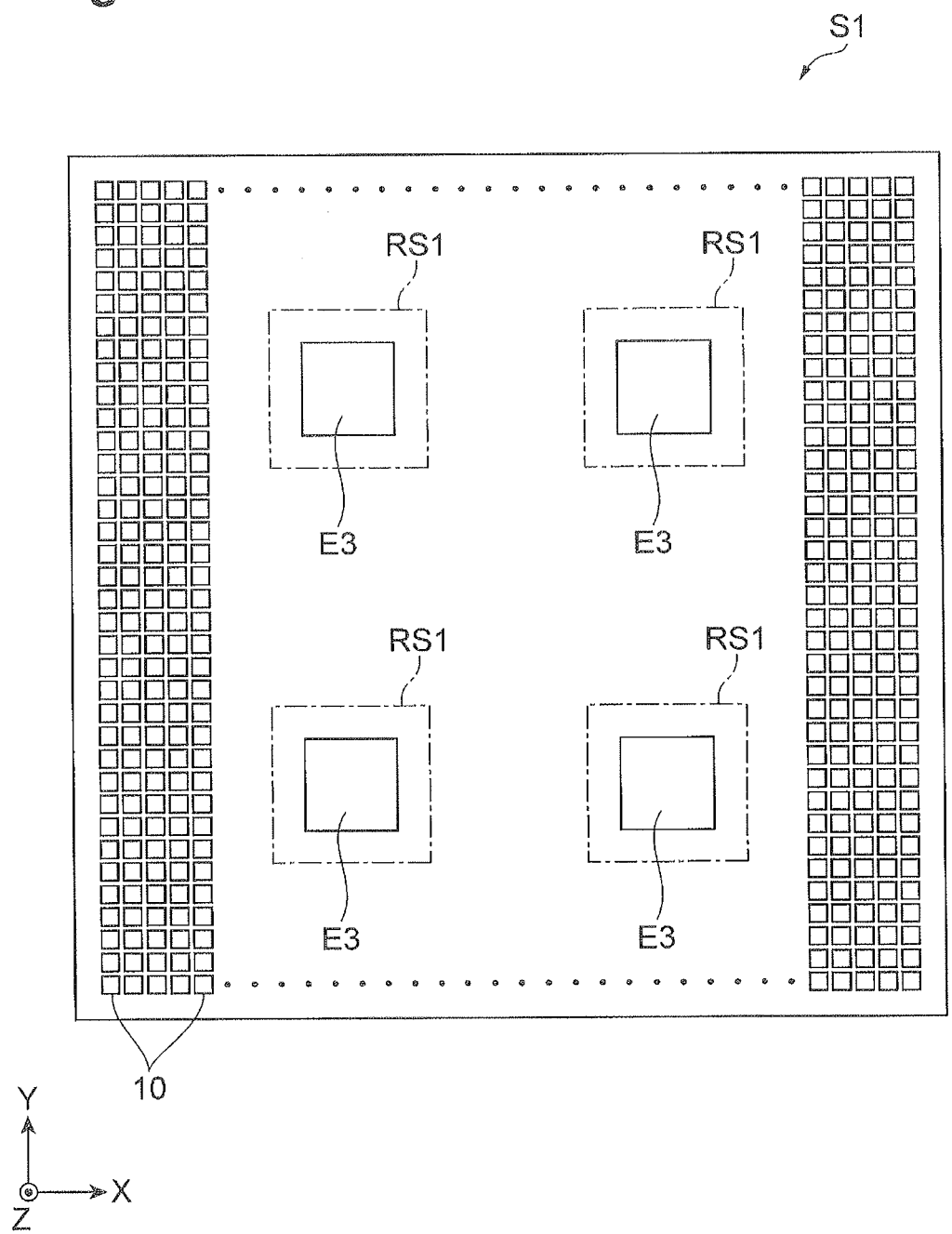
FIG. 27 is a plan view of the semiconductor chip S1.

FIG. 27 is a plan view of the semiconductor chip S1.

On the front face of the semiconductor chip S1, a plurality of photodetector units 10 are arranged along the X and Y axes. A plurality of common electrodes E3 which collect signals from the photodetector units 10 are arranged at a center part of the semiconductor chip S1. The photodetector units 10 are formed all over the surface of the semiconductor chip S1, but are depicted only near both end parts in this drawing in order to clarify the common electrodes.

This drawing illustrates four common electrodes E3 for the semiconductor chip S1. A peripheral region RS1 of each common electrode E3 has the same cross-sectional structure as with the one illustrated in FIG. 14 or FIG. 20.

Figure 28:
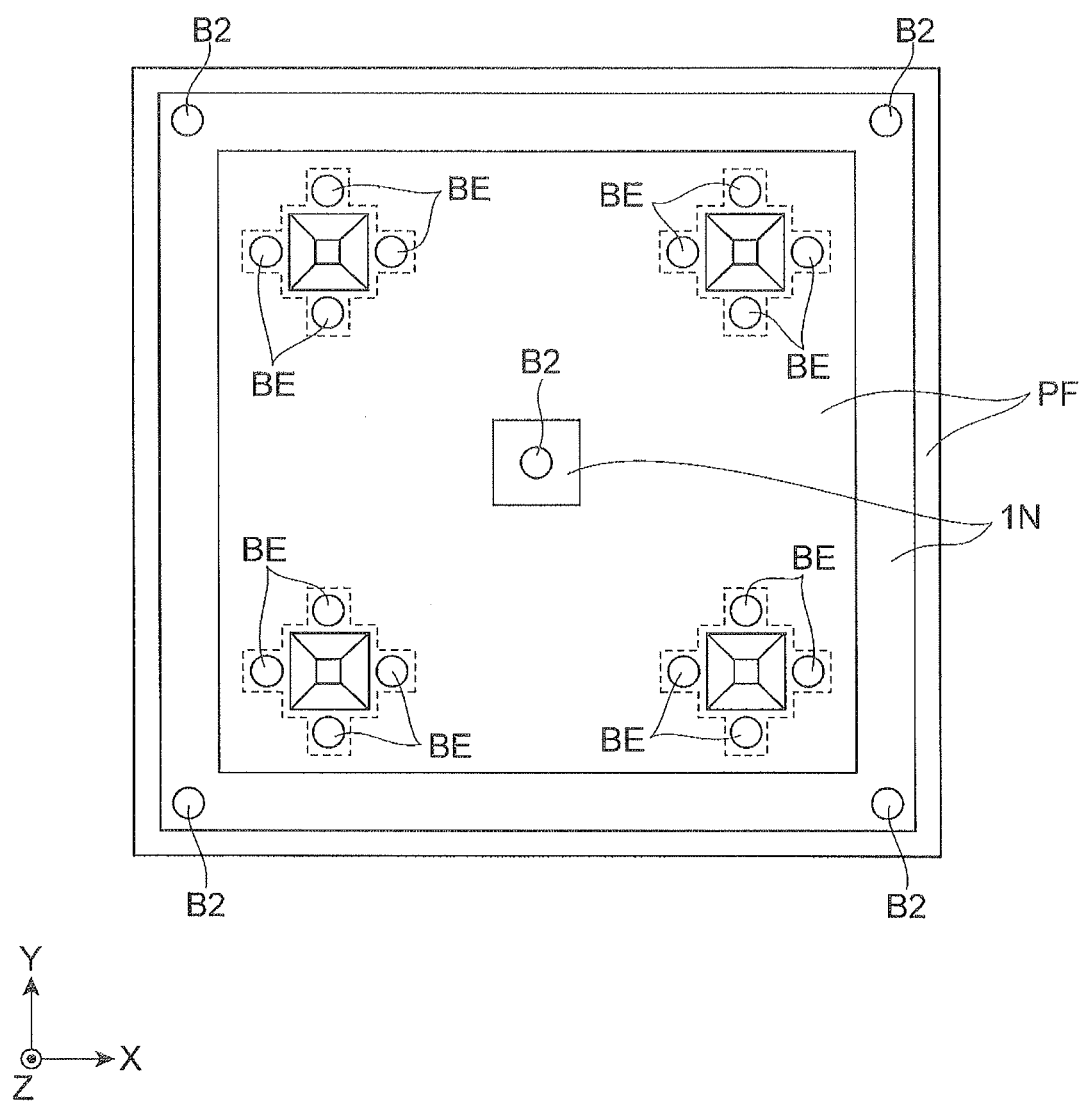
FIG. 28 is a bottom view of the semiconductor chip S1 illustrated in FIG. 27.

FIG. 28 is a bottom view of the semiconductor chip S1 illustrated in FIG. 27. While the number of first bump electrodes BE is 4 for each common electrode in this drawing in order to illustrate a case using the cross-sectional structure depicted in FIG. 20, the number of first bump electrodes BE becomes 1 for each common electrode when the one used in FIG. 14 is employed.

The passivation film PF is partly removed from the rear face of the semiconductor substrate, so as to expose a part of the rear face (a rectangular ring region and a region of the center part) of the semiconductor substrate 12. The second bump electrodes B2 are arranged at five locations in the exposed region. The second bump electrodes B2 are arranged at the four corners of the quadrangular semiconductor region 12 and a position corresponding to the center part. Four first bump electrodes BE are located at each of positions corresponding to the four common electrodes in the semiconductor region 12.

FIG. 29 is a bottom view of the semiconductor chip S1 in accordance with an improvement.

The semiconductor S1 has the same structure as with the one illustrated in FIG. 28 except that the second bump electrode B2 is disposed at only one location at the center of the semiconductor chip S1.

A method for manufacturing the above-mentioned detector will now be explained with reference to FIGS. 30 and 31.

First, the semiconductor region 12 formed with a part (the first semiconductor region 13, second semiconductor regions 14, insulating layer 16, quenching resistance R1, electrodes E1, E3, and signal lines TL) corresponding to each channel (photodiode array PDA) is prepared. Subsequently, the insulating layer 17 is formed on the principal surface 1Na side of the semiconductor region 12, and then the semiconductor region 12 is thinned from the principal surface 1Nb side (see FIG. 30(A)). The insulating layer 17 is constituted by $SiO_2$. As a method for forming the insulating layer 17, CVD (Chemical Vapor Deposition) may be used. As a method for thinning the semiconductor region 12, mechanical polishing or chemical polishing may be used.

Next, the insulating layer L3 is formed on the rear face 1Nb side of the prepared semiconductor region 12 (see FIG. 30(B)). The insulating layer L3 is constituted by SiO$_2$. As a method for forming the insulating layer 17, CVD (Chemical Vapor Deposition) may be used.

Subsequently, a region to form the through hole TH in the insulating layer L3 is removed (see FIG. 30(C)). As a method for removing the insulating layer L3, dry etching may be used.

Then, the through hole TH for placing the through electrode TE is formed in the semiconductor region 12 (see FIG. 30(D)). As a method for forming the through hole TH, dry etching or wet etching may selectively be used as appropriate. When alkali etching is used as wet etching, the insulating layer 16 functions as an etching stopper layer. Since an undercut occurs in the insulating layer L3 when forming the through hole by alkali etching, the insulating layer L3 is dry-etched. Here, the insulating layer 16 is etched at the same time.

Next, the insulating layer L2 constituted by SiO$_2$ is formed on the principal surface 1Nb side of the prepared semiconductor region 12 and then is partly removed in order to expose the electrode E3 (see FIG. 30(E)). As a method for removing the insulating layers L1, L2, dry etching may be used.

Thereafter, the through electrode TE is formed (see FIG. 30(F)). As a method for forming the through electrode TE, sputtering may be used as mentioned above.

Subsequently, the passivation film PF having an opening formed at a position corresponding to the bump electrode BE is formed on the principal surface 1Nb side of the semiconductor region 12, and then the bump electrode BE is formed (see FIG. 31(G)). This yields a semiconductor chip. Before forming the bump electrode BE, the under bump metal BM is formed in the region exposed from the passivation film PF in the through electrode TE. The BM is constituted by a material which is excellent in connecting electrically and physically with the bump electrode BE. As a method for forming the BM, electroless plating may be used. As a method for forming the bump electrode BE, a technique for mounting a solder ball or printing may be used.

Then, the glass substrate S22 is bonded to the semiconductor chip S1 with an optical adhesive (see FIG. 31(H)). As a consequence, the glass substrate S22 and semiconductor chip S1 are optically connected to each other. As with the semiconductor region 12, the glass substrate S22 is prepared in the form of a glass substrate base material including a plurality of glass substrates. The step of bonding the glass substrate S22 and semiconductor chip S1 to each other may be performed after forming the insulating layer L3 in the semiconductor region 12. The glass substrate S22 may be omitted when not required to be used.

Next, a multilayer body constituted by the glass substrate S22 (glass substrate base material) and semiconductor chip S1 (semiconductor wafer) is cut by dicing. This makes the side face of the semiconductor region 12 and the side face 30c of the glass substrate S22 flush with each other.

Thereafter, the semiconductor photodetector device 10 having the glass substrate S22 arranged opposite thereto and the mount board 20 prepared separately are connected to each other with bump electrodes (see FIG. 31(I)). These processes yield the detector chip S. In the wiring board 20, the bump electrode BE is formed on the principal surface 20U side at a position corresponding to the electrode 20a, while a signal extraction electrode is formed on the opposite surface 20D.

When having a plurality of channels each constituted by a photodiode array PDA, a detector chip with a larger area can be attained.

In the semiconductor region 12, the through electrode TE electrically connecting with the signal line TL and penetrating therethrough from the principal surface 1Na side to the principal surface 1Nb side is formed for each channel and electrically connected to an electrode of the wiring board 20 with the bump electrode. As a consequence, lines for guiding signals from the respective channels can be made very short, and their values can be made uniform without variations. This can remarkably suppress the influence of the resistance and capacity inherent in the lines, thereby improving time resolution.

The detector chip S is equipped with the glass substrate S22 arranged on the principal surface 1Na side of the semiconductor region 12. This enables the glass substrate S22 to enhance the mechanical strength of the semiconductor region 12. The side face of the semiconductor region 12 and that of the glass substrate S22 are flush with each other. This can reduce dead spaces.

The principal surface 30b of the glass substrate S22 is flat. This makes it very easy for the scintillator to be installed on the glass substrate S22. The other surface 30a of the glass substrate S22 is shown in FIG. 31.

The through electrode TB is located at a center region of each channel. This can shorten the wiring length from each APD to the through electrode TE in each channel.

The semiconductor chip S1 includes the common electrode E3, arranged on the principal surface 1Na side of the semiconductor region 12, for connecting the signal lines TL to the through electrode TE. This can securely connect the signal lines TL to the through electrode TE electrically.

The through electrode TE may be located in a region between the channels (photodiode arrays PDAs). This can prevent the aperture ratio from decreasing in each channel.

As mentioned above, the bump electrode BE may be arranged on the outside of the through hole TH. In this case, a plurality of bump electrodes (four bump electrodes in this example) BE are formed for one through electrode TE. The bump electrode BE may be placed on an electrode part which is continuous with the through electrode TE and arranged on the principal surface 1Nb side of the semiconductor region 12.

The semiconductor regions 13, 14 may have forms (e.g., circular forms) different from those mentioned above. The number (of rows and columns) and arrangement of APDs (second semiconductor regions 14) is not limited to those mentioned above. The number and arrangement of channels (PDAs) are not limited to those mentioned above, either.

Figure 32:
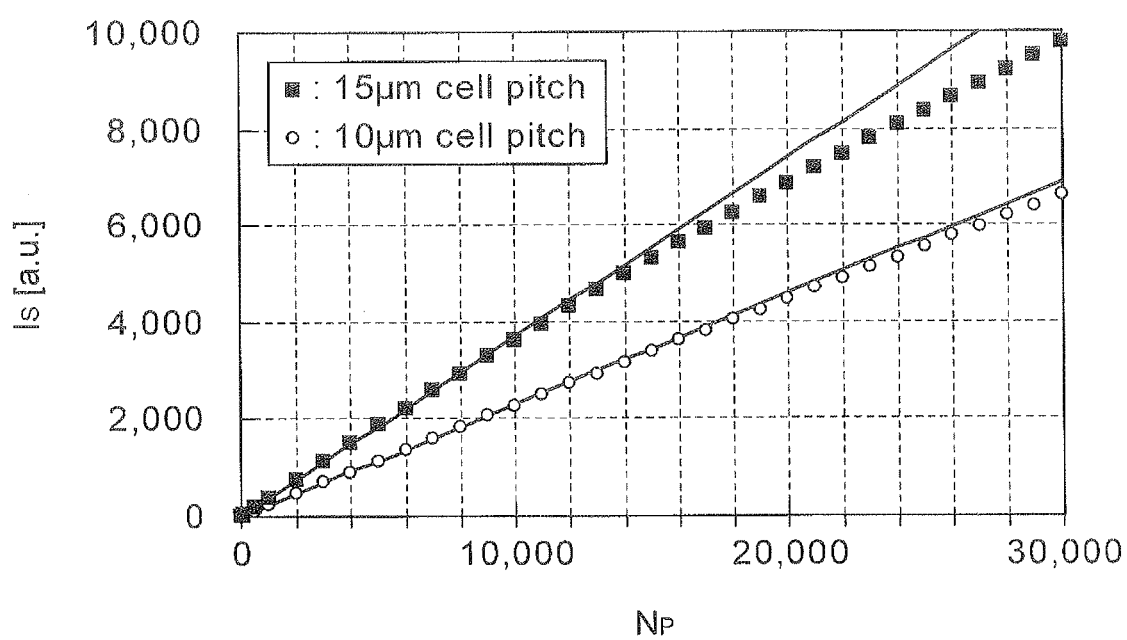
FIG. 32 is a graph illustrating the relationship between the number of simultaneously incident photons and the signal intensity (a. u.)

FIG. 32 is a graph illustrating the relationship between the number of simultaneously incident photons $N_p$ and the signal intensity $I_s$ (a. u.).

While the signal intensity $I_s$ increases with the number of photons $N_p$, their linearity is higher at a cell pitch of 10 μm than at 15 μm. The cell pitch is the distance between the centers of the photodetector units 10 adjacent to each other.

FIG. 33 is a graph illustrating the relationship between the voltage variation ΔV (V) and the relative frequency $F_R$ ((A): discrete array; (B): monolithic array). The relative frequency $F_R$ indicates the number of occurrences of the voltage variation ΔV included in the array.

A common bias potential is imparted to the cathodes of APDs in the semiconductor chip, whereby all the APDs have the same applied voltage. The operation of the photodetector unit depends on the operation voltage Vop minus the breakdown voltage Vbr, i.e., ΔVover=Vop−Vbr, whereby various characteristics such as detection efficiency, dark, and noise will be affected unless the channels have a uniform breakdown voltage. Therefore, it will be more preferred if the breakdown voltage of the APD is more uniform. However, the uniformity of breakdown voltage is restricted by wafer materials and the real ability of processes.

Using an active channel (semiconductor chip) of 3×3 mm as one chip, 16×16 devices selected as those having characteristics close to each other are arranged on a substrate as a discrete array, whose voltage variation is reduced to 0.06 V on average (FIG. 33(A)). In the discrete array, detector chips having characteristics deviated from reference values can be removed so that those having uniform characteristics can be arranged on the same wiring board, whereby the voltage variation $\Delta V$ is more suppressed than in the monolithic array. The discrete array using the through electrode yields less dead spaces.

By contrast, the voltage gain variation becomes greater in the monolithic array type in which four rows and four columns of active channels each having 3×3 mm are arranged on the same semiconductor chip. At a fixed applied voltage, the voltage variation in all of the 16 channels (semiconductor chip) is 0.21 V on average (FIG. 33(B)).

An example in which only the structure of the photodetector unit is modified will now be explained.

Figure 34:
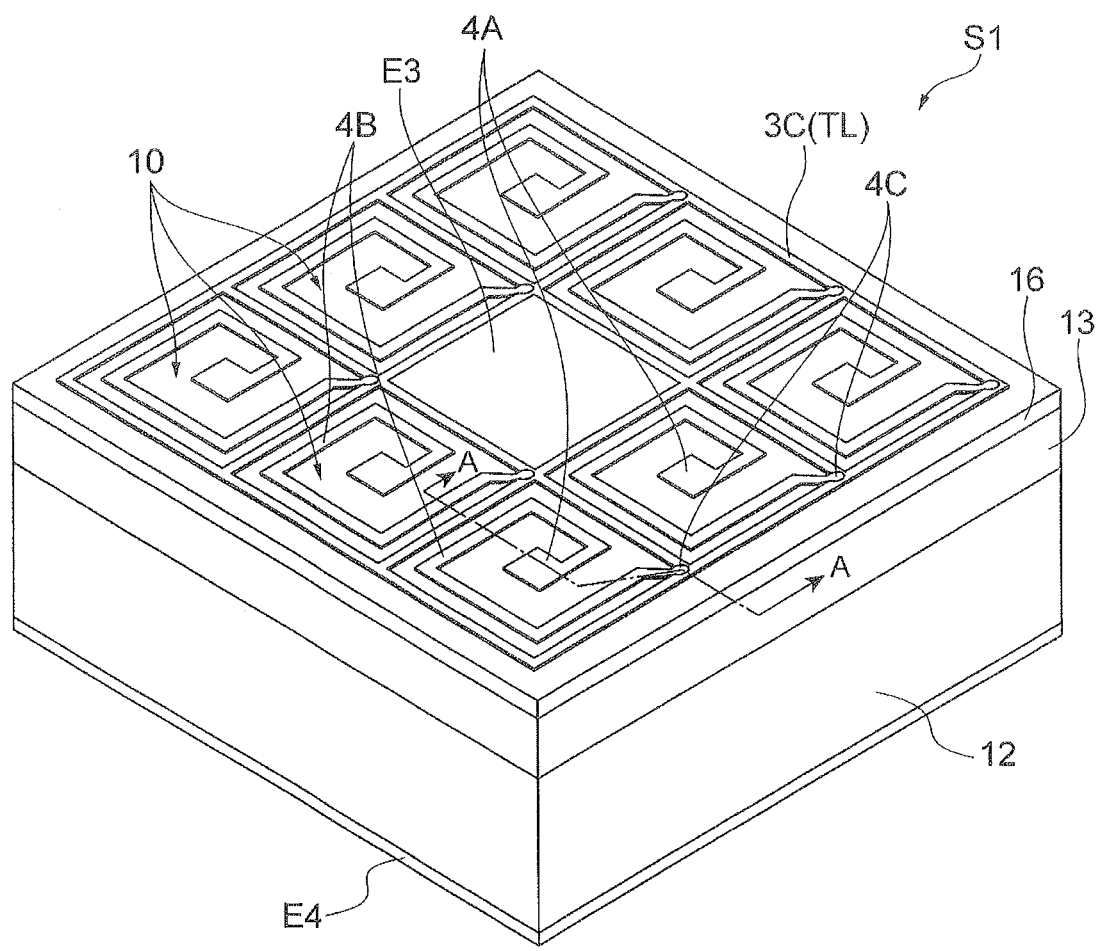
FIG. 34 is a perspective view of a photodiode array.
Figure 35:
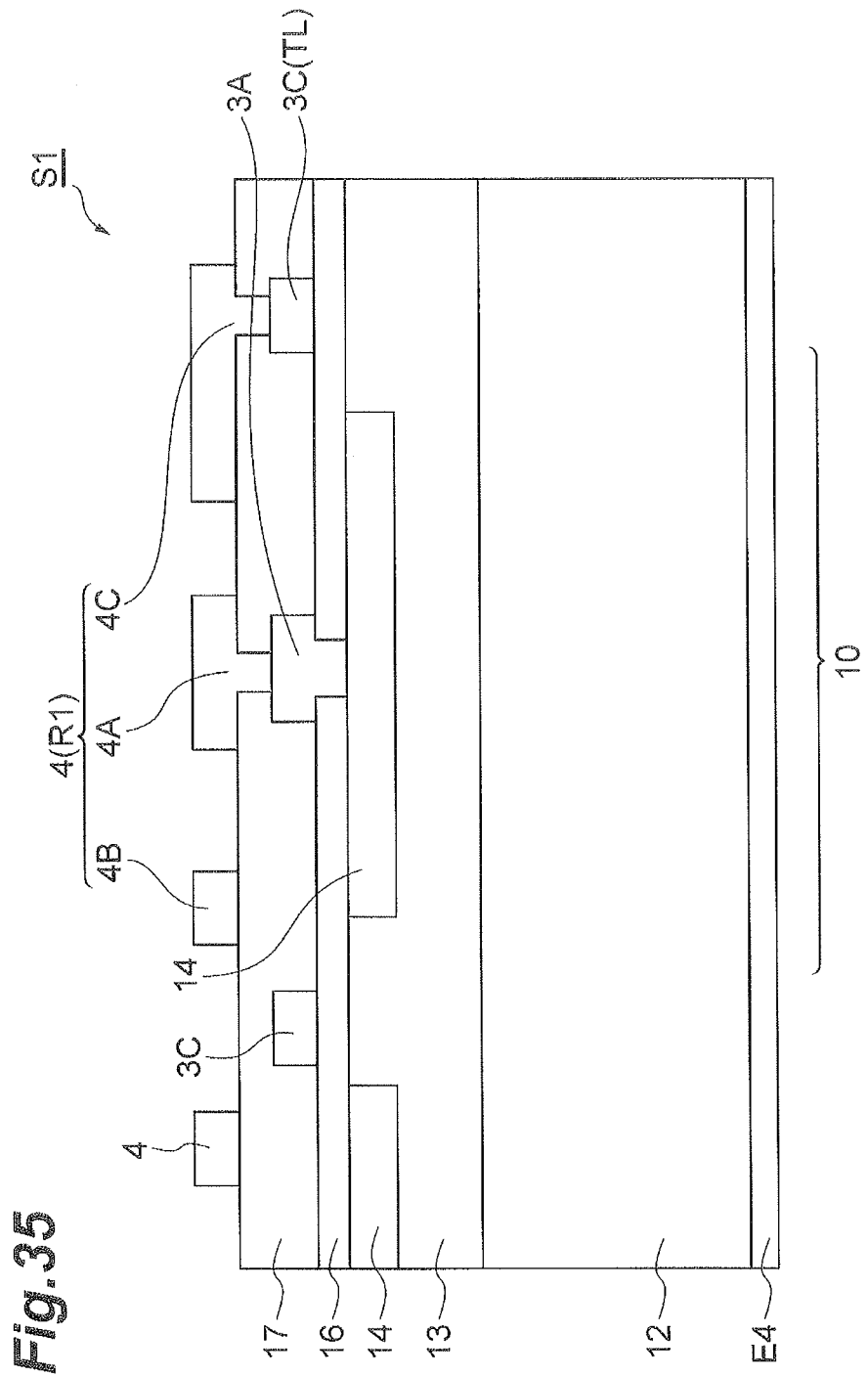
FIG. 35 is a vertical sectional view of the photodiode array taken along the arrowed line A-A.

FIG. 34 is a perspective view of the photodiode array, while FIG. 35 is a vertical sectional view of the photodiode array taken along the line A-A.

This photodiode array has a light-receiving region on the front face side of a semiconductor substrate constituted by Si. The light-receiving region includes a plurality of photodetector units 10, which are arranged two-dimensionally in a matrix. While three rows and three columns of photodetector units 10 are arranged in FIG. 34, so as to constitute the light-receiving region, the photodetector units 10 may have a greater or smaller number and may also be constructed one-dimensionally.

A signal readout wiring pattern (upper face electrode) 3C (readout line TL) patterned into a lattice is arranged on the substrate surface. FIG. 34 omits the insulating layer 17 illustrated in FIG. 35, in order to clarify the inner structure. The inside of the opening of the lattice wiring pattern 3C defines a light detection region. The photodetector units 10 are arranged within the light detection region, while outputs of the photodetector units 10 are connected to the wiring pattern 3C.

A lower face electrode E4, which is disposed on the rear face of the substrate when necessary, may be omitted if the contact resistance between the bump electrode disposed on the rear face and the semiconductor substrate is low. Therefore, when a drive voltage for the photodetector unit 10 is applied between the wiring pattern 3C, which is the upper face electrode, and the lower face electrode E4, its photodetection output can be taken out from the wiring pattern 3C.

In a p-n junction, p- and n-type semiconductor regions constituting it construct an anode and a cathode, respectively. When a drive voltage is applied to a photodiode such that the p-type semiconductor region has a potential higher than that of the n-type semiconductor region, it is a forward-bias voltage; when a drive voltage opposite thereto is applied to the photodiode, it is a reverse-bias voltage.

The drive voltage is a reverse-bias voltage applied to a photodiode constructed by a p-n junction within the photodetector unit 10. When this drive voltage is set to the breakdown voltage of the photodiode or higher, avalanche breakdown occurs in the photodiode, whereby the photodiode operates in Geiger mode. That is, each photodiode is an avalanche photodiode (APD). The photodiode has a light detection function also when a forward-bias voltage is applied thereto.

Arranged on the front face of the substrate is a resistance unit (quenching resistance R1) 4 electrically connected to one end of the photodiode. One end of the resistance unit 4 constitutes a contact electrode 4A which, by way of a contact electrode made of a different material and located directly thereunder, is electrically connected to one end of the photodiode, while the other end constitutes a contact electrode 4C which comes into the signal readout wiring pattern 3C so as to be connected electrically thereto. That is, the resistance unit 4 in each photodetector unit 10 comprises the contact electrode 4A, a resistance layer 4B extending like a curve continuously from the contact electrode 4A, and the contact electrode 4C continuous with a trailing end part of the resistance layer 4B. The contact electrode 4A, resistance layer 4B, and contact electrode 4C are constituted by resistance layers made of the same resistance material and are continuous.

The resistance unit 4 extends like a curve from an electric junction with the photodiode, so as to be connected to the signal readout wiring pattern 3C. The resistance value of the resistance unit 4, which is proportional to its length, can be increased as the resistance unit 4 extends like a curve. The existence of the resistance unit 4 can stabilize the surface level of the semiconductor region located thereunder, thereby yielding a steady output.

Figure 42:
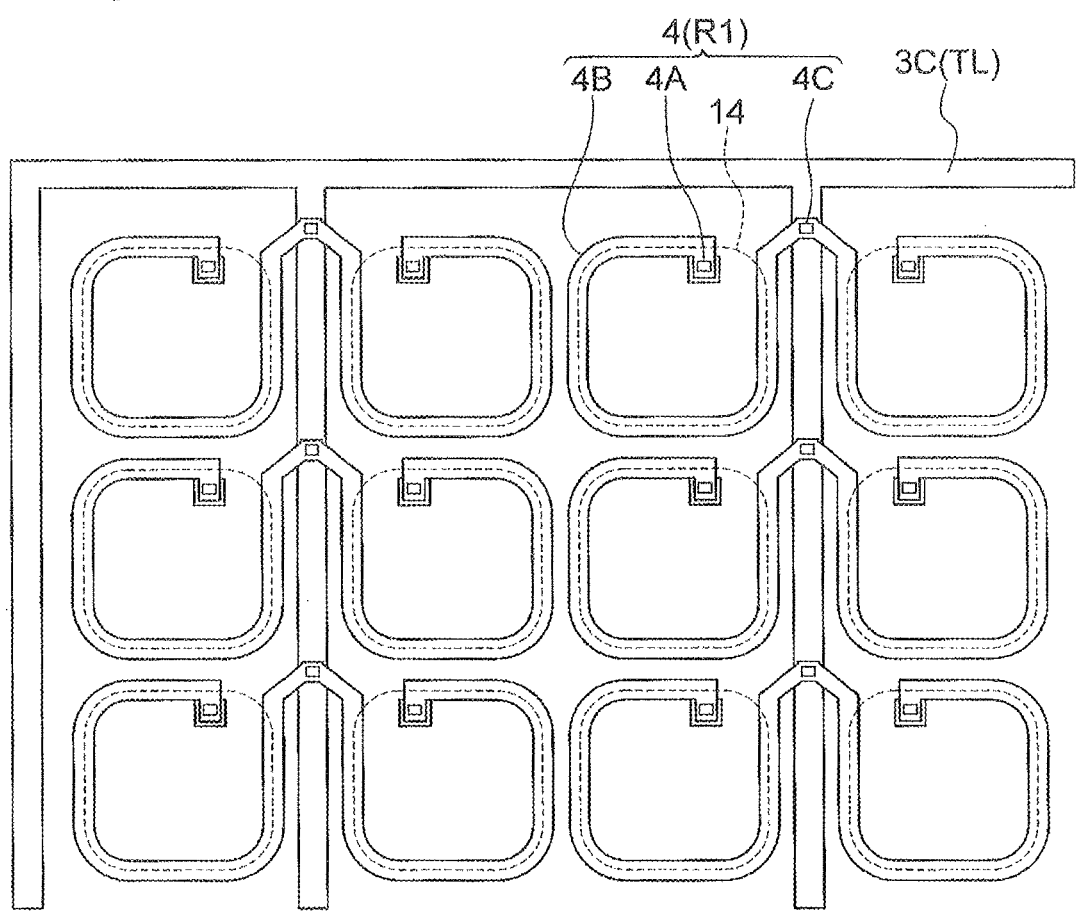
FIG. 42 is a plan view of the photodiode array.

While the wiring pattern 3C in the example illustrated in FIG. 34 includes a form surrounding each photodetector unit 10, the form of the wiring pattern 3C is not limited thereto but may surround two or more photodetector units 10 or one or more columns of photo detectors 10 (see FIG. 42). In FIG. 42, a plurality of columns of photodetector units are taken as one group, and the wiring pattern 3C (readout line TL) extends between such groups.

Arranging the resistance layer 4B so as to cover edges of the semiconductor region 14 in each photodetector unit as illustrated in FIG. 42 can make the surface level of the semiconductor region 14 more stable. More specifically, the resistance layer 4B is arranged on the contour of the semiconductor region 14 as seen in the thickness direction.

The photodiode included in the photodetector unit 10 has one end connected to the wiring pattern 3C having the same potential at all the positions in principle and the other end connected to the lower face electrode E4 providing the substrate potential. That is, the photodiodes in all the photodetector units 10 are connected in parallel.

The common electrode E3 is disposed on the front face of the semiconductor chip S1, while all the readout lines TL are connected to the common electrode E3. The cross-sectional structure in the vicinity of the common electrode E3 and the structure of the wiring board arranged under the bump electrode are the same as those mentioned above.

In the example of FIG. 34, each contact electrode 4A is located at a center part of each light detection region surrounded by the wiring pattern 3C. The two-dimensional pattern of the resistance unit 4B includes a form extending so as to whirl about the contact electrode 4A. Placing the contact electrode 4A at the center part of each light detection region and arranging the resistance layer 4B so as to make it whirl about the contact layer 4A can set a long length for the resistance layer 4B.

As illustrated in FIG. 35, each photodetector unit 10 comprises the first conduction type (n-type) first semiconductor region (layer) 12 and the second conduction type (p-type) second semiconductor region (semiconductor layer 13 and high impurity concentration region 14) adapted to construct a p-n junction with the first semiconductor region 12.

The first contact electrode 3A is in contact with the high impurity concentration region (semiconductor region) 14 in the second semiconductor region. The high impurity concentration region 14, which is a diffusion region (semiconductor region) formed by diffusing impurities into the semiconductor layer 13, has an impurity concentration higher than that in the semiconductor layer 13. In this example (type 1), the p-type semiconductor layer 13 is formed on the n-type first semiconductor region 12, while the p-type high impurity concentration region 14 is formed on the front face side of the semiconductor layer 13. Therefore, the p-n junction constituting the photodiode is formed between the first semiconductor region 12 and the semiconductor layer 13.

As a layer structure of the semiconductor substrate, one in which the conduction types are reversed from those mentioned above may also be employed. That is, the structure of type 2 is constructed by forming the n-type semiconductor layer 13 on the p-type first semiconductor region 12 and forming the n-type high impurity concentration region 14 on the front face side of the semiconductor layer 13.

The p-n junction interface may also be formed on the surface layer side. In this case, the structure of type 3 is one in which the n-type semiconductor layer 13 is formed on the n-type first semiconductor region 12, while the p-type high impurity concentration region 14 is formed on the front face side of the semiconductor layer 13. In this structure, the p-n junction is formed at the interface between the semiconductor layer 13 and semiconductor region 14.

The conduction types may also be reversed in this structure as a matter of course. That is, the structure of type 4 is one in which the p-type semiconductor layer 13 is formed on the p-type first semiconductor region 12, while the n-type high impurity concentration region 14 is formed on the front face side of the semiconductor layer 13.

Figure 41:
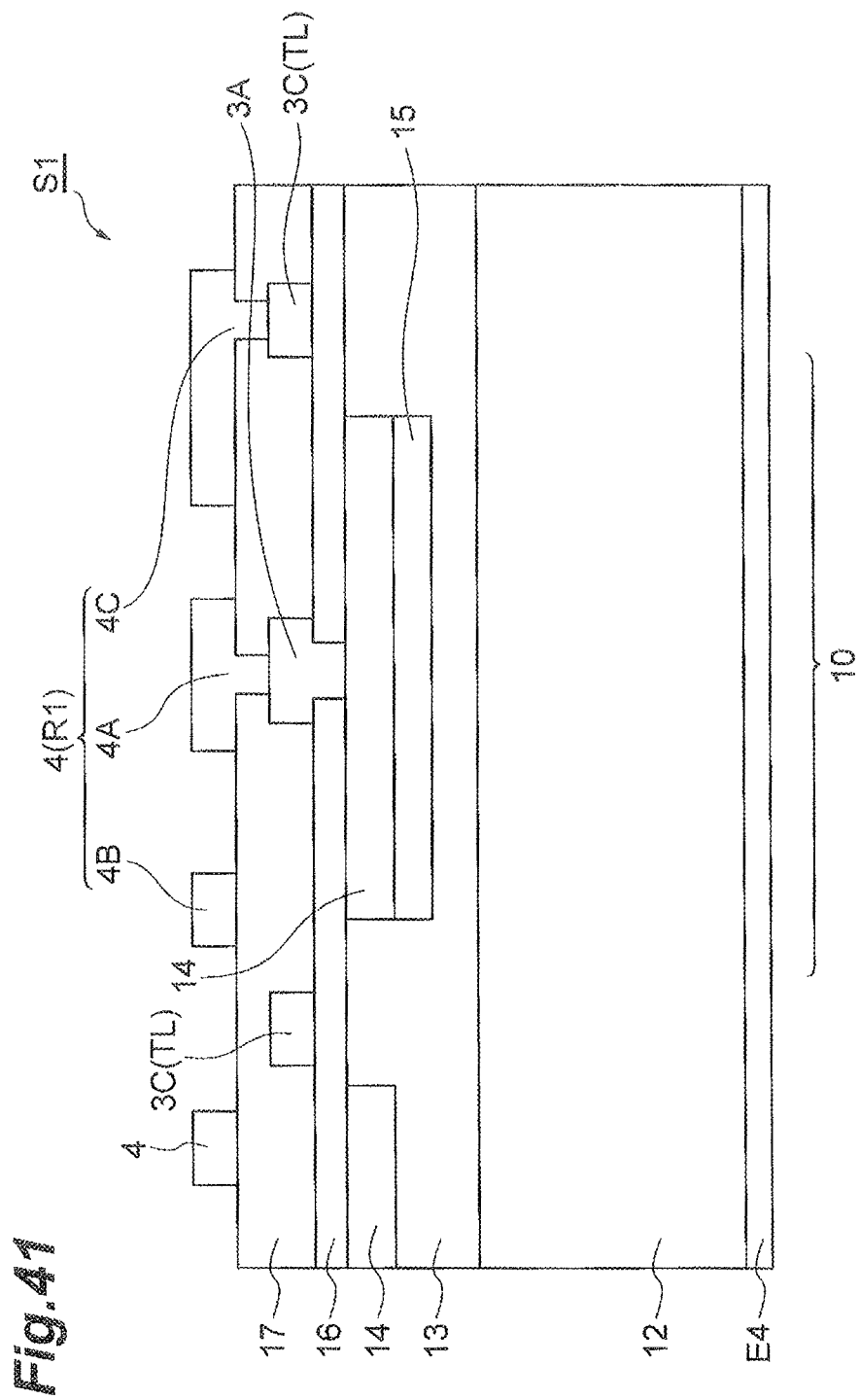
FIG. 41 is a vertical sectional view of a photodiode array having changed its substrate structure.

As the structure of the semiconductor substrate, one illustrated in FIG. 41 may also be employed.

FIG. 41 is a vertical sectional view of a photodiode array having changed its substrate structure.

This structure is the same as the structures of types 1 to 4 mentioned above except that a semiconductor region 15 is arranged directly under the semiconductor region 14. The semiconductor region 15 has a conduction type identical to or different from that of the semiconductor region 14. Those having the same conduction type will be referred to as types 1S to 4S, whereas those having the different conduction type will be referred to as types 1D to 4D. The impurity concentration in the semiconductor region 15 is lower than that in the semiconductor region 14. B (boron) may be employed as p-type impurities, while P (phosphorus) or As (arsenic) may be employed as n-type impurities.

Preferred ranges of the conduction type, impurity concentration, and thickness of each layer in the above-mentioned semiconductor structure are as follows:

Type 1
Semiconductor region 12 (conduction type/impurity concentration/thickness): n-type/$5\times10^{11}$ to $1\times10^{20}$ cm$^{-3}$/30 to 700 µm
Semiconductor region 13 (conduction type/impurity concentration/thickness): p-type/$1\times10^{14}$ to $1\times10^{17}$ cm$^{-3}$/2 to 50 µm
Semiconductor region 14 (conduction type/impurity concentration/thickness): p-type/$1\times10^{18}$ to $1\times10^{20}$ cm$^{-3}$/10 to 1000 µm Type 2
Semiconductor region 12 (conduction type/impurity concentration/thickness): p-type/$5\times10^{11}$ to $1\times10^{20}$ cm$^{-3}$/30 to 700 µm
Semiconductor region 13 (conduction type/impurity concentration/thickness): n-type/$1\times10^{14}$ to $1\times10^{17}$ cm$^{-3}$/2 to 50 µm
Semiconductor region 14 (conduction type/impurity concentration/thickness): n-type/$1\times10^{18}$ to $1\times10^{20}$ cm$^{-3}$/10 to 1000 µm Type 3
Semiconductor region 12 (conduction type/impurity concentration/thickness): n-type/$5\times10^{11}$ to $1\times10^{20}$ cm$^{-3}$/30 to 700 µm
Semiconductor region 13 (conduction type/impurity concentration/thickness): n-type/$1\times10^{14}$ to $1\times10^{17}$ cm$^{-3}$/2 to 50 µm
Semiconductor region 14 (conduction type/impurity concentration/thickness): p-type/$1\times10^{18}$ to $1\times10^{20}$ cm$^{-3}$/10 to 1000 µm Type 4
Semiconductor region 12 (conduction type/impurity concentration/thickness): p-type/$5\times10^{11}$ to $1\times10^{20}$ cm$^{-3}$/30 to 700 µm
Semiconductor region 13 (conduction type/impurity concentration/thickness): p-type/$1\times10^{14}$ to $1\times10^{17}$ cm$^{-3}$/2 to 50 µm
Semiconductor region 14 (conduction type/impurity concentration/thickness): n-type/$1\times10^{18}$ to $1\times10^{20}$ cm$^{-3}$/10 to 1000 µm Type 1S
Semiconductor regions 12, 13, 14 have the same parameters as those of type 1.
Semiconductor region 15 (conduction type/impurity concentration/thickness): p-type/$1\times10^{14}$ to $1\times10^{17}$ cm$^{-3}$/2 to 50 µm Type 2S
Semiconductor regions 12, 13, 14 have the same parameters as those of type 2.
Semiconductor region 15 (conduction type/impurity concentration/thickness): n-type/$1\times10^{14}$ to $1\times10^{17}$ cm$^{-3}$/2 to 50 µm Type 3S
Semiconductor regions 12, 13, 14 have the same parameters as those of type 3.
Semiconductor region 15 (conduction type/impurity concentration/thickness): p-type/$1\times10^{14}$ to $1\times10^{17}$ cm$^{-3}$/2 to 50 µm Type 4S
Semiconductor regions 12, 13, 14 have the same parameters as those of type 4.
Semiconductor region 15 (conduction type/impurity concentration/thickness): n-type/$1\times10^{14}$ to $1\times10^{17}$ cm$^{-3}$/2 to 50 µm Type 1D
Semiconductor regions 12, 13, 14 have the same parameters as those of type 1.
Semiconductor region 15 (conduction type/impurity concentration/thickness): n-type/$1\times10^{14}$ to $1\times10^{17}$ cm$^{-3}$/2 to 50 µm Type 2D
Semiconductor regions 12, 13, 14 have the same parameters as those of type 2.
Semiconductor region 15 (conduction type/impurity concentration/thickness): p-type/$1\times10^{14}$ to $1\times10^{17}$ cm$^{-3}$/2 to 50 µm Type 3D
Semiconductor regions 12, 13, 14 have the same parameters as those of type 3.
Semiconductor region 15 (conduction type/impurity concentration/thickness): n-type/$1\times10^{14}$ to $1\times10^{17}$ cm$^{-3}$/2 to 50 µm Type 4D
Semiconductor regions 12, 13, 14 have the same parameters as those of type 4.
Semiconductor region 15 (conduction type/impurity concentration/thickness): p-type/$1\times10^{14}$ to $1\times10^{17}$ cm$^{-3}$/2 to 50 µm While the lowermost semiconductor region 12 constitutes a semiconductor substrate having a large thickness in the above-mentioned example, the photodetector unit 10 may further comprise a semiconductor substrate thereunder; in this case, the semiconductor region 12 has a thickness smaller than that of the additional semiconductor substrate.

The semiconductor region 13, which can be formed by epitaxial growth on the semiconductor region 12, may also be formed by impurity diffusion or ion implantation to the substrate. The semiconductor regions 14, 15 can be formed by impurity diffusion or ion implantation to the semiconductor region 13.

The contact electrode 3A and resistance unit 4 illustrated in FIGS. 34, 35, and 41 will now be explained.

Each photodetector unit 10 comprises the insulating layer 16 formed on the front face of the semiconductor substrate. The front faces of the semiconductor regions 13, 14 are covered with the insulating layer 16. The insulating layer 16 has a contact hole, in which the contact electrode 3A is formed. The contact electrode 3A is made of the same material and formed on the insulating layer 16 by the same steps as with the wiring pattern 3C. The contact electrode 3A and wiring pattern 3C are made of a metal, a specific example of which is aluminum (Al). As materials for the contact electrode 3A and wiring pattern 3C, other low resistance metal materials (Au, Ag, and Cu) may be used, and a structure of two or more layers and alloys may also be employed. Examples of the alloys include compounds containing some of metal elements such as Al, Ag, Au, Ge, Ni, Cr, and Ti.

The upper insulating layer 17 is formed on the lower insulating layer 16 and the first contact electrode 3A. The insulating layers 16, 17 are constituted by a highly heat-resistant inorganic insulator such as $SiO_2$ and silicon nitride (SiNx). The insulating layer 17 has a contact hole, arranged coaxially with the first contact electrode 3A, having the second contact electrode 4A formed therein. Therefore, the first and second contact electrodes 3A, 4A are arranged coaxially.

The second contact electrode 4A includes a material different from that of the first contact electrode 3A. The second contact electrode 4A is a part of the resistance unit 4 and has a resistivity higher than that of the first contact electrode 3A. The second contact electrode 4A is arranged at such a position as to overlap the first contact electrode 3A and is in contact with the first contact electrode 3A. The second contact electrode 4A is continuous with the resistance layer 4B.

Coaxially arranging the second contact electrode 4A at such a position as to overlap the first contact electrode 3A can minimize the space required for connecting the resistance layer 4B and first contact electrode 3A to each other. Inevitably, the first and second contact electrodes 3A, 4A are not flush with each other and have positions in the height direction different from each other, whereby the resistance layer 4B continuously extends from the second contact electrode 4A. This can save wiring within the photodetector unit 10, thereby remarkably increasing the aperture ratio of the photodetector unit.

The contact electrode 4C is located at the trailing end of the resistance layer 4B. The contact electrode 4C is also a part of the resistance unit 4. The wiring pattern 3C formed on the insulating layer 16 is located directly under the contact electrode 4C, while the contact electrode 4C is in contact with and connected to the wiring pattern 3C.

Carriers generated at the p-n junction in response to photons incident thereon flow through the first and second contact electrodes 3A, 4A to the resistance layer 4B and are taken out through the wiring pattern 3C connected to the resistance layer 4B through the contact electrode 4C.

The contact layers 4A, 4C and resistance layer 4B, which are made of the same resistance material, may also be constituted by different materials. Semiconductors alone or alloys or compounds containing semiconductors and metals at appropriate ratios can be used as resistance materials. Examples of the resistance materials include NiCr, TaNi, FeCr, and the like as well as SiCr.

The contact layers 4A, 4C and resistance layer 4B are preferably constituted by SiCr as a matter of course. SiCr has such a high light transmittance that, even when the resistance layer exists within the photodetector unit 10, incident photons pass through the resistance layer 4B, whereby the effective aperture ratio can be increased. SiCr varies its resistance value so little within a wafer surface that it can easily be made thinner on the order of 1 µm. It can also increase sheet resistance. While polysilicon has a sheet resistance of 1 to 30 (kΩ/sq.), that of SiCr is 1 to 50 (kΩ/sq.). That is, a high resistance value can be achieved in a small size by using SiCr.

Preferably, the thickness of the resistance layer 4B is at least 3 nm but not more than 50 nm. The uniformity of the resistance layer can be secured at the lower limit or above, while photons can fully be transmitted at the upper limit or under.

Figure 36:
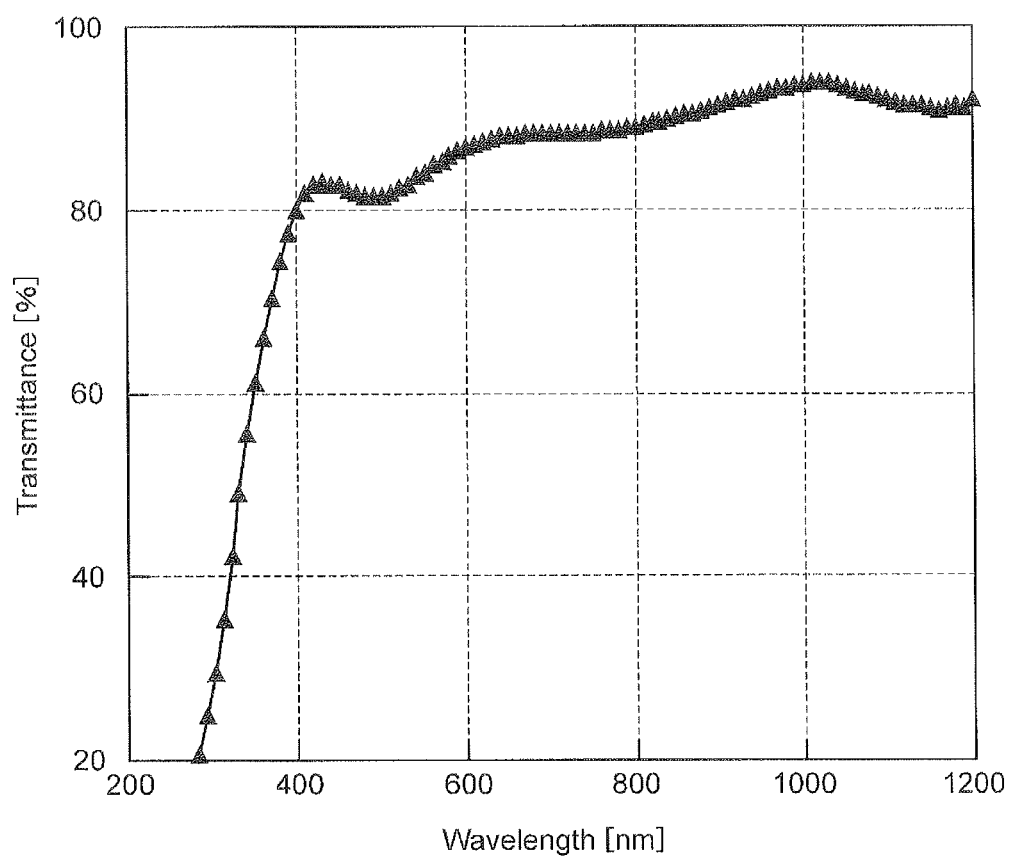
FIG. 36 is a graph illustrating the relationship between the wavelength (nm) of light incident on SiCr and its transmittance (%)

FIG. 36 is a graph illustrating the relationship between the wavelength (nm) of light incident on SiCr constituting the resistance layer and its transmittance (%). The thickness of the SiCr layer is 20 nm.

SiCr has a transmittance of 80% or higher for light having a wavelength of 400 nm or longer. It tends to cut off light having a wavelength shorter than 400 nm. This graph shows a small spectral peak for light having a wavelength of at least 400 nm but shorter than 500 nm. It means that, even when light at 500 nm or longer is cut off by a filter, light having a wavelength of at least 400 nm but shorter than 500 nm can selectively be transmitted therethrough. Unless such a filter is not combined, light having a wavelength of 400 nm or longer, at least up to a wavelength of 1200 nm, can be transmitted at a transmittance of 80% or higher.

The above-mentioned photodiode array was manufactured.

Manufacturing conditions are as follows:
(1) Structure (numerical examples in the structure of FIGS. 34 and 35)
Semiconductor region 12:
Conduction type: n (impurities: Sb (antimony))
Impurity concentration: $5.0 \times 10^{11}$ cm$^{-3}$
Thickness: 650 µm
Semiconductor region 13:
Conduction type: p (impurities: B (boron))
Impurity concentration: $1.0 \times 10^{14}$ cm$^{-3}$
Thickness: 30 µm
Semiconductor region 14:
Conduction type: p (impurities: B (boron))
Impurity concentration: $1.0 \times 10^{18}$ cm$^{-3}$
Thickness: 1000 nm
Insulating layer 16: $SiO_2$ (thickness: 1000 nm)
Insulating layer 17: $SiO_2$ (thickness: 2000 nm)
Contact electrode 3A:
Material: aluminum (Al)
Contact hole diameter: 2.0 µm Wiring pattern 3C:
Material: aluminum (Al)
Thickness: 1.0 μm
Width W0 of the wiring pattern 3C: 1.0 to 3.0 μm
Area S of the region (light detection region) surrounded by the wiring pattern 3C of one photodetector unit 10: 100 to 2500 μm$^2$
Distance X between centers of photodetector units 10 adjacent to each other: 50 μm to 10 μm
Resistance unit 4:
Material: SiCr
Contact electrode 4A
Contact hole diameter: 1.0 μm
Resistance layer 4B
Thickness of the resistance layer 4B: 20 nm
Width W1 of the resistance layer 4B: 1.0 to 3.0 μm
Width L1 of the resistance layer 4B: 10 to 50 μm
Resistance value of the resistance unit 4: 200 to 500 kΩ
Contact electrode 4C
Contact hole diameter: 1.0 μm
(2) Manufacturing method condition
Semiconductor region 12: CZ method ((001) Si semiconductor substrate)
Semiconductor region 13: Si epitaxial growth (raw material: vapor-phase silicon tetrachloride (SiCl$_4$), trichlorosilane (SiCl$_3$), growth temperature at 1200° C.)
Semiconductor region 14: thermal diffusion of impurities (impurity raw material: diborane (B$_2$H$_6$), diffusion temperature at 1200° C.)
Insulating layer 16: Si thermal oxidation (oxidation temperature at 1000° C.)
Insulating layer 17: plasma CVD (raw material gas: tetraethoxysilane (TEOS) and oxygen gas, growth temperature at 200° C.)
Contact electrode 3A and wiring pattern 3C: vapor deposition (raw material: aluminum)
Resistance unit 4: sputtering (target material: SiCr)

Figure 37:
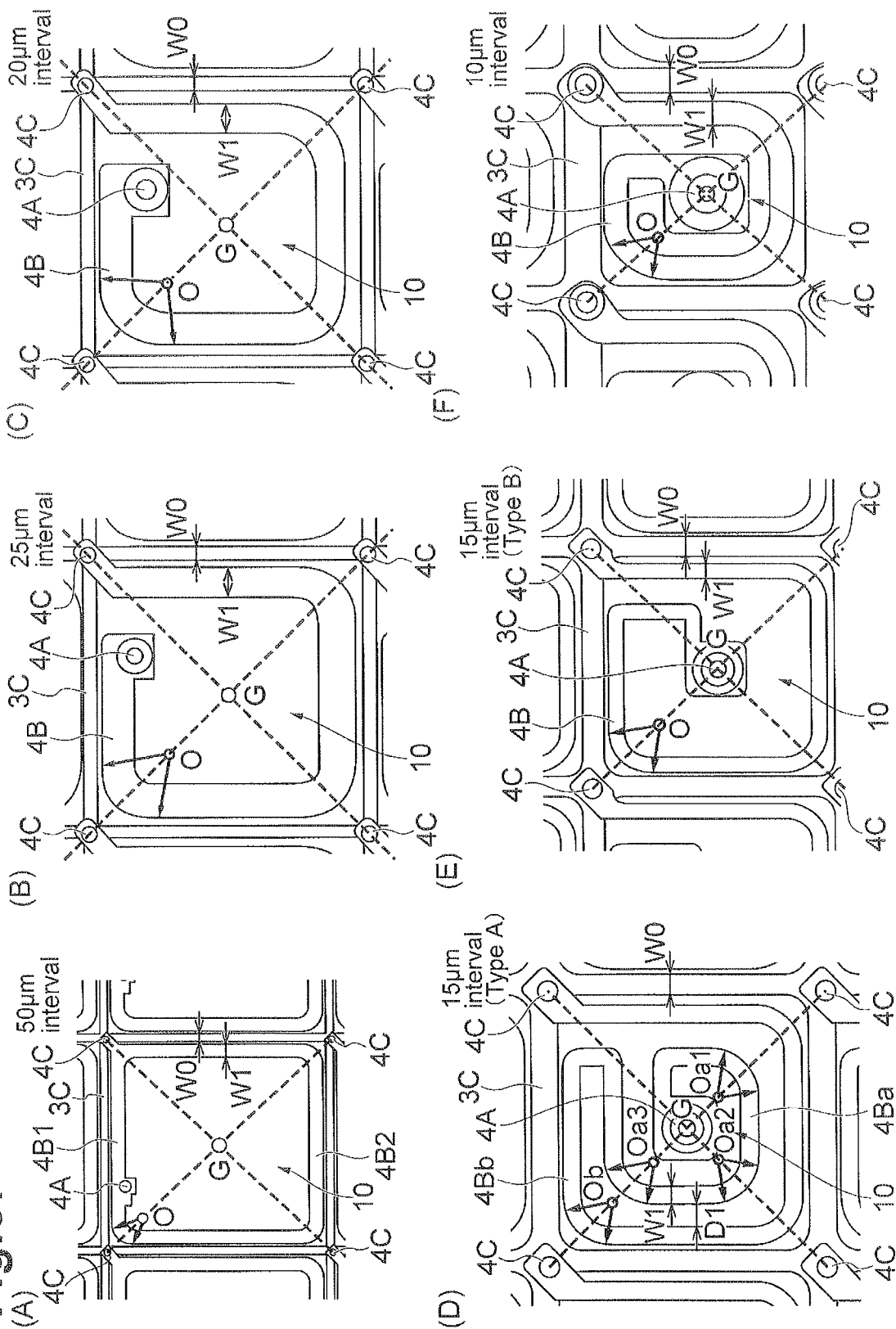
FIG. 37 is a diagram illustrating (A) a photodetector unit (arranged at a 50-μm interval), (B) a photodetector unit (arranged at a 25-μm interval), (C) a photodetector unit (arranged at a 20-μm interval), (D) a photodetector unit (arranged at a 15-μm interval; type A), (E) a photodetector unit (arranged at a 15-μm interval; type B), and (F) a photodetector unit (arranged at a 10-μm interval)

FIG. 37 is a diagram illustrating (A) a photodetector unit (arranged at a 50-μm interval), (B) a photodetector unit (arranged at a 25-μm interval), (C) a photodetector unit (arranged at a 20-μm interval), (D) a photodetector unit (arranged at a 15-μm interval; type A), (E) a photodetector unit (arranged at a 15-μm interval; type B), and (F) a photodetector unit (arranged at a 10-μm interval)

Parameters of the structure of FIG. 37(A) are as follows. Here, the length of the resistance layer 4B is the length of a center line in its width direction.

Width of the wiring pattern 3C: W0=2.0 μm
Area of the light detection region: S=2025 μm$^2$
Width of the resistance layer 4B: W1=3.0 μm
Length (total length) of the resistance layer 4B: L1=200 μm
Resistance value of the resistance unit 4=160 kΩ

The resistance layer 4B as a whole is formed like a ring along the inner side face of the lattice-like wiring pattern 3C. In this structure, the resistance layer 4B has two paths from the location of the second contact electrode 4A to the signal output contact electrode 4C. That is, the resistance layer 4B has a relatively short resistance layer 4B1 and a relatively long resistance layer 4B2. The resistance value of the resistance layer 4B is given by the combined resistance of the resistance layers 4B 1, 4B2 having different lengths.

The contact electrode 4C is arranged at each intersection of the lattice-like wiring pattern 3C. Therefore, the contact electrodes 4C are located at four positions on diagonal lines of the light detection region, while an intersection of the diagonal lines is a center (center of gravity) G of the light detection region (photodetector unit). The distance X between the centers G of the photodetector units 10 adjacent to each other is 50 μm.

The resistance layers 4B1, 4B2 have a substantially rectangular ring form as a whole, but smoothly bend at their corners. Each corner of the resistance layers 4B1, 4B2 has an outer edge with a center of curvature O located on the above-mentioned diagonal line passing the center G and a radius of curvature R of 5.0 μm, while the two chords extending from both ends of the arc of the outer edge toward the center of curvature O form an angle θ of 8° therebetween. For preventing electric fields from concentrating, the radius of curvature R and the angle θ are set to 2 to 10 μm and 3 to 14°, respectively.

Carriers extracted from the second contact electrode 4A travel through the resistance layer 4B to the contact electrode 4C and then are taken out through the wiring pattern 3C.

FIG. 37(B) is a diagram illustrating the manufactured photodetector 10 (adjacent center distance X=25 μm).
Parameters of the structure in this example are as follows:
Width of the wiring pattern 3C: W0=1.5 μm
Area of the light detection region: S=420 μm$^2$
Width of the resistance layer 4B: W1=3.0 μm
Length (total length) of the resistance layer 4B: L1=70 μm
Resistance value of the resistance unit 4=250 kΩ

The resistance layer 4B as a whole is formed into a partly cutout ring along the inner side face of the lattice-like wiring pattern 3C. In this structure, the resistance layer 4B has one path from the location of the second contact electrode 4A to the signal output contact electrode 4C.

The contact electrode 4C is arranged at each intersection of the lattice-like wiring pattern 3C. Therefore, the contact electrodes 4C are located at four positions on diagonal lines of the light detection region, while an intersection of the diagonal lines is a center (center of gravity) G of the light detection region (photodetector unit). The distance X between the centers G of the photodetector units 10 laterally adjacent to each other is 25 μm.

The resistance layer 4B has three corners constituting a part of the ring form and smoothly bends at the corners. Each corner of the resistance layer 4B has an outer edge with a center of curvature O located on the above-mentioned diagonal line passing the center G and a radius of curvature R of 5.0 μm, while the two chords extending from both ends of the arc of the outer edge toward the center of curvature O form an angle θ of 8° therebetween. For preventing electric fields from concentrating, the radius of curvature R and the angle θ are set to 2 to 10 μm and 6 to 37°, respectively.

Carriers extracted from the second contact electrode 4A travel through the resistance layer 4B to the contact electrode 4C and then are taken out through the wiring pattern 3C.

FIG. 37(C) is a diagram illustrating the manufactured photodetector 10 (adjacent center distance X=20 μm).
Parameters of the structure in this example are as follows:
Width of the wiring pattern 3C: W0=1.5 μm
Area of the light detection region: S=240 μm$^2$
Width of the resistance layer 4B: W1=2.0 μm
Length (total length) of the resistance layer 4B: L1=55 μm
Resistance value of the resistance unit 4–300 kΩ

Since the photodetector unit has a basic structure identical to that illustrated in FIG. 37(B), their overlapping explanations will be omitted. While the distance X between the centers U of the photodetector units 10 adjacent to each other is 20 μm, a difference lies in that the contact electrode 4A projects to the inside of the light detection region by a greater ratio in the one illustrated in FIG. 37(C) than in that of FIG. 37(B). In any mode of the photodetector unit, the contact electrodes 4A, 4C are depressed at their centers. The distance between the wiring pattern 3C adjacent to the contact electrode 4C and the center position of the contact electrode 4A is greater than the distance from this wiring pattern 3C to an edge line on the inside of the resistance layer 4B.

The resistance layer 4B has three corners constituting a part of the ring form and smoothly bends at the corners. Each corner of the resistance layer 4B has an outer edge with a center of curvature O located on the above-mentioned diagonal line passing the center G and a radius of curvature R of 3.0 µm, while the two chords extending from both ends of the arc of the outer edge toward the center of curvature O form an angle θ of 13° therebetween. For preventing electric fields from concentrating, the radius of curvature R and the angle θ are set to 2 to 5 µm and 8 to 23°, respectively.

Carriers extracted from the second contact electrode 4A travel through the resistance layer 4B to the contact electrode 4C and then are taken out through the wiring pattern 3C.

FIG. 37(D) is a diagram illustrating the manufactured photodetector (adjacent center distance X=15 µm; type A). In the photodetector unit of type A, the contact electrode 4A is arranged at the center of the light detection region, while the resistance layer 4B comprises a forward rotation region 4Ba extending while rotating clockwise from the center and a reverse rotation region 4Bb extending while rotating anticlockwise continuously from the forward rotation region 4Ba. Here, the clockwise rotation is taken as the forward rotation. A structure taking the anticlockwise rotation as the forward rotation can also be manufactured as a matter of course.

Parameters of the structure in this example are as follows:
Width of the wiring pattern 3C: W0=1.2 µm
Area of the light detection region: S=132 µm²
Width of the resistance layer 4B: W1=1.0 µm
Length (total length) of the resistance layer 4B: L1=78 µm
Resistance value of the resistance unit 4=600 kΩ

The contact electrode 4C is arranged at each intersection of the lattice-like wiring pattern 3C. Therefore, the contact electrodes 4C are located at four positions on diagonal lines of the light detection region, while an intersection of the diagonal lines is a center (center of gravity) G of the light detection region (photodetector unit). The distance X between the centers G of the photodetector units 10 adjacent to each other is 15 µm.

As mentioned above, the resistance layer 4B comprises the forward rotation region 4Ba and reverse rotation region 4Bb. In this structure, the resistance layer 4B has one path from the location of the second contact electrode 4A to the signal output contact electrode 4C, while the respective magnetic fields formed by the regions 4Ba, 4Bb having rotation directions different from each other are directed opposite to each other at the center G. That is, the magnetic fields formed when detected electrons advance have such a structure that their influences cancel each out at the center position, thereby reducing influences of self-magnetic fields on the detection output.

The forward rotation region 4Ba, has three mildly bending corners, which have respective outer edges with centers of curvature Oa1, Oa2, Oa3 located on the above-mentioned diagonal line passing the center G and a radius of curvature Ra of 2.0 µm, while the two chords extending from both ends of the arc of each outer edge toward its corresponding radius of curvature Oa1, Oa2, Oa3 form an angle θa of 19° therebetween. As for the forward rotation region 4Ba, for preventing electric fields from concentrating, the radius of curvature Ra and the angle θa are set to 2 to 5 µm and 19 to 58°, respectively.

The reverse rotation region 4Bb also has three mildly bending corners, which have the same form except for their directions. For explaining one angle, a corner has an outer edge with a center of curvature Ob located on the above-mentioned diagonal line passing the center G and a radius of curvature Rb of 2.0 µm, while the two chords extending from both ends of the arc of the outer edge toward the center of curvature Ob form an angle θb of 8° therebetween. As for the reverse rotation region 4Bb, for preventing electric fields from concentrating, the radius of curvature R and the angle θb are set to 2 to 5 µm and 8 to 23°, respectively.

Since the positive rotation region 4Ba is located inside of the reverse rotation region 4Bb, the angle θa is set greater than the angle θb.

While the outer edge of the forward rotation region 4Ba located on the inside and the inner edge of the reverse rotation region 4Bb located on the outside oppose each other, the minimum value D1 of their distance of separation is 0.6 µm. The minimum value D1 of the distance of separation is set to 0.6 to 2.0 µm.

Carriers extracted from the second contact electrode 4A travel through the resistance layer 4B to the contact electrode 4C and then are taken out through the wiring pattern 3C.

FIG. 37(E) is a diagram illustrating the manufactured photodetector (adjacent center distance X=15 µm; type B).

In the photodetector unit of type B, the contact electrode 4A is arranged at the center of the light detection region, while the resistance layer 4B comprises a rotation region extending while rotating in one direction from the center. In any embodiment, a structure having a reverse rotation direction can be manufactured as a matter of course.

Parameters of the structure in this example are as follows:
Width of the wiring pattern 3C: W0=1.2 µm
Area of the light detection region: S=132 µm²
Width of the resistance layer 4B: W1=1.0 µm
Length (total length) of the resistance layer 4B: L1=55 µm
Resistance value of the resistance unit 4=420 kΩ

The contact electrode 4C is arranged at each intersection of the lattice-like wiring pattern 3C, so that the contact electrodes 4C are located at four positions on diagonal lines of the light detection region, while an intersection of the diagonal lines is a center (center of gravity) G of the light detection region (photodetector unit). The distance X between the centers G of the photodetector units 10 adjacent to each other is 15 µm.

The resistance layer 4B has three mildly bending corners, each having an outer edge with a center of curvature O located on the above-mentioned diagonal line passing the center G and a radius of curvature R of 2.0 µm, while the two chords extending from both ends of the arc of the outer edge toward the center of curvature O form an angle θ of 8° therebetween. For preventing electric fields from concentrating, the radius of curvature R and the angle θ are set to 2 to 5 µm and 8 to 23°, respectively.

Carriers extracted from the second contact electrode 4A travel through the resistance layer 4B to the contact electrode 4C and then are taken out through the wiring pattern 3C.

FIG. 37(F) is a diagram illustrating the manufactured photodetector (adjacent center distance X=10 µm). Since this photodetector unit 10 has a basic structure identical to that illustrated in FIG. 8, their same structures will not be explained, Parameters of the structure in this example are as follows:
Width of the wiring pattern 3C: W0=1.2 μm
Area of the light detection region: S=42 μm²
Width of the resistance layer 4B: W1=1.0 μm
Length (total length) of the resistance layer 4B: L1=29 μm
Resistance value of the resistance unit 4=700 kΩ

Carriers extracted from the second contact electrode 4A travel through the resistance layer 4B to the contact electrode 4C and then are taken out through the wiring pattern 3C in this structure as well, This example has a structure which can yield a sufficient resistance value, although the width W1 of the resistance layer 4B is smaller than the width W0 of the wiring pattern 3C, so that the resistance unit 4 is made finer.

Characteristics of photodiodes will now be explained.

Figure 38:
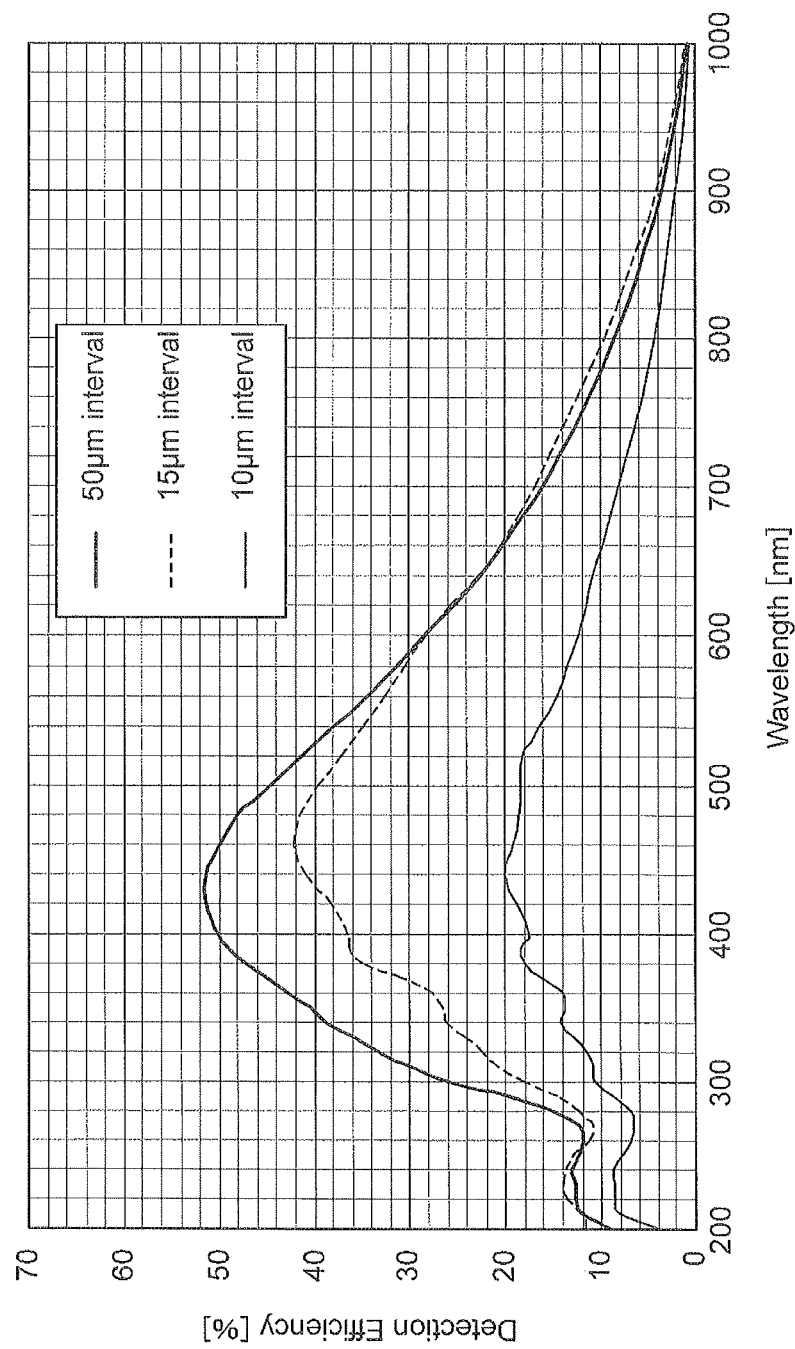
FIG. 38 is a graph illustrating the relationship between the wavelength (nm) of incident light and the photon detection efficiency (%)

FIG. 38 is a graph illustrating the relationship between the wavelength (nm) of incident light and the photon detection efficiency (%) in the above-mentioned photodiodes. This graph illustrates data for the structures of FIGS. 37(A), 37(D), and 37(F) (at intervals of 50 μm, 15 μm, and 10 μm, respectively). Their numbers of photodetector units included in one photodiode are 400, 4489, and 1000, respectively. A reverse-bias voltage of 74 V is applied to the photodiode, so as to make it operate in Geiger mode. Here, the breakdown voltage is 71 V.

In photon detection efficiency (PDE) (%), as the light detection region is larger, the area shadowed with the resistance layer becomes smaller, whereby higher detection efficiency is obtained. While the area of the light detection region when the distance between the adjacent light detection regions is 10 μm is about ⅕ that when the distance is 50 μm, the detection efficiency is kept at 30% thereof or higher. A relatively high detection efficiency is also kept in the case of 15 μm.

Their spectrum peak positions fall within the range of wavelength from 400 nm to 500 nm. Within this wavelength range (at least 400 nm but 500 nm or less), the detection efficiency is at least 44%, 36%, and 17% in the photodiodes at intervals of 50 μm, 15 μm, and 10 μm, respectively.

As Comparative Example 1, at the adjacent center interval X=50 μm, a first contact electrode was disposed at a position on the inside of the resistance layer in FIG. 37(A), and a ring-like wiring pattern (aluminum) having substantially the same form as that of the resistance layer 4B but with a slightly smaller size was formed from the first contact electrode. This ring-like wiring pattern (overhang electrode) is located on the contour of the semiconductor region 14 and functions to stabilize the level within the light detection region. When a resistive element (polysilicon: 160 kΩ) continuous with the ring-like pattern while having the same width therewith was formed as with the one illustrated in FIG. 37(A), its detection efficiency (%) was 28% at the minimum and 36% at the maximum within the range of wavelength from 400 nm to 500 nm. In the structure of Comparative Example 1, the position of the first contact electrode and the position at which the resistive element connects with the ring-like wiring pattern deviate from each other.

As Comparative Example 2, at the adjacent center interval X=15 μm in Comparative Example 1, a first contact electrode was disposed at a position on the inside of the resistance layer in FIG. 37(E), and a ring-like wiring pattern (aluminum) having substantially the same form as that of the resistance layer 4B but with a slightly smaller size was formed from the first contact electrode. This ring-like wiring pattern (overhang electrode) is located on the contour of the semiconductor region 14 and functions to stabilize the level within the light detection region. When a resistive element (polysilicon: 500 kΩ) continuous with the ring-like pattern while having the same width therewith was formed as with the one illustrated in FIG. 37(E), its detection efficiency (%) was 18% at the minimum and 26% at the maximum within the range of wavelength from 400 nm to 500 nm. In the structure of Comparative Example 2, the position of the first contact electrode and the position at which the resistive element connects with the ring-like wiring pattern deviate from each other.

Since the position of the first contact electrode and the position at which the resistive element connects with the ring-like wiring pattern deviate from each other, it is difficult for the interval X to become 10 μm or less from the viewpoint of the manufacturing process.

In the structures of Comparative Examples 1 and 2, all of the ring-like wiring pattern and the resistance units having a low light transmittance function as light-shielding elements which reduce the effective aperture ratio, thereby lowering light detection sensitivity. In the photodiode in accordance with this embodiment, on the other hand, the resistance layer 4B has a high light transmittance while achieving the same surface level stabilization function as with the ring-like wiring pattern without using additional resistive elements such as polysilicon, whereby the light detection sensitivity can be improved remarkably.

Next, influences of recovery time (voltage recovery time) were examined.

FIG. 39 is a graph illustrating the relationship between the output (in Geiger mode) from the above-mentioned photodiodes and time. It illustrates output images of an oscilloscope, in which the ordinate indicates the output intensity of the photodiodes with one grid interval in the ordinate corresponding to 50 mV, while one grid interval in the abscissa corresponding to 5 (ns). While this graph illustrates a plurality of data items having peak intensity voltages different from each other, they are caused by differences in the number of photons incident on the photodiode, so that the output intensity becomes higher as the number of photons is greater. In this graph, a bias voltage of 73 (V) is applied. Here, Vover=the bias voltage to the photodiode−the breakdown voltage of the photodiode falls within the range of Vover=1 (V) or greater but not more than 4 (V).

The recovery time (τ) of the output signal of the photodiode is defined by a period from a time at which the output from the photodetector unit 10 exhibits an intensity peak value when a photon is incident on the photodetector unit 10 to a time at which the output from the photodetector unit 10 becomes 37% of the intensity peak value.

In the case where the photodetector unit interval X=50 μm (FIG. 37(A)) (FIG. 39(A)), the recovery time (τ) is 13 ns when the bias voltage to the photodiode is 73 V.

In the case where the photodetector unit interval X=20 μm (FIG. 37(C)) (FIG. 39(B)), the recovery time (τ) is 5.0 ns when the bias voltage to the photodiode is 73 V.

In the case where the photodetector unit interval X=15 μm (type A: FIG. 39(D)) (FIG. 39(C)), the recovery time (τ) is 4.3 ns when the bias voltage to the photodiode is 73 V.

In the case where the photodetector unit interval X=10 μm (FIG. 37(F)) (FIG. 39(D)), the recovery time (τ) can be 2.3 ns or less when the bias voltage to the photodiode is 73 V.

The recovery time (τ) was 13 ns and 4.3 ns in the above-mentioned Comparative Examples 1 and 2, respectively.

More specifically, in the structure of Comparative Example 1 (the separation interval of the photodetector unit 10: X=50 μm), the aperture ratio is 60%, junction capacitance Cj=80 fF, gain=7.5×10$^5$, recovery time is 13 ns, pixel number density is 400/mm$^2$, and photon detection efficiency is 36% at the maximum.

In the structure of Comparative Example 2 (the separation interval of the photodetector unit 10: X=15 μm), the aperture ratio is 35%, junction capacitance Cj=11 fF, gain=2.0×10$^5$, recovery time is 4.3 ns, pixel number density is 4489/mm$^2$, and photon detection efficiency is 26% at the maximum.

When X=15 in the structure of the embodiment of FIGS. 7 and 8, the aperture ratio can be 60%, junction capacitance Cj=11 fF, gain=2.0×10$^5$, recovery time is 4.3 ns, and pixel number density is 4489/mm$^2$.

Thus, the structure of the embodiment can lower the junction capacitance Cj and shorten the recovery time while achieving the same aperture ratio as with Comparative Example 1. It also includes a large number of pixels per unit area and thus can improve the dynamic range.

As in the foregoing, the recovery time (τ) becomes remarkably short when the interval X between the second contact electrodes adjacent to each other (interval between the centers of light detection regions) is 20 μm or less. When the photodetector unit interval X=15 μm or less, the recovery time (τ) can be 10 ns or shorter. The recovery time (τ) can further be made shorter when the interval X is 10 μm or less. This is a remarkable improvement which has conventionally been unattainable.

The size (pixel size) of the photodetector unit 10 influences the pulse recovery time. As the pixel size is smaller, the dynamic range becomes wider. The number of cells in a square chip of 1 mm×1 mm is 400, 2500, 4489, and 10000 when the pixel size is 50 μm, 20 μm, 15 μm, and 10 μm, respectively. The pixel size can be selected according to required resolution and dynamic range. When the pixel size is 50 μm, 20 μm, 15 μm, and 10 μm, the gain at the operation voltage can be 7.5×10$^5$, 2.4×10$^5$, 2.0×10$^5$, and 1.0×10$^5$, and the light detection efficiency (PDE) can be 51%, 43%, 38%, and 19%, respectively.

For application to the X-ray CT system, the semiconductor chip size or the size of an active channel (a region where a plurality of photodetector units electrically separated from adjacent elements assemble) is preferably on the order of 1×1 mm from the viewpoint of position resolution (resolution). When X-rays at 10 to 140 keV/mm$^2$ are to be energy-resolved, a wide dynamic range is required. The number of pixels is preferably on the order of 4500 to 10000. According to the above explanation, the photodetector unit intervals X=10 μm, 15 μm, 20 μm, 25 μm, 50 μm (X=10 to 50 μm) are shown in FIG. 37.

For application to the PET system, the pixel size is preferably about 3×3 mm in connection with detection of the center of gravity, and about 3600 pixels are sufficient for receiving light emitted from the scintillator. For reducing readout of ASIC, a large-area chip of about 6×6 mm can also be employed. For high time resolution and high detection efficiency, a large pixel pitch of 50 μm or more is preferred.

When a through electrode is used in the above-mentioned structure, a dead space extending along the semiconductor chip outer edge has a uniform width. This can also homogenize the gap between channels when semiconductor chips are arranged two-dimensionally and further facilitate alignment when securing the scintillator onto the light-receiving surface.

As mentioned above, the photodiode array in accordance with this embodiment utilizes a high transmittance of a metal thin-film resistance and forms an overhang structure from a linearly patterned metal thin-film resistance instead of the overhang electrodes used in Comparative Examples 1 and 2, thereby reducing dead spaces. While the structures illustrated in FIGS. 37(B) to 37(F) cannot let the resistance layer 4B cover a part (at a right corner position) of the contour (edge) of the semiconductor region 14 in order to attain a desirable resistance value, this part is only about the width of the resistance layer 4B, whereby its resulting deterioration in characteristics is less likely to affect surface level stabilization. The structure illustrated in FIG. 37(A) covers the whole contour (edge) of the semiconductor region 14.

Figure 40:
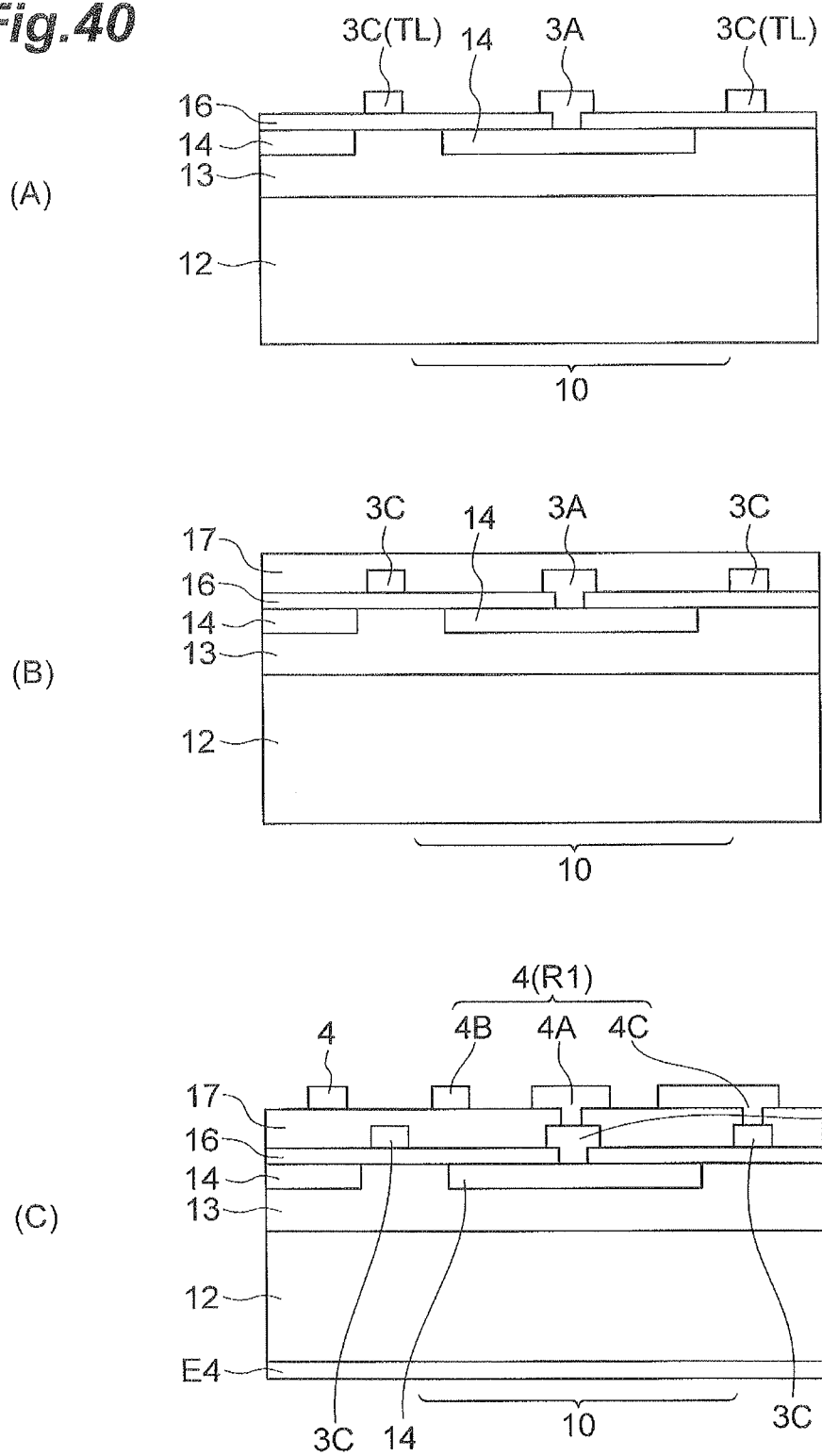
FIG. 40 is a diagram for explaining a method of manufacturing a photodiode.

FIG. 40 is a diagram for explaining a method of manufacturing the photodiode array illustrated in FIGS. 34 and 35.

First, as illustrated in FIG. 40(A), the semiconductor region 13 is formed on the semiconductor region (semiconductor substrate) 12 by epitaxial growth or impurity diffusion or ion implantation. While the semiconductor region 12 is a (100) Si semiconductor substrate formed by CZ method or FZ method, semiconductor substrates having other orientations can also be used. When Si epitaxial growth is employed, vapor-phase silicon tetrachloride (SiCl$_4$) and trichlorosilane (SiHCl$_3$) are used as raw materials, for example, and these gases are caused to flow over the substrate surface at a growth temperature of 1200° C. In the case of impurity diffusion, impurities corresponding to the conduction type of the semiconductor region 13 are caused to diffuse as a gas or solid into the semiconductor region 12. In the case of ion implantation, impurities corresponding to the conduction type of the semiconductor region 13 are ion-implanted into the semiconductor region 12.

Subsequently, the semiconductor region 14 is formed on a region on the front face side of the semiconductor region 13. For this, impurity diffusion or ion implantation can be used. When diborane (B$_2$H$_6$) is used as a raw material for impurities in the diffusion, the diffusion temperature can be set at 1200° C., for example. When forming the semiconductor region 14, a resist pattern having an opening is formed on the semiconductor region 13 by a lithography technique at first and then is used as a mask for adding the impurities. The lattice-like wiring pattern 3C may be formed and then used as a mask for adding impurities by ion implantation through the insulating layer 16.

Next, the insulating layer 16 is formed on the semiconductor substrate. The insulating layer 16 can be formed by using Si thermal oxidation. The oxidation temperature is 1000° C., for example. This oxidizes the front faces of the semiconductor regions 13, 14, thereby forming the insulating layer 16 made of SiO$_2$. CVD can also be used for forming the insulating layer 16.

Subsequently, a contact hole is formed in the insulating layer 16 at a position on the semiconductor region 14. When forming the contact hole, a resist pattern having an opening is formed on the insulating layer 16 by a photolithography technique at first and then is used as a mask for etching the insulating layer 16. As the etching method, not only dry etching, but wet etching with an etchant including an aqueous HF solution can also be used.

Next, the contact electrode 3A and wiring pattern 3C are formed on the insulating layer 16 by vapor deposition. When forming them, a predetermined resist pattern is formed on the insulating layer 16 by a photolithography technique at first and then is used as a mask for vapor-depositing an electrode material on the insulating layer 16. Here, sputtering may be used in place of vapor deposition.

The common electrode E3 is also formed on the insulating layer 16 by the same method as with the wiring pattern 3C concurrently therewith.

Subsequently, as illustrated in FIG. 40(B), the insulating layer 17 is formed on the insulating layer 16. The insulating layer 17 can be formed by using sputtering or plasma CVD. When using the plasma CVD, the insulating layer 17 is grown while using tetraethoxysilane (TEOS) and oxygen gas as raw material gases and setting the growth temperature at about 200° C. The thickness of the insulating layer 17 is preferably set such as to flatten its front face and is preferably greater than the height from the front face of the insulating layer 16 to the upper face of the wiring pattern 3C.

Next, as illustrated in FIG. 40(C), the resistance unit 4 is formed on the insulating layer 17. In its formation, a predetermined resist pattern is formed on the insulating layer 17 by a photolithography technique at first and then is used as a mask for depositing a resistive material on the insulating layer 17 by sputtering or vapor deposition. When the resistive element is constituted by SiCr, sputtering may be employed, while using SiCr in which the composition ratio of Si/Cr is 70%/30%, for example, as a target material and setting its thickness to 3 to 50 nm.

Figure 30:
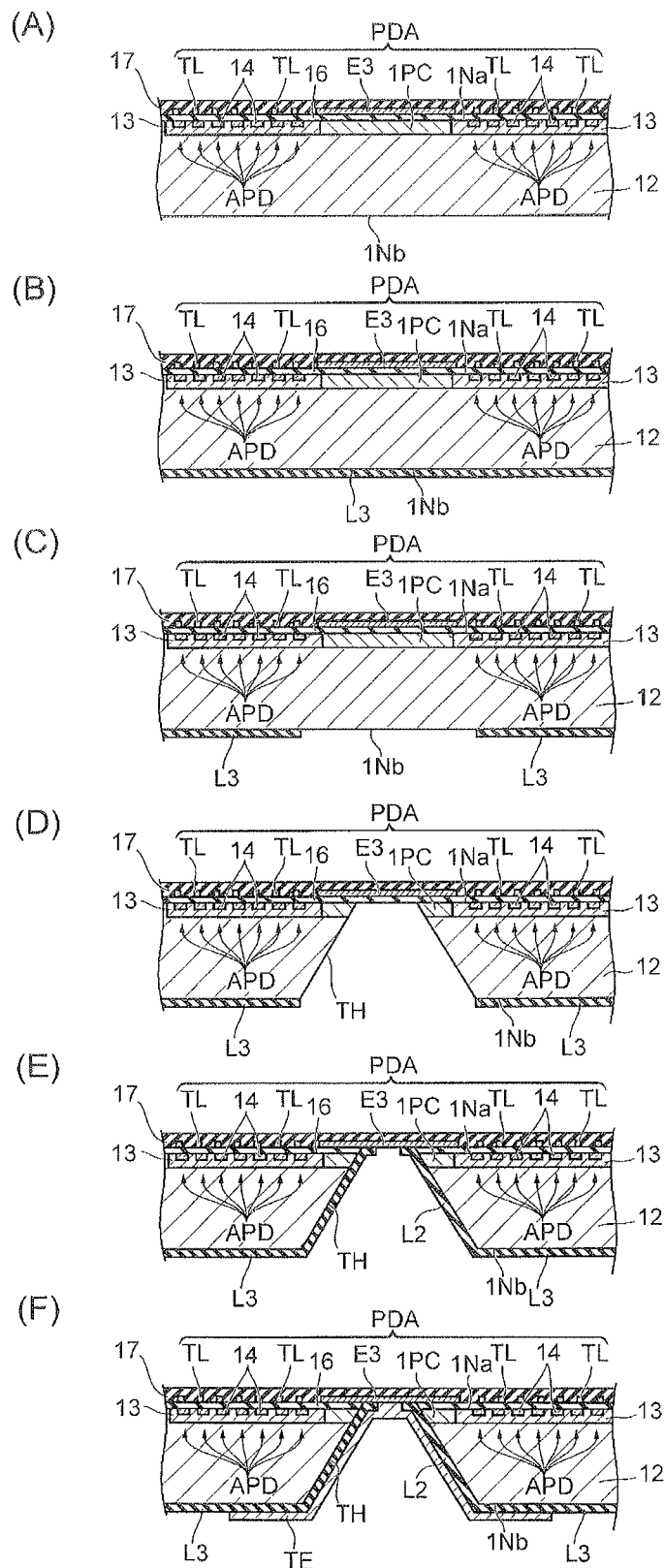
FIG. 30 is a diagram for explaining a method of manufacturing a detector.
Figure 31:
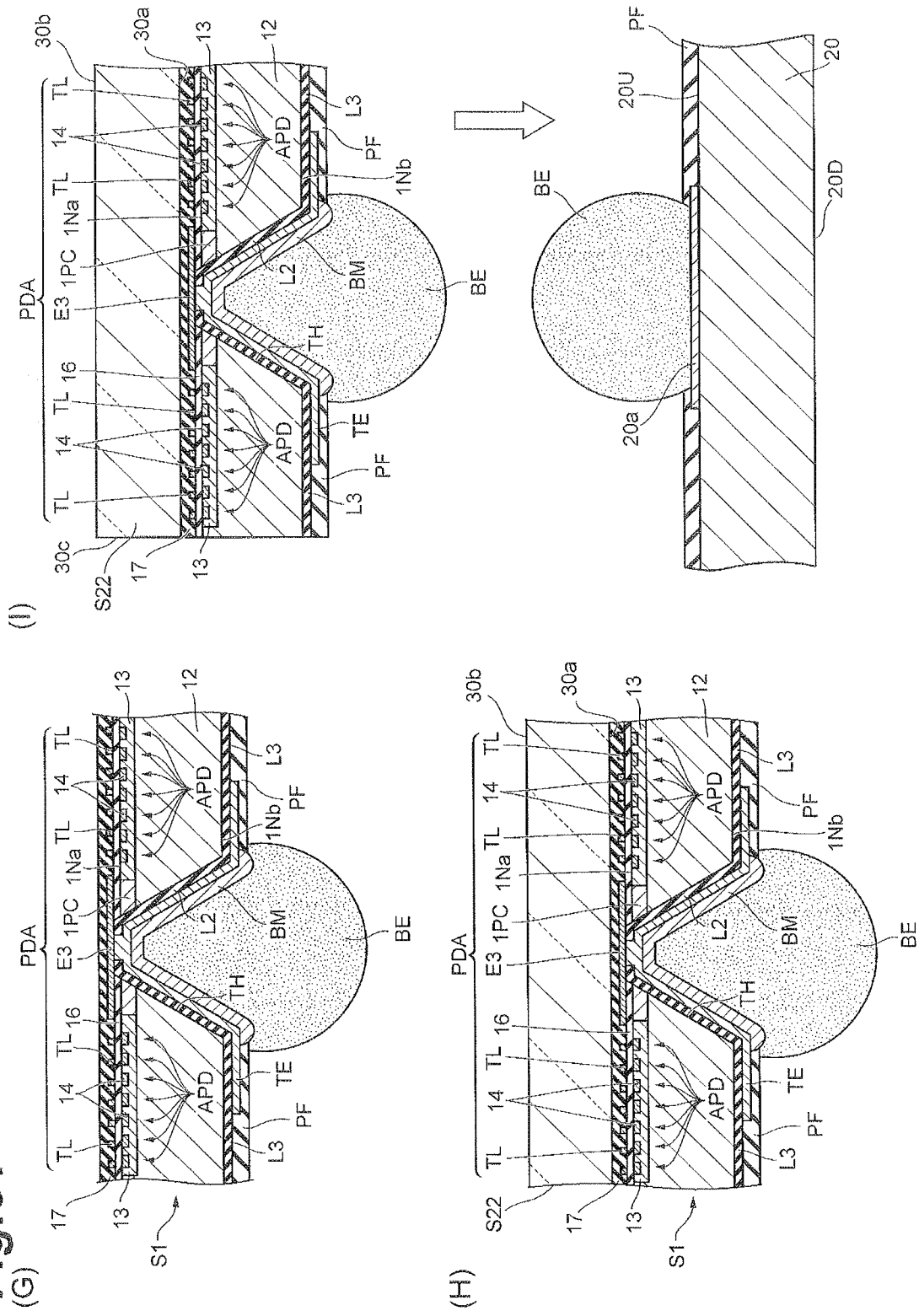
FIG. 31 is a diagram for explaining a method of manufacturing the detector.

After the completion of the foregoing steps, in the same process as with FIGS. 30 and 31, a through hole is formed from the rear face of the semiconductor substrate, the surface of the through hole is covered with an insulating layer, then a through electrode to be connected to the common electrode E3 is formed, and a bump electrode is brought into contact with the through electrode. Finally, as in the above-mentioned steps, the first and second bump electrodes are formed on the rear face of the semiconductor substrate and are bonded to the wiring board through the bump electrode.

When manufacturing the photodetector unit having the structure illustrated in FIG. 41, the semiconductor region 15 is preferably formed on the front face side of the semiconductor region by using impurity diffusion or ion implantation before forming the semiconductor region 14. In the case of impurity diffusion, impurities corresponding to the conduction type of the semiconductor region 15 are diffused as a gas or solid into the semiconductor region 13. In the case of ion implantation, impurities corresponding to the conduction type of the semiconductor region 15 are ion-implanted into the semiconductor region 13.

In the above-mentioned plurality of semiconductor chips of FIG. 34 and thereafter, a glass sheet or resin bonding layer is disposed on the semiconductor chip, and the scintillator is arranged thereon, so as to form the detector chip.

The detector explained in FIGS. 34 to 42 comprises the first contact electrode 3A in contact with the second semiconductor region 14 and the second contact electrode 4A, arranged at such a position as to overlap the first contact electrode 3A while in contact with the first contact electrode 3A, including a material different from that of the first contact electrode 3A, while the quenching resistance R1 (resistance unit 4 (resistance layer 4B)) is continuous with the second contact electrode. 4A. Carriers generated at the p-n junction by photons incident thereon flow to the quenching resistance R1 through the first and second contact electrodes 3A, 4A and reach the wiring board 20 through the readout line TL, common electrode E3, through electrode TE, and first bump electrode BE (FIGS. 14 and 20) connected to the quenching resistance.

Arranging the second contact electrode 4A at such a position as to overlap the first contact electrode 3A can minimize the space required for connecting the quenching resistance and the first contact electrode 3A to each other. Inevitably, the first and second contact electrodes 3A, 4A are not flush with each other and have positions in the height direction different from each other, whereby the quenching resistance continuously extends from the second contact electrode 4A. This can save wiring within the photodetector unit 10, thereby remarkably increasing the aperture ratio of the photodetector unit.

The second contact electrode 4A and quenching resistance comprise SiCr. SiCr has such a high light transmittance that, even when the quenching resistance exists within the photodetector unit 10, incident photons pass through the quenching resistance, whereby the effective aperture ratio can be increased.

The form of the resistance layer 4B in planar view, which is a ring or a partial ring or a spiral in the above-mentioned embodiment, may also be a meandering form like square waves, triangular waves, or sine waves.

Effects of the photodiode array in accordance with the embodiment will further be explained.

When causing the photodiode array to operate in Geiger mode, the recovery time (voltage recovery time) $\tau$ in the case where a photon is incident on one photodetector unit 10 depends on the product (RC constant=Cj×Rq) of the junction capacitance (pixel capacitance) Cj, which is defined by the area of the light detection region in the photodetector unit 10 and the depletion layer width extending from the p-n junction, and the resistance value of the resistance unit 4 (quenching resistance value Rq).

As the pixel size (the area of the photodetector unit) decreases, the junction capacitance Cj becomes smaller, thereby making it necessary to increase the quenching resistance value Rq for obtaining the same recovery time $\tau$, i.e., the same RC constant. The quenching resistance value Rq can be determined by adjusting the resistivity, thickness, width, and length. Since the resistivity, width, and thickness are restricted by process conditions, it is reasonable to adjust the resistance value Rq by changing the length. For obtaining the same recovery time $\tau$, the resistance layer 4B is set shorter and longer as the pixel size is larger and smaller, respectively.

When the RC constant is too small, quenching after the occurrence of avalanche multiplication becomes insufficient, whereby a phenomenon known as a latching current occurs, thus failing to exhibit normal operations. When the RC constant is too large, on the other hand, the recovery time (voltage recovery time) becomes longer. Therefore, the RC constant is set to an optimal value (2 to 20 ns) for the device.

The gain, which depends on the junction capacitance Cj and the applied voltage, is lowered by reducing the junction capacitance Cj in the structure of the embodiment. Noise components of the photodiode array include not only dark pulses, but after-pulses and optical-crosstalk-derived pseudo-output signals as well. The after-pulses are pulses which are generated when a part of electrons/holes generated by avalanche multiplication are trapped by an impurity level and the like and then, after a given time interval, released so as to cause avalanche multiplication again. The optical crosstalk is caused by pulses occurring when photons generated at a low probability during avalanche multiplication enter an adjacent pixel and are absorbed thereby so as to produce an electrode/hole pair which brings about avalanche multiplication. Each of them is a noise component by which an output for one photon yields a plurality of pulses instead of one pulse.

As in the structure of the embodiment, when the junction capacity Cj, i.e., the gain, is smaller, the total number of electron/hole pairs generated by avalanche multiplication decreases, thereby lowering the probability of after-pulses and optical-crosstalk-derived pulses occurring, thus yielding a noise reduction effect.

As the device has greater junction capacitance Cj and higher gain, it takes a longer time to sweep out generated carriers, thereby elongating the voltage recovery time; whereas the voltage recovery time becomes shorter as the gain is lower. Making the pixel pitch smaller as in this embodiment can reduce the voltage recovery time, thereby improving the photon count rate.

An example in which the readout line has a two-layer structure will now be explained.

Figure 43:
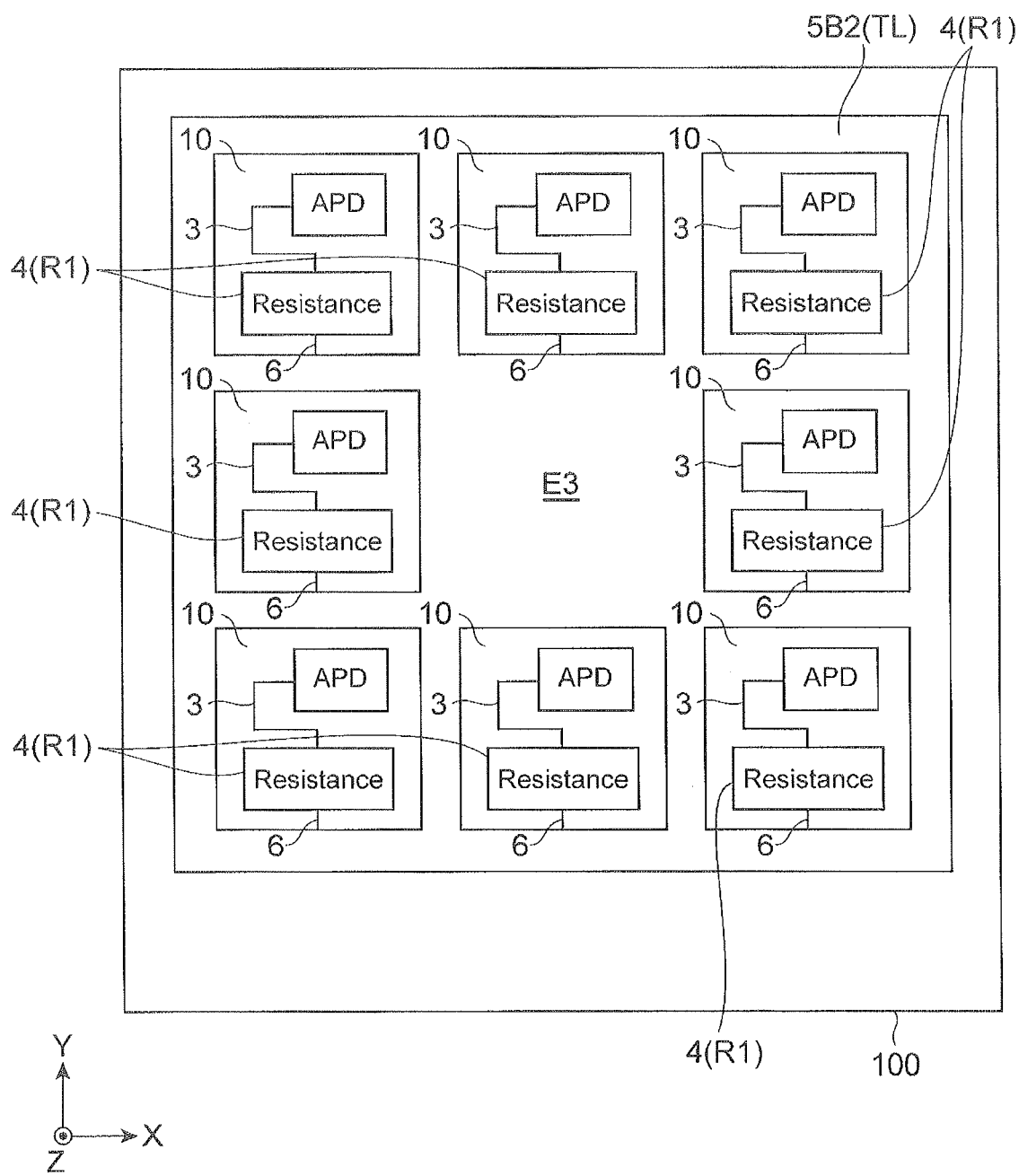
FIG. 43 is a plan view of a photodiode array.

FIG. 43 is a plan view of a photodiode array.

This photodiode array comprises a semiconductor substrate 100 having a plurality of photodetector units 10. The photodiode array comprises a light-receiving region in which the photodetector units 10 are arranged two-dimensionally and a common electrode E3 disposed in a region surrounded by the photodetector units 10 of the semiconductor substrate 100. Signals from photodiodes APD are read out through the common electrode E3. Each photodiode in this embodiment is an avalanche photodiode (APD) which operates in Geiger mode. In this drawing, the photodetector units 10 are arranged in a matrix along the X and Y axes. The thickness direction of the semiconductor substrate 100 is the Z direction, while the X, Y, and Z axes constitute an orthogonal coordinate system. While three rows and three columns of photodetector units 10 are arranged in FIG. 43, so as to constitute the light-receiving region, the photodetector units 10 may have a greater or smaller number and may also be constructed one-dimensionally. The common electrode E3 is arranged at the center of the plurality of photodetector units 10.

Each photodetector unit 10 comprises an APD, a connection electrode 3, a quenching resistance 4, and a connection line 6. One end of the APD is connected to the connection electrode 3, which is connected through the quenching resistance 4 and connection line 6 in sequence to a readout line (wiring pattern) 5B2 serving as the above-mentioned readout line TL. The readout line 5B2 is located between the APDs adjacent to each other and exists at a boundary position between the photodetector units 10.

The readout line 5B2 constitutes a lattice-like pattern, while one photodetector unit 10 is arranged in one opening pattern. Patterns having various forms can be employed for the readout line 5B2. A plurality of photodetector units 10 may be arranged within one opening in the pattern of the readout line 5B2. One or a plurality of rows of photodetector units 10 may be arranged within one opening pattern.

When a photon is incident on one photodetector unit 10, a carrier occurs in the APD and travels through the quenching resistance 4, connection line 6, and readout line 5B2 (connection line 5B) in sequence, so as to reach the common electrode E3. Therefore, each time a photon is incident on the photodiode array, the common electrode E3 outputs a pulse signal. When photons are incident on a plurality of APDs at the same time, a signal from the APD located at a position farther from the common electrode E3 arrives at the common electrode E3 later than a signal from the APD located at a closer position. That is, the signal transmission time varies depending on the position of the APD.

The photodiode array can be considered to have better characteristics as the signal transmission time from each APD is shorter, the signal transmission time varies less within a plane, and the output signal is greater. The former two characteristics can be improved by lowering the time constant in the signal transmission path. This is because lowering the time constant raises the signal transmission speed and reduces its differences among the photodiodes. Increasing the width of the readout line lowers the time constant. On the other hand, while the remaining characteristic can be improved by raising the aperture ratio in each photodiode, the aperture ratio decreases when increasing the width of the readout line in general. Therefore, the photodiode array of this embodiment arranges the readout line 5B2 on the upper layer side of a surface electrode 3B which is a main part of the connection electrode 3, so as to produce a structure in which the aperture ratio does not decrease even when the readout line is made wider.

Figure 44:
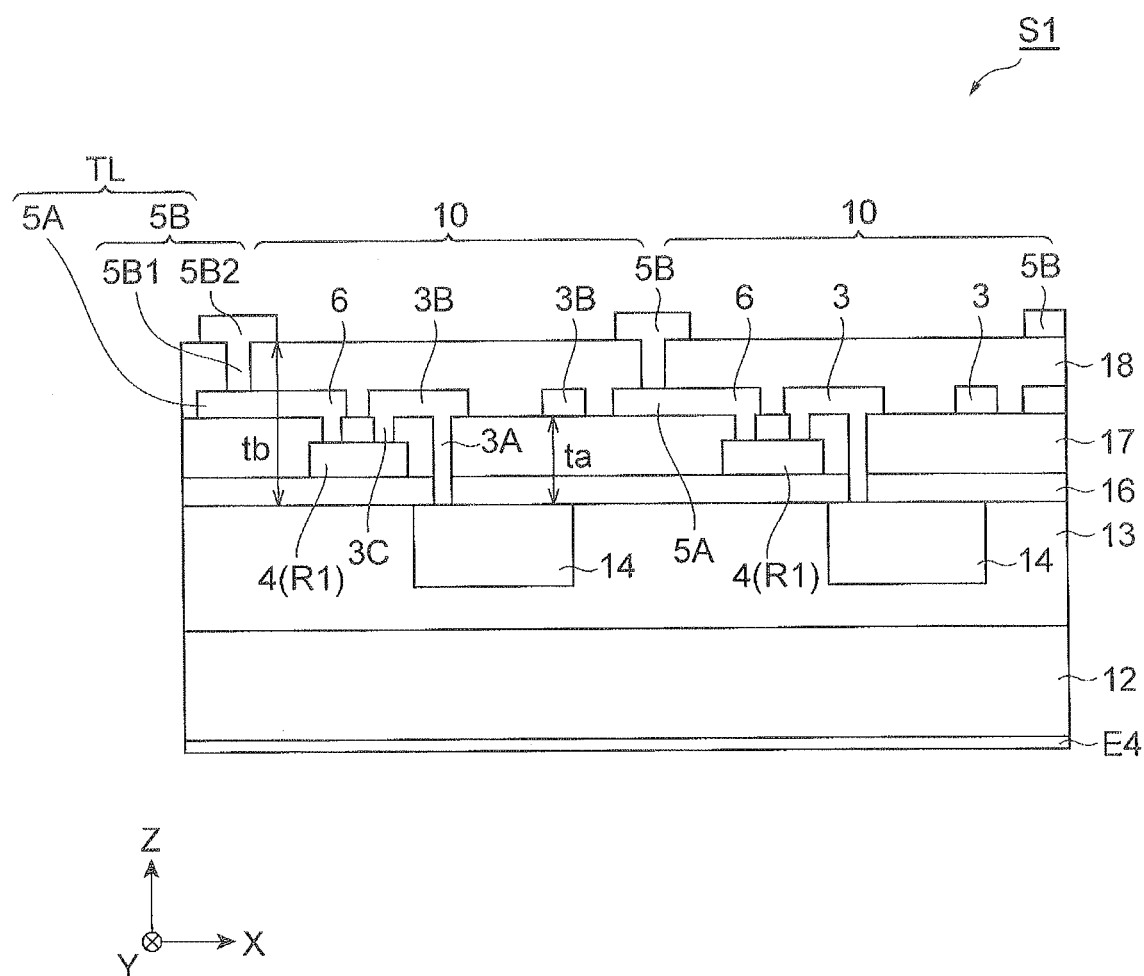
FIG. 44 is a sectional view of the photodiode array.
Figure 45:
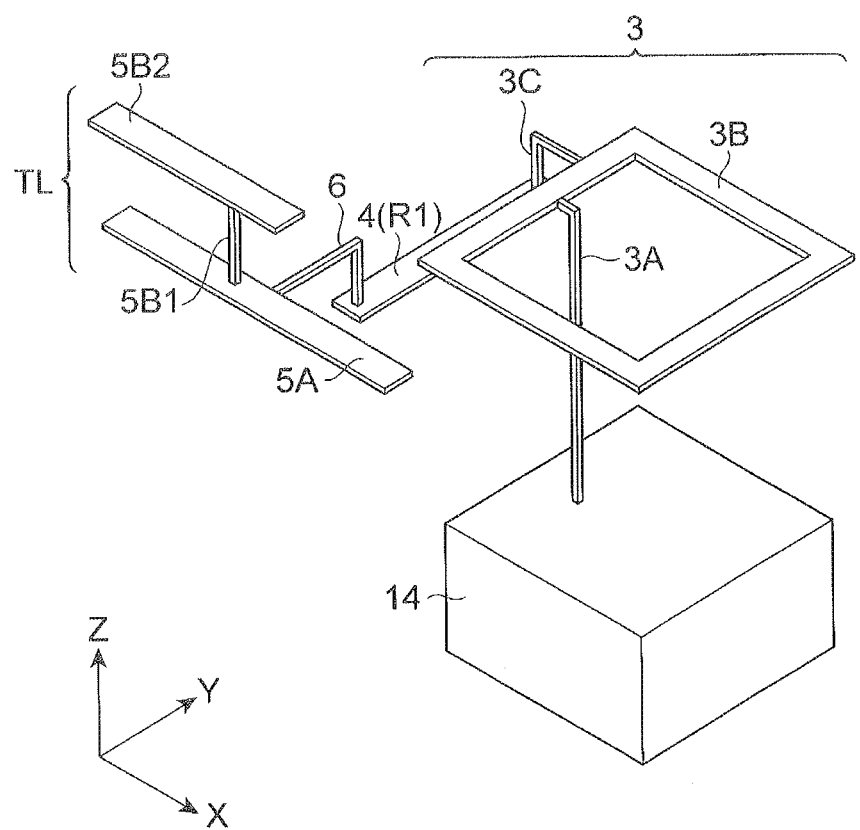

FIG. 44 is a sectional view of the photodiode array, while FIG. 45 is a diagram illustrating the relationship of connections among electrodes, lines, and the like, As illustrated in FIG. 44, each photodetector unit 10 comprises a first conduction type (n-type) first semiconductor region (layer) 12 and a second conduction type (p-type) second semiconductor region (semiconductor layer 13 and high impurity concentration region 14) adapted to construct a p-n junction with the first semiconductor region 12, while they constitute a semiconductor substrate. Since carriers occur at their p-n junction, the semiconductor region 14 or a region directly thereunder functions as a photosensitive region, thereby outputting carriers. When the p-type semiconductor is provided with a potential lower than that of the n-type semiconductor, a reverse-bias voltage is applied to the photodiode. Carriers relatively attracted to the negative potential are positive holes, whereas those relatively attracted to the positive potential are electrons. When the reverse-bias voltage is higher than the breakdown voltage of the APD, the APD operates in Geiger mode. The bias voltage is applied between the common electrode E3 and a rear-face electrode E4 which is provided when necessary on the rear face of the semiconductor substrate (first semiconductor region 12).

The first contact electrode 3A (see FIG. 45) is in contact with the high impurity concentration region (semiconductor region) 14 in the second semiconductor region. The high impurity concentration region 14 is a diffusion region (semiconductor region) formed by diffusing impurities into the semiconductor layer 13 and has a impurity concentration higher than that in the semiconductor layer 13. In this example (type 1), the p-type semiconductor layer 13 is formed on the n-type first semiconductor region 12, while the p-type high impurity concentration region 14 is formed on the front face side of the semiconductor layer 13. Therefore, the p-n junction constituting the photodiode is formed between the first semiconductor region 12 and semiconductor layer 13.

As a layer structure of the semiconductor substrate, one having reversed the above-mentioned conduction types may also be employed. That is, the structure of type 2 is produced by forming the n-type semiconductor layer 13 on the p-type first semiconductor region 12 and forming the n-type high impurity concentration region 14 on the front face side of the semiconductor layer 13.

The p-n junction interface may also be formed on the surface layer side. The structure of type 3 in this case is one in which the n-type semiconductor layer 13 is formed on the n-type first semiconductor region 12, while the p-type high impurity concentration region 14 is formed on the front face side of the semiconductor layer 13. In this structure, the p-n junction is formed at the boundary between the semiconductor layer 13 and semiconductor region 14.

The conduction types may also be reversed in such a structure. That is, the structure of type 4 is one in which the p-type semiconductor layer 13 is formed on the p-type first semiconductor region 12, while the n-type high impurity concentration region 14 is formed on the front face side of the semiconductor layer 13.

As illustrated in FIG. 45, the first contact electrode 3A is in contact with the semiconductor region 14, while the ring-like electrode 3B is continuous with the first contact electrode and connected through the second contact electrode 3C to the quenching resistance (resistance layer) 4. That is, the connection electrode 3 constituted by the first contact electrode 3A, ring-like surface electrode 3B, and second contact electrode 3C electrically connects the semiconductor region 4 and one end of the quenching resistance 4 to each other.

As illustrated in FIG. 44, the first insulating layer 16 is formed on the semiconductor regions 13, 14, while the quenching resistance 4 is formed on the first insulating layer 16. The second insulating layer 17 is formed so as to cover the quenching resistance and first insulating layer 16. The first insulating layers 16, 17 are formed with a contact hole through which the first contact electrode 3A (FIG. 45) penetrates, while the second insulating layer 17 is also formed with a contact hole through which the second contact electrode 3C (FIG. 45) penetrates. The connection line 6 is in contact with and electrically connected to the other end of the quenching resistance 4. The connection line 6 is constituted by a contact electrode penetrating through a contact hole provided in the second insulating layer 17 and a connection part routed over the second insulating layer 17, while the connection part is continuous with an auxiliary readout line (lower readout line) 5A.

A third insulating layer 18 is formed on the auxiliary readout line 5A, surface electrode 3B, and second insulating layer. The first to third insulating layers 16, 17, 18 are made of a highly heat-resistant inorganic insulator such as SiO$_2$ and silicon nitride (SiNx). The readout line 5B2 is formed on the third insulating layer 18. As illustrated in FIG. 45, the connection line 5B is constituted by a contact electrode 5B1 penetrating through the contact hole provided in the third insulating layer 18 and the readout line 5B2, continuous with the contact electrode 5B1, located on the third insulating layer 18. In the example illustrated in FIG. 45, the auxiliary readout line 5A and readout line 5B2 are arranged in parallel with each other while being separated from each other in the thickness direction, each having a trailing end electrically connected to the common electrode E3.

Figure 74:
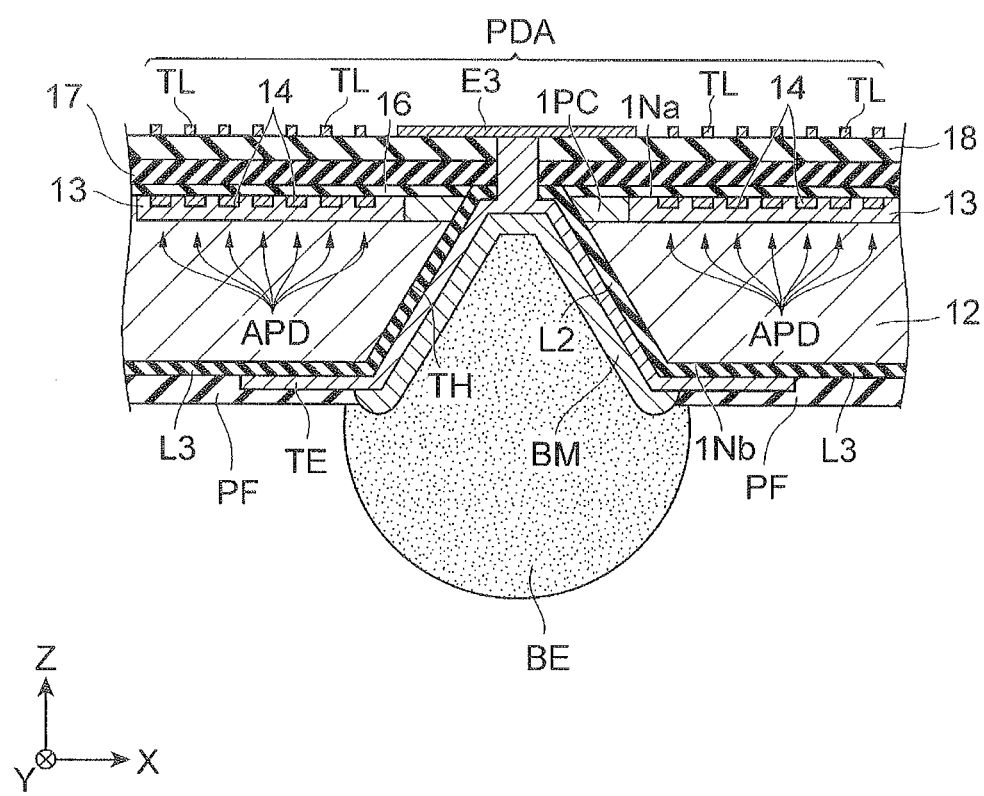
FIG. 74 is a sectional view of the part in the vicinity of the common electrode.
Figure 75:
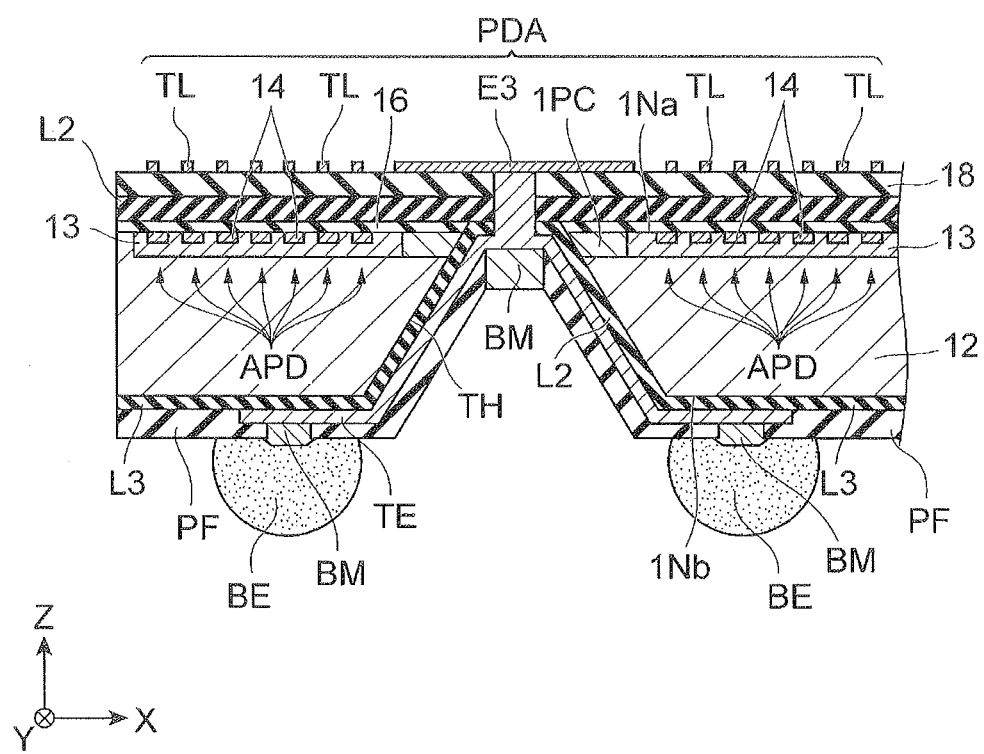
FIG. 75 is a sectional view of the part in the vicinity of the common electrode.

As illustrated in FIGS. 74 and 75 so as to correspond to FIG. 14 or 20, the cross-sectional structure in the vicinity of the common electrode E3 is the same as that of FIGS. 14 and 15 except that the insulating layer 18 is formed on the insulating layer 17, the common electrode E3 and readout line 5B2 (TL) are formed on the insulating layer 18, and the through hole TH removes the insulating layers 16, 17, 18 at its corresponding locations until it reaches the rear face of the common electrode E3. A glass sheet, a bonding layer, and an insulator such as a resin are arranged on such a semiconductor chip as mentioned above, and a scintillator is bonded thereon.

The common electrode E3 may be formed on the second insulating layer 17; in this case, located on a region devoid of the third insulating layer 18 at the trailing end of the readout line 5B2 is the common electrode E3, to which the auxiliary readout line 5A and readout line 5B2 are connected. When the common electrode E3 is formed on the third insulating layer 18, the readout line 5B2 is connected to the common electrode E3, while the auxiliary readout line 5A is connected to the common electrode E3 at the trailing end of the auxiliary readout line 5A through the contact hole provided in the third insulating layer 18.

The ring-like surface electrode 3B is located on the second insulating layer 17 and disposed along the outer edge of the semiconductor region 14 as seen in the Z direction. The surface electrode 3B improves the stability of photodiode output by generating a fixed electric field in the outer edge of the semiconductor region 14 (the boundary with the semiconductor region 13).

Here, letting a plane including the front face of the semiconductor region 14 be a reference plane (XY plane) in FIG. 44, the distance tb from the reference plane to the readout line 5B2 is greater than the distance ta from the reference plane to the surface electrode 3B. This is because the third insulating layer 18 is interposed between the readout line 5B2 and second insulating layer 17. This structure can increase the degree of freedom in designing the width of the readout line 5B2 without reducing the aperture ratio of the photodiode. This can increase the width of the readout line 5B2, so as to lower its resistance value per unit length, and decrease its parasitic capacitance, thereby improving the signal transmission speed.

The APD is constituted by the semiconductor region 14 and a region directly under the semiconductor region 14 and includes the semiconductor regions 13, 12. The readout line 5B2 is formed in a region between the semiconductor regions 14 (APDs). Even when the width of the readout line 5B2 is increased, the aperture ratio does not decrease until the readout line 5B2 covers the exposed region of the semiconductor region 14, whereby the signal output can be made greater.

As explained in the foregoing, the above-mentioned photodiode array is one comprising a plurality of photodetector units 10 each having an APD operating in Geiger mode, each photodetector unit 10 comprising the APD having the semiconductor region 14 for outputting carriers, the surface electrode 3B, electrically connected to the semiconductor region 14, surrounding the semiconductor region 14 along its outer edge, and the quenching resistance 4 connecting the surface electrode 3B and readout line 5B2 to each other. Letting a plane including the front face of the semiconductor region 14 be a reference plane, the distance tb from the reference plane to the readout line 5B2 is greater than the distance ta from the reference plane to the surface electrode 3B, while the readout line 5B2 is located between the APDs adjacent to each other. This photodiode array can improve characteristics such as signal readout speed.

The surface electrode 3B, which is formed into a ring in the above, may be cut partly. The quenching resistance 4, which extends linearly in the above, may have various forms.

Figure 46:
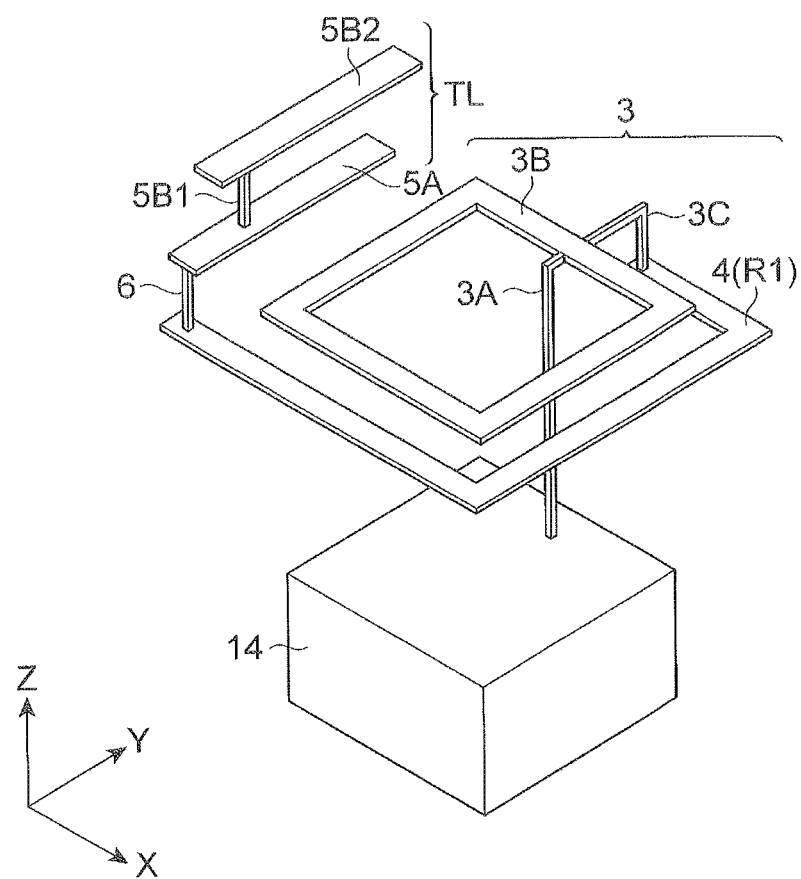

FIG. 46 is a diagram illustrating the relationship of connections among electrodes, lines, and the like.

The quenching resistance 4 of this example extends so as to surround the outside of the surface electrode 3B and is formed into a ring which is cut in the middle. One end of the quenching resistance 4 is electrically connected to the semiconductor region 14 through the connection electrode 3. The other end of the quenching resistance 4 is connected through the connection line 6 to the auxiliary readout line 5A, which is electrically connected to the readout line 5B2 through the contact electrode 5B1. This example has a structure which elongates the quenching resistance 4, so as to enable it to increase its resistance value, while the vertical cross-sectional structure along the carrier transmission path is the same as the one illustrated in FIG. 44 except that the connection line 6 is directly connected to the lower face of the auxiliary readout line 5A without having horizontally extending parts.

Various examples of structures of the readout line 5B and auxiliary readout line 5A will now be explained.

First Example

Figure 47:
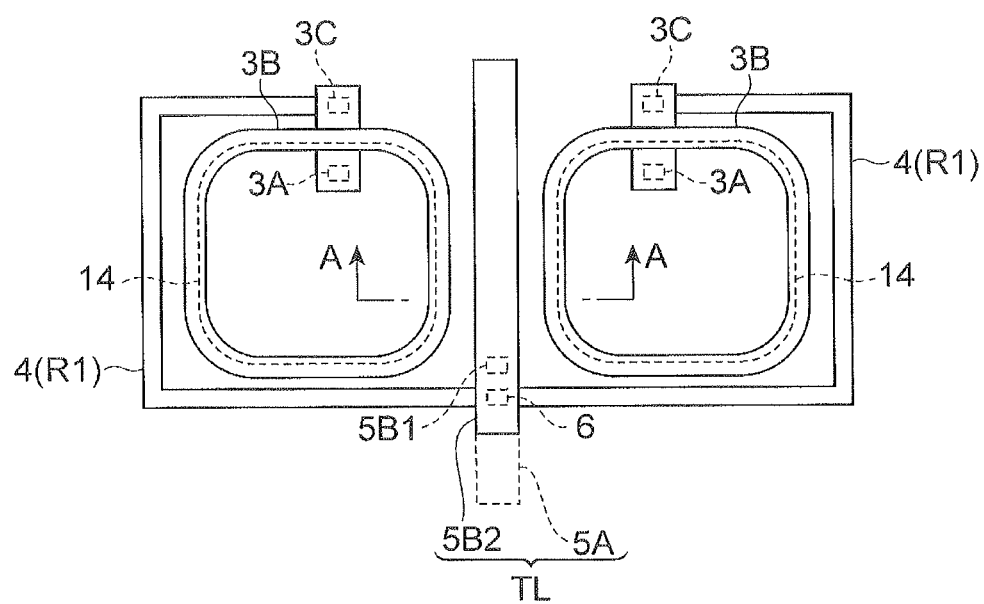
FIG. 47 is a partial plan view of a photodiode array (first example)
Figure 48:
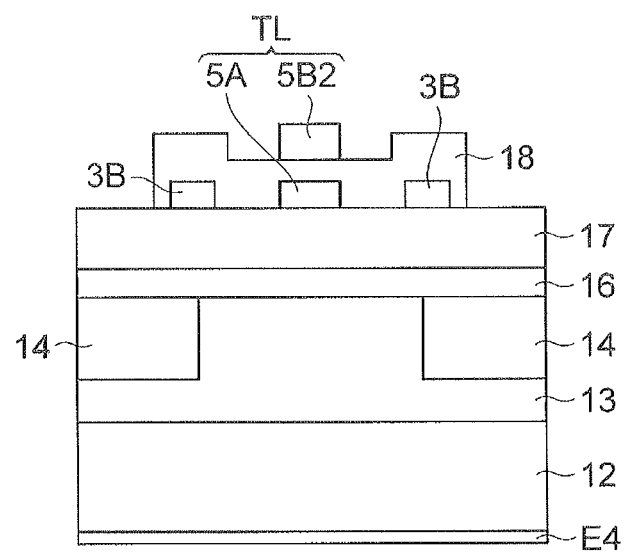
FIG. 48 is a sectional view of the photodiode array (first example) taken along the arrowed line A-A.

FIG. 47 is a partial plan view of a photodiode array (first example), while FIG. 48 is a sectional view of the photodiode array (first example) taken along the arrowed line A-A of FIG. 47.

The structure of the first example is a case where, in the structure illustrated in FIG. 46, the readout line 5B2 extends between the semiconductor regions 14 adjacent to each other, while the width of the readout line 5B2 is smaller than the distance of separation between the surface electrodes 3B adjacent to each other. The auxiliary readout line 5A and readout line 5B2 have the same width and extend in parallel with each other. When the third insulating layer 18 is not sufficiently thick or not subjected to surface polishing, the front face of the third insulating layer 18 becomes irregular because of the form of the surface electrode 3B thereunder as illustrated in FIG. 48. While the front face of the third insulating layer also deforms irregularly because of the form of the auxiliary readout line 5A as a matter of course, FIG. 48 does not illustrate such deformation.

Since the two readout lines 5A, 5B2 are provided alongside each other, this example can reduce the wiring resistance, so as to lower the time constant, thereby improving the signal readout speed.

Second Example

Figure 49:
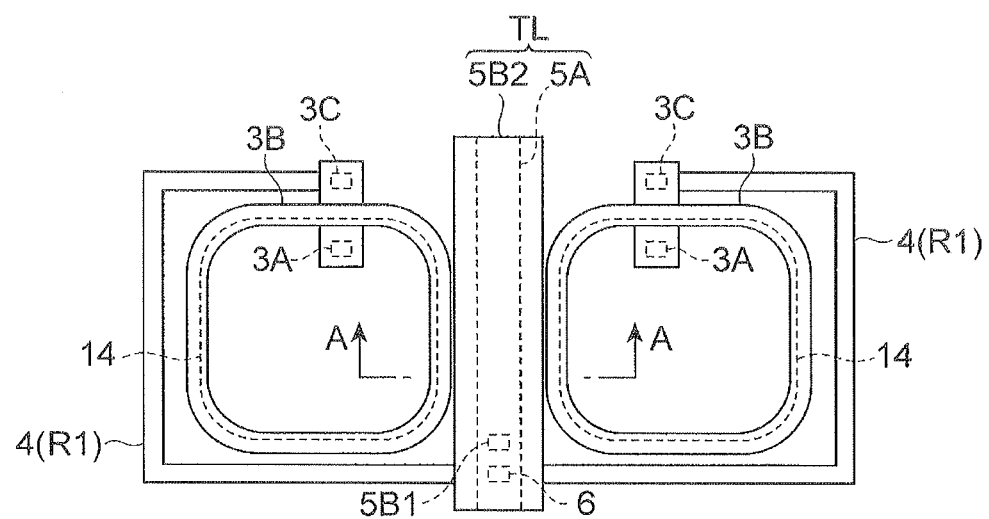
FIG. 49 is a partial plan view of a photodiode array (second example)
Figure 50:
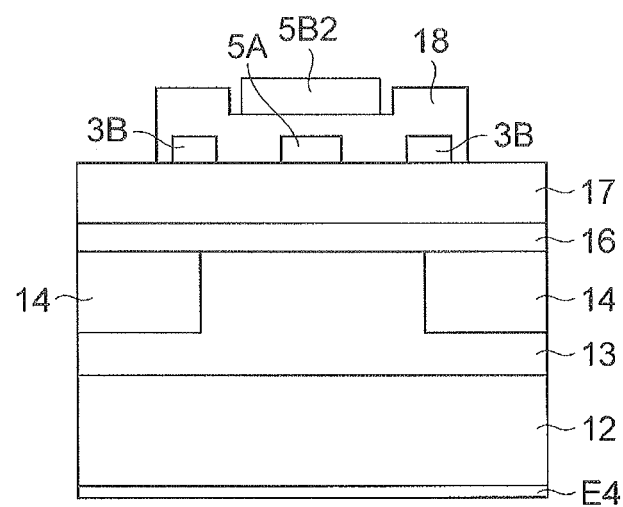
FIG. 50 is a sectional view of the photodiode array (second example) taken along the arrowed line A-A.

FIG. 49 is a partial plan view of a photodiode array (second example), while FIG. 50 is a sectional view of the photodiode array (second example) taken along the arrowed line A-A of FIG. 49.

The structure of the second example is a case where, in the structure illustrated in FIG. 46, the readout line 5B2 extends between the semiconductor regions 14 adjacent to each other, while the width of the readout line 5B2 is close to the distance of separation between the surface electrodes 3B adjacent to each other. The auxiliary readout line 5A has a width smaller than that of the readout line 5B2, and they extend in parallel with each other. When the third insulating layer 18 is not sufficiently thick or not subjected to surface polishing, the front face of the third insulating layer 18 becomes irregular because of the form of the surface electrode 3B thereunder as illustrated in FIG. 50. While the front face of the third insulating layer also deforms irregularly because of the form of the auxiliary readout line 5A as a matter of course, FIG. 50 does not illustrate such deformation.

Since the two readout lines 5A, 5B2 are provided alongside each other, this example can reduce the wiring resistance, so as to lower the time constant, thereby improving the signal readout speed. Further, it can greatly lower the wiring resistance, since the readout line 5B2 is wider.

When the third insulating layer 18 is made sufficiently thick (1 µm to 5 µm) or its front face is flattened by surface polishing in the above-mentioned first or second example, the readout line 5B is formed on the flat surface, which is effective in inhibiting differences in level of the front face from breaking lines. Each of the surface electrode 3B and auxiliary readout line 5A has a thickness of 0.6 µm to 3.0 µm.

Third Example

Figure 51:
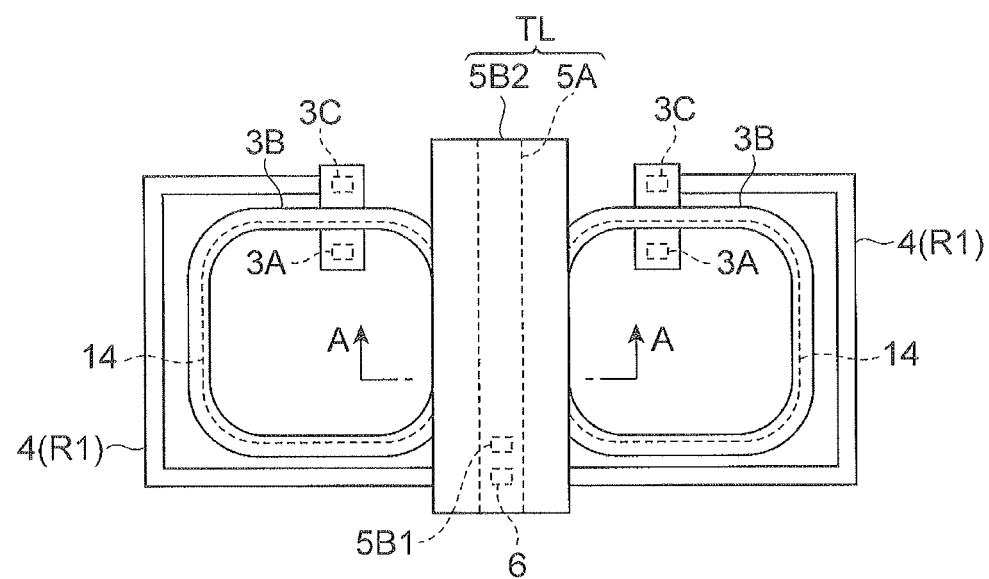
FIG. 51 is a partial plan view of a photodiode array (third example)
Figure 52:
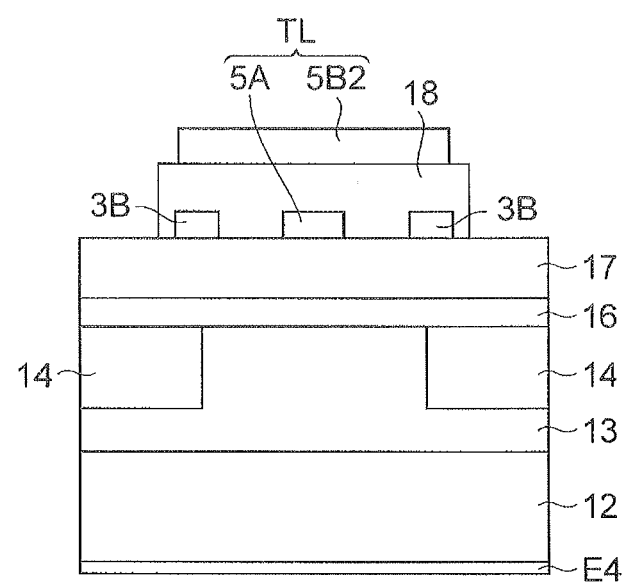
FIG. 52 is a sectional view of the photodiode array (third example) taken along the arrowed line A-A.

FIG. 51 is a partial plan view of a photodiode array (third example), while FIG. 52 is a sectional view of the photodiode array (third example) taken along the arrowed line A-A of FIG. 51.

The structure of the third example is a case where, in the structure illustrated in FIG. 46, the readout line 5B2 extends between the semiconductor regions 14 adjacent to each other, while the width of the readout line 5B2 is greater than the distance of separation between the surface electrodes 3B adjacent to each other (the minimum value of distance of separation between their outer edges). The width of the readout line 5B2 is not greater than the minimum value of distance of separation between the surface electrodes 3B adjacent to each other.

The auxiliary readout line 5A has a width narrower than that of the readout line 5B2, and they extend in parallel with each other. Here, the third insulating layer 18 is sufficiently thick or subjected to surface polishing and thus has a flat front face as illustrated in FIG. 52.

Since the two readout lines 5A, 5B2 are provided, this example can reduce the wiring resistance, so as to lower the time constant, thereby improving the signal readout speed. Since the readout line 5B2 is remarkably wider, the wiring resistance is further lower.

An example in which the above-mentioned auxiliary readout line 5A is substantially omitted will now be explained.

Figure 53:
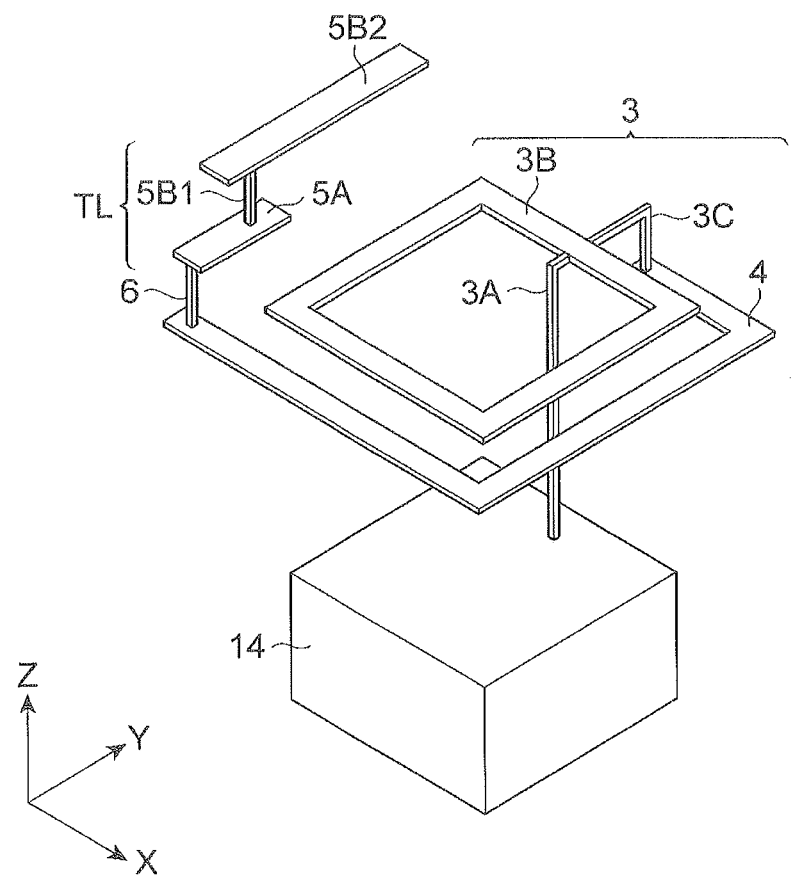

FIG. 53 is a diagram illustrating the relationship of connections among electrodes, lines, and the like. It is the same as the structure illustrated in FIG. 46 except that the auxiliary readout line 5A is not connected to the common electrode but is only used for connecting the connection line 6 and contact electrode 5B1 to each other. That is, the readout line 5A is not electrically connected to the common electrode without the aid of the readout line 5B2. An example using this structure will be explained in the following.

Fourth Example

Figure 54:
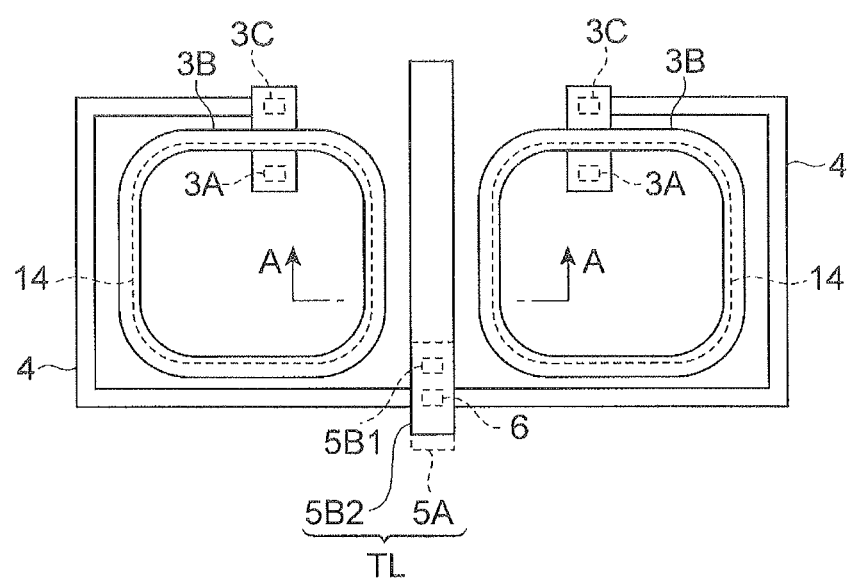
FIG. 54 is a partial plan view of a photodiode array (fourth example)
Figure 55:
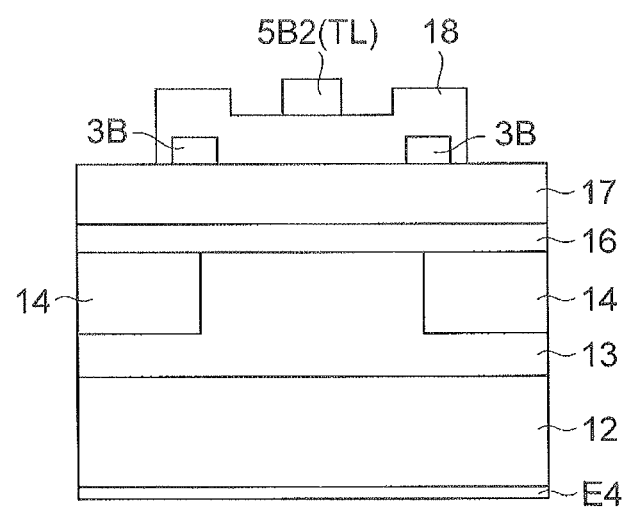
FIG. 55 is a sectional view of the photodiode array (fourth example) taken along the arrowed line A-A.

FIG. 54 is a partial plan view of a photodiode array (fourth example), while FIG. 55 is a sectional view of the photodiode array (fourth example) taken along the arrowed line A-A of FIG. 54.

The structure of the fourth example is a case where, in the structure illustrated in FIG. 53, the readout line 5B2 extends between the semiconductor regions 14 adjacent to each other, while the width of the readout line 5B2 is smaller than the distance of separation between the surface electrodes 3B adjacent to each other. The auxiliary readout line 5A has the same width as with the readout line 5B2 and extends a little in parallel therewith but falls short of reaching the common electrode. When the third insulating layer 18 is not sufficiently thick or not subjected to surface polishing, the front face of the third insulating layer 18 becomes irregular because of the form of the surface electrode 3B thereunder as illustrated in FIG. 55. Since the auxiliary readout line 5A does not exist substantially, the front face of the third insulating layer 18 is essentially free of irregularities caused by the former.

In this example, the readout line 5B2 passes through the upper layer, whereby its thickness and width can be designed freely, so as to reduce the wiring resistance, lower the time constant, and improve the signal readout speed.

Fifth Example

Figure 56:
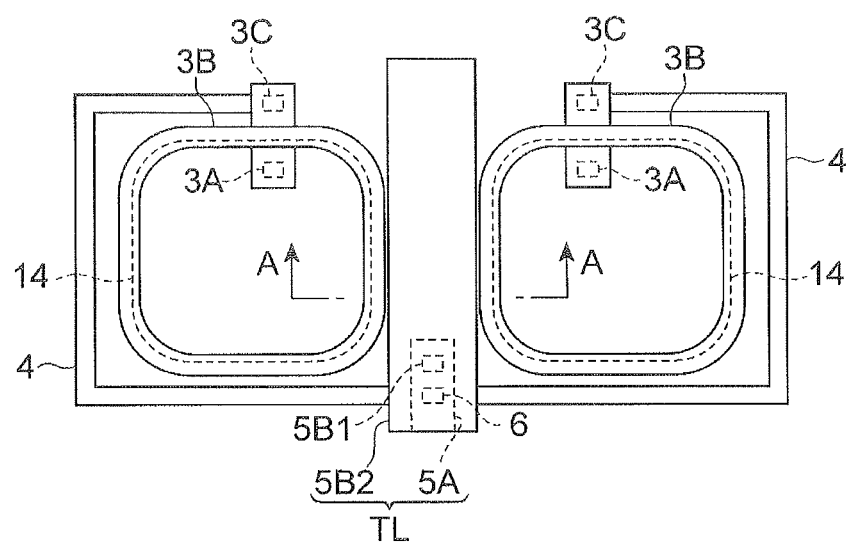
FIG. 56 is a partial plan view of a photodiode array (fifth example)
Figure 57:
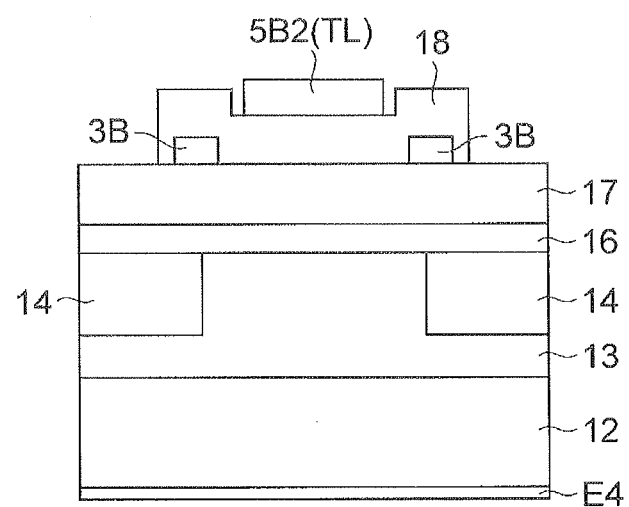
FIG. 57 is a sectional view of the photodiode array (fifth example) taken along the arrowed line A-A.

FIG. 56 is a partial plan view of a photodiode array (fifth example), while FIG. 57 is a sectional view of the photodiode array (fifth example) taken along the arrowed line A-A of FIG. 56.

The structure of the fifth example is a case where, in the structure illustrated in FIG. 54, the readout line 5B2 extends between the semiconductor regions 14 adjacent to each other, while the width of the readout line 5B2 is close to the distance of separation between the surface electrodes 3B adjacent to each other. The auxiliary readout line 5A has the same width as with the readout line 5B2 and extends a little in parallel therewith but falls short of reaching the common electrode. When the third insulating layer 18 is not sufficiently thick or not subjected to surface polishing, the front face of the third insulating layer 18 becomes irregular because of the form of the surface electrode 3B thereunder as illustrated in FIG. 57. Since the auxiliary readout line 5A does not exist substantially, the front face of the third insulating layer 18 is essentially free of irregularities caused by the former.

Since the readout line 5B2 is wide, this example can reduce the wiring resistance, lower the time constant, and improve the signal readout speed. Since the auxiliary readout line 5A does not exist substantially, its resulting differences in level do not occur in the third insulating layer 18, which is effective in inhibiting differences in level from breaking the readout line 5B2.

In the above-mentioned fourth and fifth examples, the third insulating layer 18 may be made sufficiently thick or its front face may be polished, so that its front face becomes flat. The ranges of thickness of the third insulating layer 18 and surface electrode 3B within which flattening is possible are the same as those set forth in the second example.

Sixth Example

Figure 58:
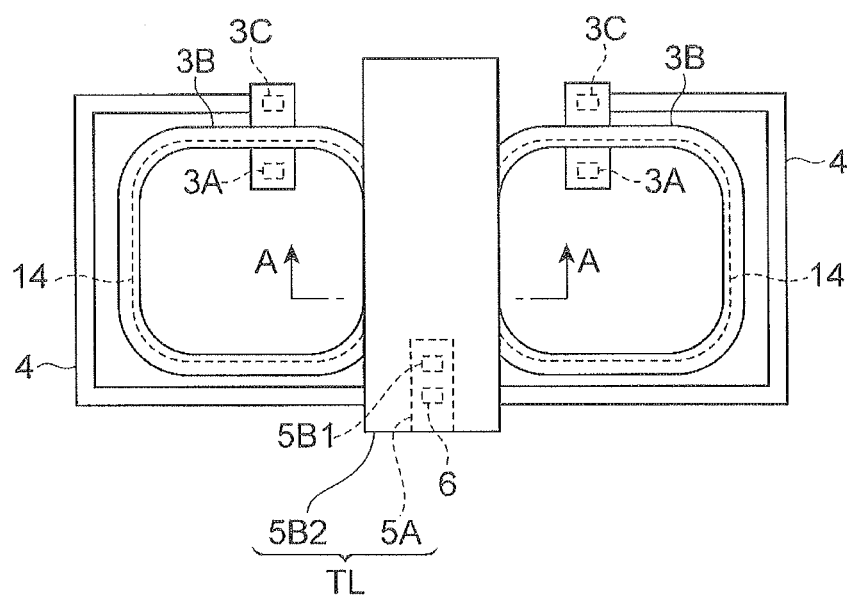
FIG. 58 is a partial plan view of a photodiode array (sixth example)
Figure 59:
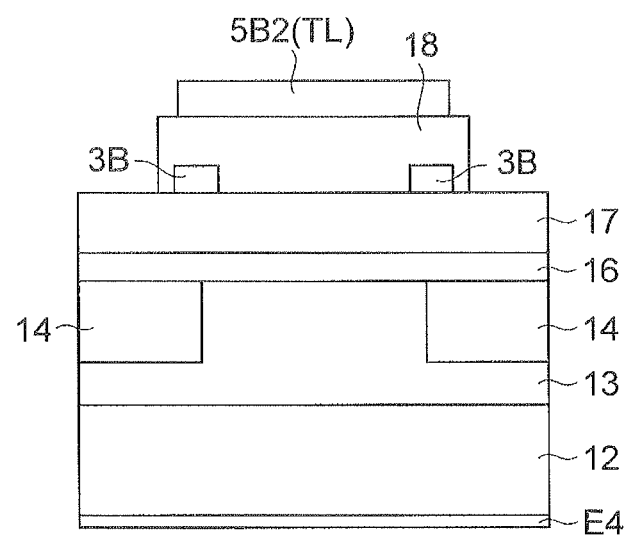
FIG. 59 is a sectional view of the photodiode array (sixth example) taken along the arrowed line A-A.

FIG. 58 is a partial plan view of a photodiode array (sixth example), while FIG. 59 is a sectional view of the photodiode array (sixth example) taken along the arrowed line A-A of FIG. 58.

The structure of the sixth example is a case where, in the structure illustrated in FIG. 53, the readout line 5B2 extends between the semiconductor regions 14 adjacent to each other, while the width of the readout line 5B2 is greater than the distance of separation between the surface electrodes 3B adjacent to each other (the minimum value of distance of separation between their outer edges). The width of the readout line 5B2 is not greater than the minimum value of distance of separation between the surface electrodes 3B adjacent to each other.

The auxiliary readout line 5A has the same width as with the readout line 5B2 and extends a little in parallel therewith but falls short of reaching the common electrode. Here, the third insulating layer 18 is sufficiently thick or subjected to surface polishing, whereby the front face of the third insulating layer 18 is made flat as illustrated in FIG. 59.

Since the readout line 5B2 is sufficiently wide, this example can reduce the wiring resistance, lower the time constant, and improve the signal readout speed. Since the auxiliary readout line 5A does not exist substantially, while the front face of the third insulating layer 18 is made flat, the third insulating layer 18 is free of differences in level, which is effective in inhibiting differences in level from breaking the readout line 5B2.

Seventh Example

Figure 60:
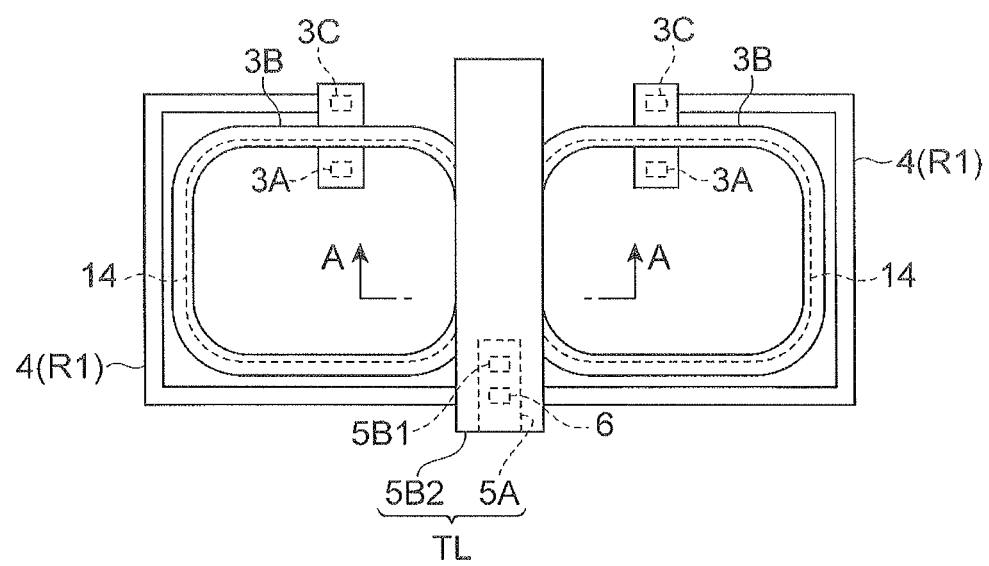
FIG. 60 is a partial plan view of a photodiode array (seventh example)
Figure 61:
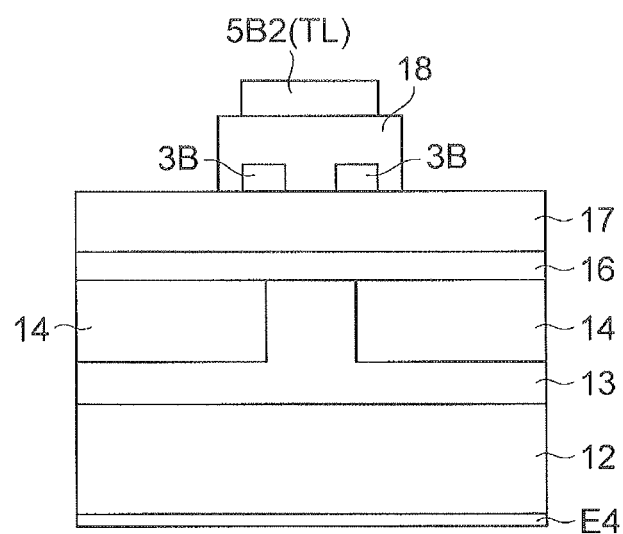
FIG. 61 is a sectional view of the photodiode array (seventh example) taken along the arrowed line A-A.

FIG. 60 is a partial plan view of a photodiode array (seventh example), while FIG. 61 is a sectional view of the photodiode array (seventh example) taken along the arrowed line A-A of FIG. 60.

The structure of the seventh example reduces the distance of separation between the semiconductor regions 14 in the structure of the sixth example instead of narrowing the width of the readout line 5B2, thereby improving the aperture ratio of the photodiode. The rest is the same as with the sixth example. In any example, the contact electrode 5B1 may be disposed on the outside of the region surrounded by the quenching resistance 4.

Since the readout line 5B2 is sufficiently wide, this example can reduce the wiring resistance, lower the time constant, and improve the signal readout speed. Since the auxiliary readout line 5A does not exist substantially, while the front face of the third insulating layer 18 is made flat, the third insulating layer 18 is free of differences in level, which is effective in inhibiting differences in level from breaking the readout line 5B2. Since the aperture ratio of the photodiode is improved, it is advantageous in that output signals become greater.

Figure 62:
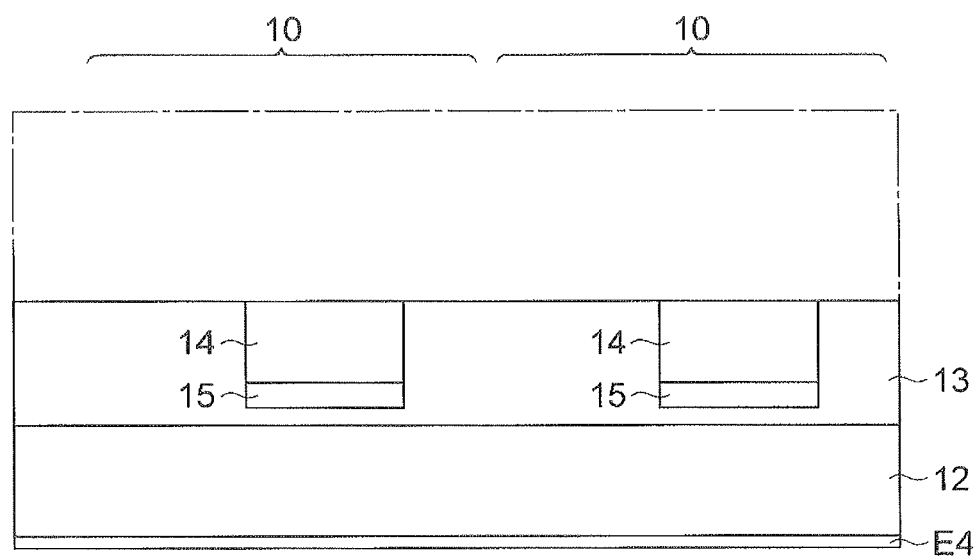
FIG. 62 is a vertical sectional view of a photodiode array having changed its substrate structure.

Any of the above-mentioned structures can employ the structure illustrated in FIG. 62 as a structure of the semiconductor substrate.

FIG. 62 is a vertical sectional view of a photodiode array having changed its substrate structure. In this drawing, solid lines indicate only the points altered from the above-mentioned photodiode array, while, dash-single-dot lines indicate the rest.

This structure is the same as the above-mentioned structures of types 1 to 4 explained with reference to FIG. 43 and later except that the semiconductor region 15 is arranged directly under the semiconductor region 14. The semiconductor region 15 has a conduction type identical to or different from that of the semiconductor region 14. Those having the same conduction type will be referred to as types 1S to 4S, whereas those having the different conduction type will be referred to as types 1D to 4D. The impurity concentration in the semiconductor region 15 is lower than that in the semiconductor region 14. B (boron) can be employed as p-type impurities, while P (phosphorus), As (arsenic), or Sb (antimony) can be employed as n-type impurities.

The conduction types and preferred ranges of impurity concentration and thickness of the layers in the above-mentioned semiconductor structures are as explained in FIG. 41 and later in each type.

While the lowermost semiconductor region 12 constitutes a semiconductor substrate having a large thickness in the above-mentioned examples, the photodetector unit 10 may further comprise a semiconductor substrate thereunder; in this case, the semiconductor region 12 has a thickness smaller than that of the additional semiconductor substrate.

The semiconductor region 13, which can be formed by epitaxial growth on the semiconductor region 12, may also be formed by impurity diffusion or ion implantation to the substrate. The semiconductor regions 14, 15 can be formed by impurity diffusion or ion implantation to the semiconductor region 13.

Figure 63:
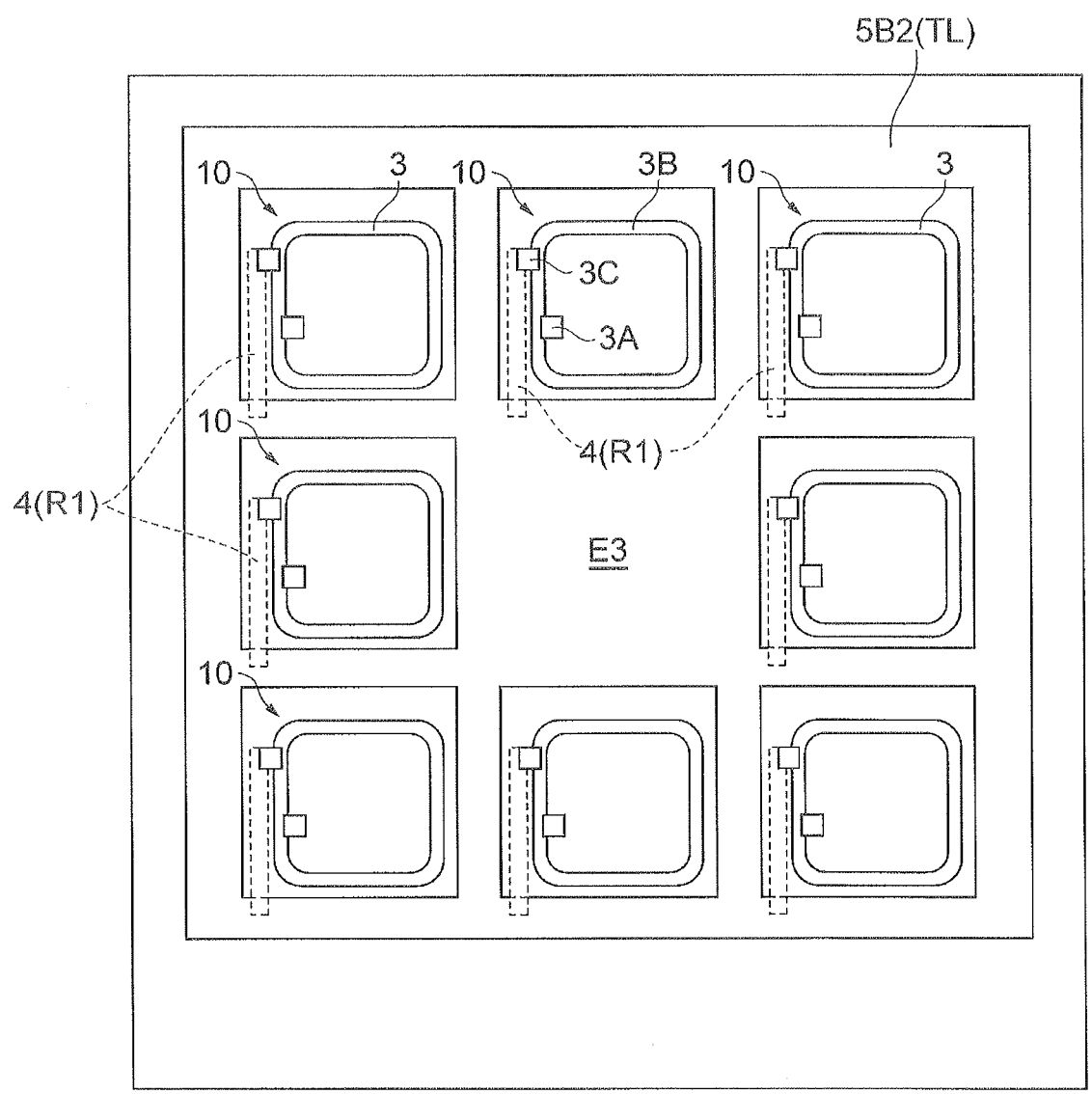
FIG. 63 is a plan view of the photodiode array.

FIG. 63 is a plan view of a photodiode array. This example has an electrode pattern with a structure of the type illustrated in FIG. 45. Its front face is formed with the lattice-like readout electrode (readout line) 5B2 and the common electrode E3 connected to the readout electrode 5B2, while the photodetector unit 10 is located within an opening of each grid.

Each photodetector unit 10 has the connection electrode 3 connected to the semiconductor region 14 (see FIG. 45), while the connection electrode 3 is connected to the readout line 5B2 through the quenching resistance 4. While the vertical cross-sectional structure of this photodiode array along the carrier advancing path is illustrated in FIG. 44, the structures of the above-mentioned types 1 to 4 (types 1S to 4S, 1D to 4D) may also be employed. While the upper readout line 5B2 is indispensable, the lower auxiliary readout line 5A may be used or omitted. That is, as structures of the readout line 5B2 and auxiliary readout line 5A, those of the above-mentioned first to seventh examples can be employed.

A plurality of photodetector units 10 may be provided within one opening of the readout line 5B2.

The cross-sectional structure in the vicinity of the common electrode E3, the structure for attaching the scintillator to the semiconductor chip, the structure for securing the detector chip constituted by them to the wiring board, and the like are the same as those explained above.

Figure 64:
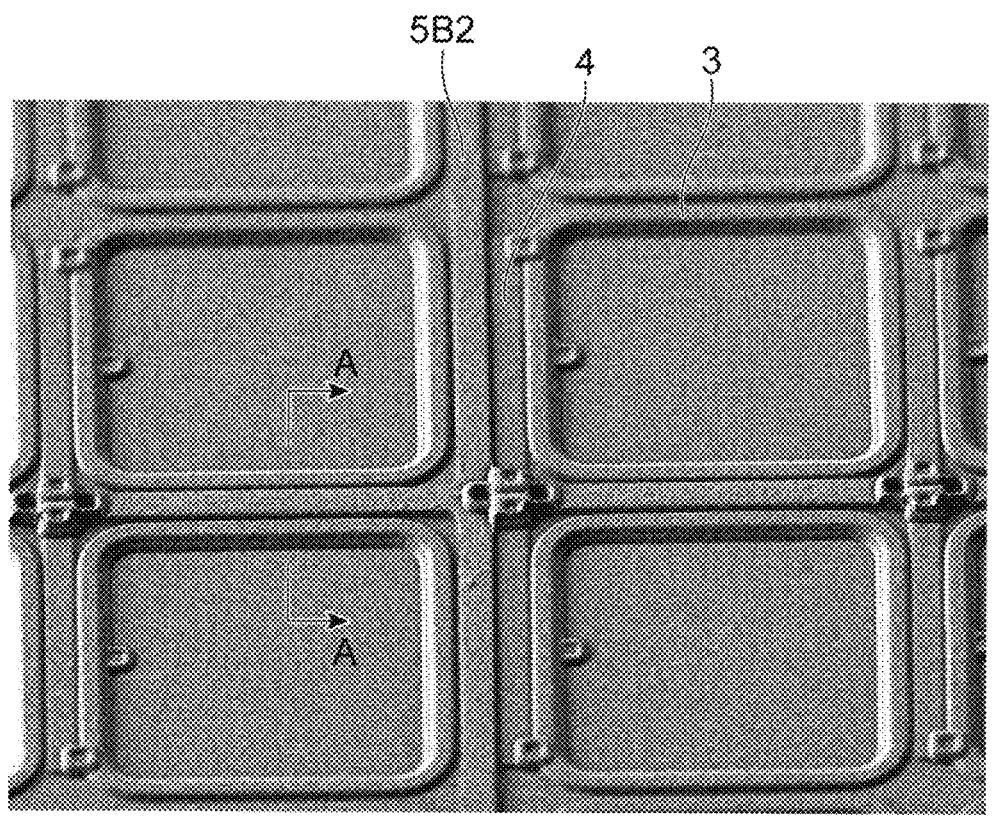
FIG. 64 is a picture illustrating a SEM photograph of the front face of the photodiode array.
Figure 65:
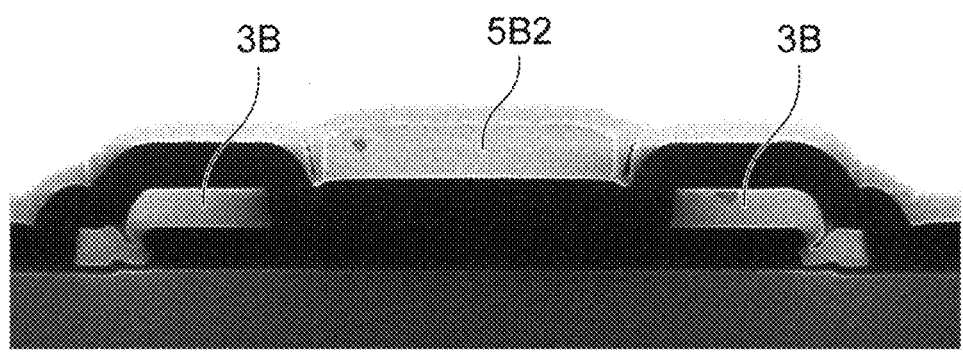
FIG. 65 is a picture illustrating a SEM photograph of a cross section of the photodiode array.

FIG. 64 is a picture illustrating, a SEM (scanning electron microscope) photograph, while FIG. 65 is a picture illustrating a SEM photograph of a cross section (taken along the arrowed line A-A) of the photodiode array. This example illustrates the structure of the fifth example and does not substantially use the auxiliary readout electrode 5A.

In FIG. 64, according to changes in the surface form of the third insulating layer 18, it is observed that the quenching resistance 4 connected to the surface electrode 3B exists and that the readout line 5B2 extends together with the quenching resistance 4. FIG. 65 shows that the readout electrode 5B2 exists as a layer located higher than the surface electrode 3B.

Figure 66:
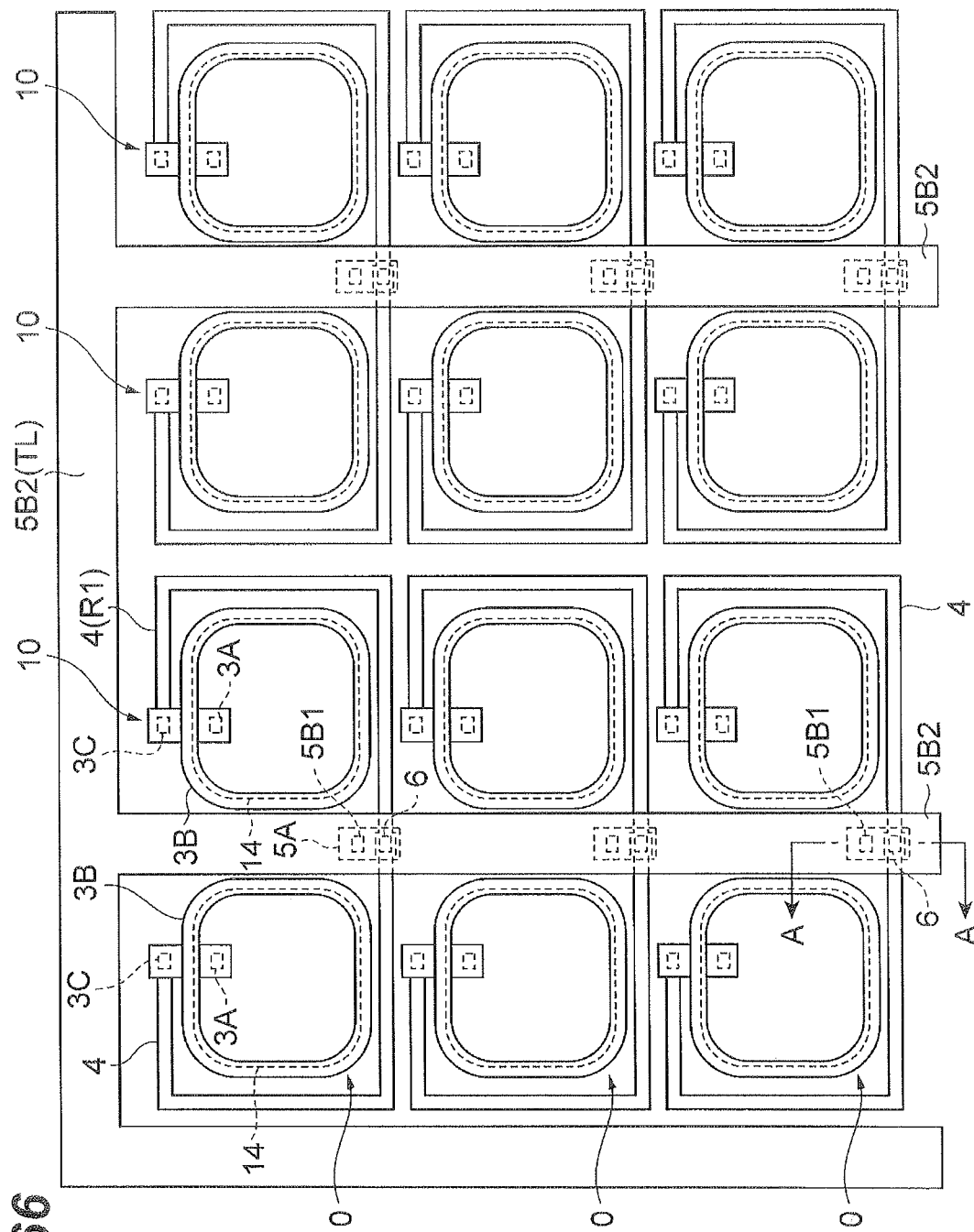
FIG. 66 is a plan view of a part of the photodiode array.

FIG. 66 is a plan view of a part of a photodiode array. This example has an electrode pattern with a structure of the type illustrated in FIG. 46. Its front face is formed with the lattice-like readout electrode 5B2 having rectangular openings, while a plurality of photodetector units 10 are located within an opening of each grid. This structure illustrates the photodiode array of the second example.

Each photodetector unit 10 includes an avalanche photodiode having the semiconductor region 14 for outputting carriers, while the surface electrode 3B is electrically connected to the semiconductor region 14 and surrounds the semiconductor region 14 along its outer edge. The surface electrode 3B and readout line 5B2 are connected to each other through the quenching resistance 4.

Connected to one vertically extending readout line 5B2 through a common connection line (contact electrode) 6 are two photodetector units 10 laterally adjacent to each other, while these photodetector units 10 have structures symmetrical about the vertical center axis of the readout line 5B2. This can reduce the number of readout lines 5B2.

Figure 67:
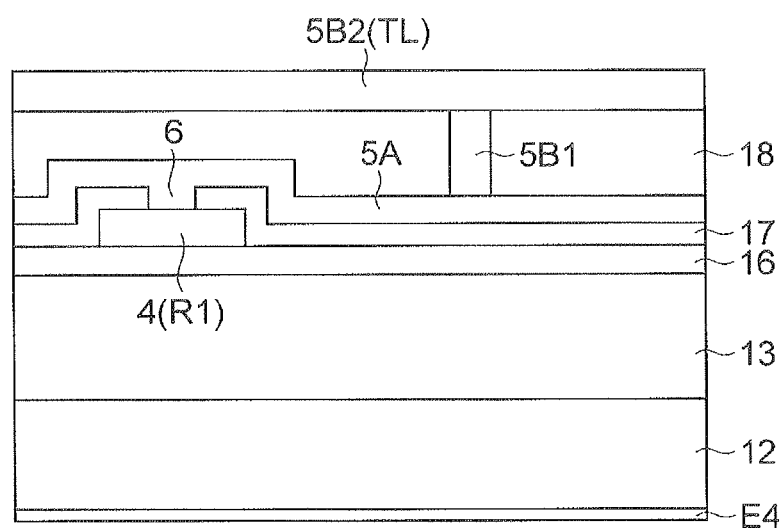
FIG. 67 is a sectional view of the photodiode array (second example) taken along the arrowed line A-A of FIG. 66.

FIG. 67 is a sectional view of the photodiode array (second example) taken along the arrowed line A-A of FIG. 66.

The semiconductor region 13 is formed on the semiconductor layer 12, while the first insulating layer 16 is formed on the semiconductor region 13. The quenching resistance 4 is formed on the first insulating layer 16, while the second insulating layer 17 is formed on them. The auxiliary readout line 5A is disposed on the second insulating layer 17 through a contact hole of the latter, while the third insulating layer 18 is formed on the auxiliary readout line 5A. The contact electrode 5B1 is disposed within a contact hole provided in the third insulating layer 18 and connects the lower auxiliary readout line 5A and the upper readout line 5B2 to each other physically and electrically.

When the contact electrode 5B1 is located at a trailing end position of the auxiliary readout line 5A while omitting the auxiliary readout line 5A on the output side therefrom, this example becomes the photodiode array of the above-mentioned fifth example. The line connecting structure of this example can be employed in any structure of the first to seventh examples.

When the auxiliary wiring electrode 5A is not provided, the contact electrode 5B1 can be arranged directly on the quenching resistance 4, so that the contact electrode 5B1 directly connects the quenching resistance 4 and readout line 5B2 to each other. It is thus possible to provide a structure which completely omits the auxiliary readout line 5A.

In any of the structures and examples, the above-mentioned photodiode array comprises the insulating layer 18 formed on the quenching resistance 4, while the readout line 5B2 is electrically connected to the quenching resistance 4 through the contact hole provided in the insulating layer 18 and electrically connects the quenching resistance 4 and common electrode to each other.

Materials constituting the above-mentioned photodiode array will now be explained.

A material constituting the semiconductor regions 12, 13, 14 constructing the semiconductor substrate is Si as mentioned above and contains desired impurities. A material constituting each of the insulating layers 16, 17, 18 is $SiO_2$ or a nitride of silicon. A material constituting each of the connection electrode 3, connection line 6, auxiliary connection line 5A, connection line 5B (readout line 5B2, contact electrode), common electrode, and through electrode is a metal, preferred examples of which include metals such as Al, Cu, Au, Cr, Ag, and Fe and alloys including two or more of them. A material constituting the quenching resistance 4 has a resistivity higher than that of the readout line 5B2 and is polysilicon, SiCr, NiCr, or TaNi.

The above-mentioned SEM photograph is an example using $SiO_2$ as a material constituting the insulating layers 16, 17, 18, Al as a material constituting the connection electrode 3, connection line 6, auxiliary connection line 5A, connection line 5B (readout line 5B2, contact electrode), and common electrode E3, and polysilicon as a material constituting the quenching resistance 4.

Referring to FIG. 44 again, a method for manufacturing the above-mentioned photodiode array will now be explained.

First, the semiconductor region 13 is formed on the semiconductor region (semiconductor substrate) 12 by epitaxial growth or impurity diffusion or ion implantation. While the semiconductor region 12 is preferably a (100) Si semiconductor substrate formed by CZ method or FZ method, semiconductor substrates having other orientations can also be used. When Si epitaxial growth is employed, vapor-phase silicon tetrachloride ($SiCl_4$) and trichlorosilane ($SiHCl_3$) are used as raw materials, for example, and these gases are caused to flow over the substrate surface at a growth temperature of 1200° C. In the case of impurity diffusion, impurities corresponding to the conduction type of the semiconductor region 13 are caused to diffuse as a gas or solid into the semiconductor region 12. In the case of ion implantation, impurities corresponding to the conduction type of the semiconductor region 13 are ion-implanted into the semiconductor region 12.

Subsequently, the semiconductor region 14 is formed on a region on the front face side of the semiconductor region 13. For this, impurity diffusion or ion implantation can be used. When diborane ($B_2H_6$) is used as a raw material for impurities in the diffusion, the diffusion temperature can be set at 1200° C., for example. When forming the semiconductor region 14, a resist pattern having an opening is formed on the semiconductor region 13 by a lithography technique at first and then is used as a mask for adding the impurities. The lattice-like wiring pattern 3C may be formed and then used as a mask for adding impurities by ion implantation through the insulating layer 16.

Then, the insulating layer 16 is formed on the semiconductor substrate. The insulating layer 16 can be formed by using Si thermal oxidation. The oxidation temperature is 1000° C., for example. This oxidizes the front faces of the semiconductor regions 13, 14, thereby forming the insulating layer 16 made of $SiO_2$. CVD can also be used for forming the insulating layer 16.

Thereafter, a mask is formed at a desired position on the insulating layer 16 by patterning with a resist based on a photolithography technique, a resistance material is deposited into an opening of the resist through the mask, so as to form the quenching resistance 4 within the opening, and then the resist is removed. The resistance material can be deposited by sputtering using it as a target, for example. The quenching resistance 4 made of polysilicon is formed by using silicon, for example.

Next, the insulating layer 17 is formed on the insulating layer 16. The insulating layer 17 can be formed by using sputtering or plasma CVD. When using the plasma CVD, the insulating layer 17 is grown while using tetraethoxysilane (TEOS) and oxygen gas as raw material gases and setting the growth temperature at about 200° C. The thickness of the insulating layer 17 is preferably set to such a thickness as to flatten its front face and is preferably greater than the height from the front face of the insulating layer 16 to the upper face of the wiring pattern 3C. This forms the insulating layer 17 made of $SiO_2$.

Subsequently, a contact hole is formed in the insulating layers 16, 17 at a position on the semiconductor region 14. When forming the contact hole, a resist pattern having an opening is formed on the insulating layer 17 by a photolithography technique at first and then is used as a mask for etching the insulating layers 17, 16. As the etching method, not only dry etching, but wet etching with an etchant including an aqueous HF solution can also be used.

Then, a mask is formed at a desired position on the insulating layer 17 by using a resist pattern based on a photolithography technique and employed for depositing and forming the first contact electrode 3A, surface electrode 3B, second contact electrode 3C, connection line 6, and auxiliary readout electrode 5A into openings of the resist at the same time by vapor deposition, and the resist is removed after forming them. While aluminum is used as a vapor deposition material in this example, sputtering and the like can also be used.

The insulating layer 18 is formed on the insulating layer 17. The insulating layer 18 is formed by the same method as with the insulating layer 17.

Thereafter, a mask is formed at a desired position on the insulating layer 18 by patterning with a resist based on a photolithography technique and used for etching the insulating layer 18, so as to form a contact hole, and the resist is removed after the formation. As the etching method for forming the contact hole, not only dry etching, but wet etching with an etchant including an aqueous HF solution can also be used. The contact electrode 5B1 is formed within the contact hole, and the readout line 5B2 continuous with the contact electrode 5B1 is formed at the same time.

For forming the contact electrode 5B1 and readout line 5B2, a mask is formed at a desirable position on the insulating layer 18 by patterning with a resist based on a photolithography technique, and the contact electrode 5B1 and readout line 5B2 are deposited into the opening of the mask. As the deposition method, vapor deposition or sputtering can be used.

When manufacturing the photodetector unit having the structure illustrated in FIG. 62, it is sufficient for the semiconductor region 15 to be formed on the front face side of the semiconductor region 13 by using impurity diffusion or ion implantation before forming the semiconductor region 14. In the case of impurity diffusion, impurities corresponding to the conduction type of the semiconductor region 15 are diffused as a gas or solid into the semiconductor region 13. In the case of ion implantation, impurities corresponding to the conduction type of the semiconductor region 15 are ion-implanted into the semiconductor region 13.

The common electrode E3, when wanted to be on the second insulating layer 17, can be formed at the same time with the surface electrode 3B by patterning with a resist. For forming the common electrode E3 on the third insulating layer 18 and connecting the auxiliary readout line 5A thereto, it will be sufficient if a contact hole for connecting the auxiliary readout line 5A and common electrode E3 to each other is formed and then the contact electrode within the contact hole and the common electrode are formed at the same time with the readout line 5B2.

The form of the quenching resistance 4 in planar view, which is a ring in the above-mentioned embodiment, may also be a partial ring or a spiral.

Effects obtained when the photodiode array having the structure of the above-mentioned fifth example (FIGS. 56 and 57) is manufactured as a prototype will now be explained. In this example, the common electrode E3 and through electrode are not produced.

Manufacturing conditions are as follows:
(1) Structure
(1-1) Semiconductor region 12:
Conduction type: n-type (impurities: Sb (antimony))
Impurity concentration: $5.0 \times 10^{11}$ $cm^{-3}$
Thickness: 650 μm
(1-2) Semiconductor region 13:
Conduction type: p-type (impurities: B (boron))
Impurity concentration: $1.0 \times 10^{14}$ $cm^{-3}$
Thickness: 30 μm
(1-3) Semiconductor region 14:
Conduction type: p-type (impurities: B (boron))
Impurity concentration: $1.0 \times 10^{18}$ $cm^{-3}$
Thickness: 1000 μm
(1-4) Insulating layer 16: $SiO_2$ (thickness: 1000 nm)
(1-5) Insulating layer 17: $SiO_2$ (thickness: 2000 nm)
(1-6) Insulating layer 18: $SiO_2$ (thickness: 2000 nm)
(1-7) Connection electrode 3: aluminum (Al)
(1-8) Quenching resistance 4: polysilicon
Form: illustrated in FIG. 63
Thickness: 500 nm
Width: 2 μm
Length: 100 μm
Resistance value: 500 kΩ
(1-9) Photodetector unit 10:

Area S of one photodetector unit 10: 2025 μm²
Interval X between centers of the photodetector units 10 adjacent to each other: 50 μm
Number of photodiodes within the light-receiving region: 100 in the X direction×100 in the Y direction
Size of the light-receiving region in the X direction: 5 mm
Size of the light-receiving region in the Y direction: 5 mm
(1-10) Readout line 5B2:
Width: 5 μm
Number of lines in the X direction: 101
Number of lines in the Y direction: 101
Number of photodetector units 10 within one opening: 1
(2) Manufacturing method conditions
  Semiconductor region 12: CZ method ((001) Si semiconductor substrate)
  Semiconductor region 13: Si epitaxial growth (raw material: vapor-phase silicon tetrachloride ($SiCl_4$), trichlorosilane ($SiHCl_3$), growth temperature at 1200° C.)
  Semiconductor region 14: thermal diffusion of impurities (impurity raw material: diborane ($B_2H_6$), diffusion temperature at 1200° C.)
  Insulating layer 16: Si thermal oxidation (oxidation temperature at 1000° C.)
  Quenching resistance 4: sputtering (target material: Si)
  Insulating layer 17: plasma CVD (raw material gas: tetraethoxysilane (TEOS) and oxygen gas, growth temperature at 200° C.)
  First contact electrode 3A, surface electrode 3B, second contact electrode 3C, connection line 6, auxiliary readout line 5A, and common electrode 3E: vapor deposition (raw material: aluminum)
  Insulating layer 18: plasma CVD (raw material gas: tetraethoxysilane (TEOS) and oxygen gas, growth temperature at 200° C.)
  Contact electrode 5B1, readout line 5B2, and common electrode (electrode pad): vapor deposition (raw material: aluminum)

Characteristics of a photodiode array in accordance with an example was evaluated as follows.

Figure 68:
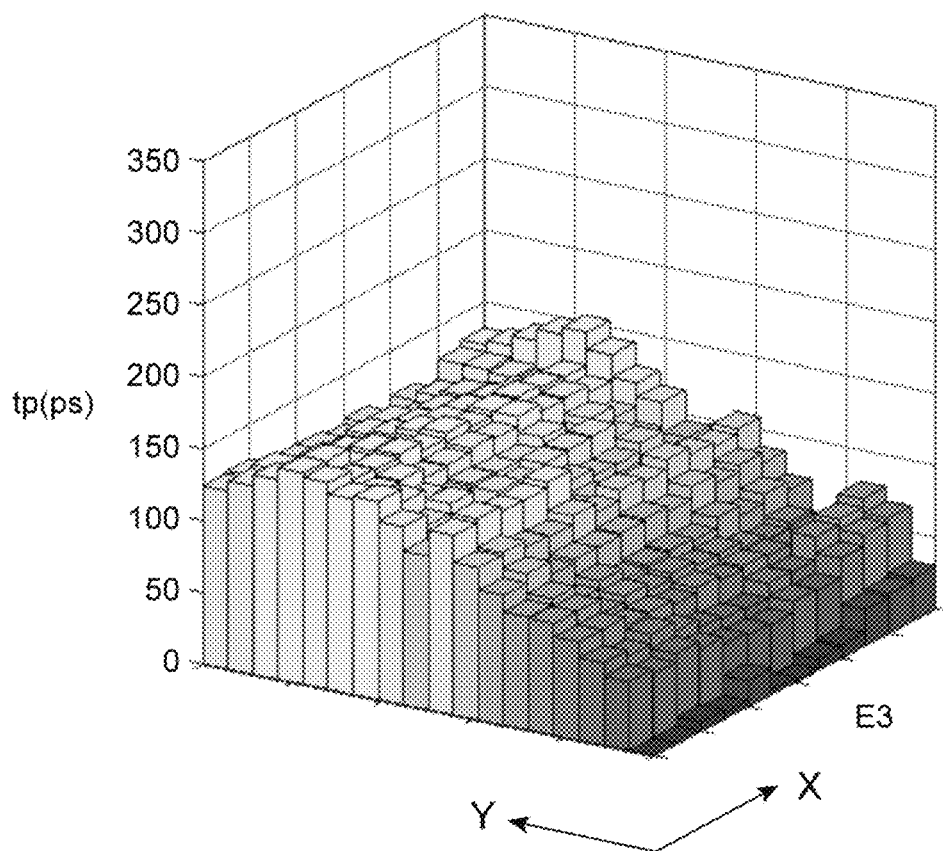
FIG. 68 is a graph illustrating the distance from each photodiode to an electrode pad (common electrode) and the difference tp (ps) of signal transmission time from a reference (in an example)

FIG. 68 is a graph (example) illustrating the distance from each photodiode (pixel) serving as a base point to an electrode pad (assumed to be the common electrode E3) disposed at one end on the front face of the semiconductor chip and the difference tp (ps) of signal transmission time from a reference. The time difference tp is the transmission time from the reference time. Five photodiodes are arranged about the photodiode serving as a base point, the number of base points in the X direction is 12, the number of base points in the Y direction is 18, and this graph indicates an average value of photodiode outputs about each base point as one data item, While each photodiode chip has a size of 5 mm×5 mm, letting the foremost position in the graph be the origin in the XY plane, 100 photodiodes are arranged along each of the X and Y directions in the light-receiving region. The electrode pad assumed to be the common electrode E3 is disposed at the position E3 located on the right of the graph.

While the difference tp (ps) in signal transmission time from each photodiode to the electrode pad tends to become longer with distance from the electrode pad, each of the time differences tp is short, i.e., 160 ps or less, and their variations within the plane are small.

Figure 69:
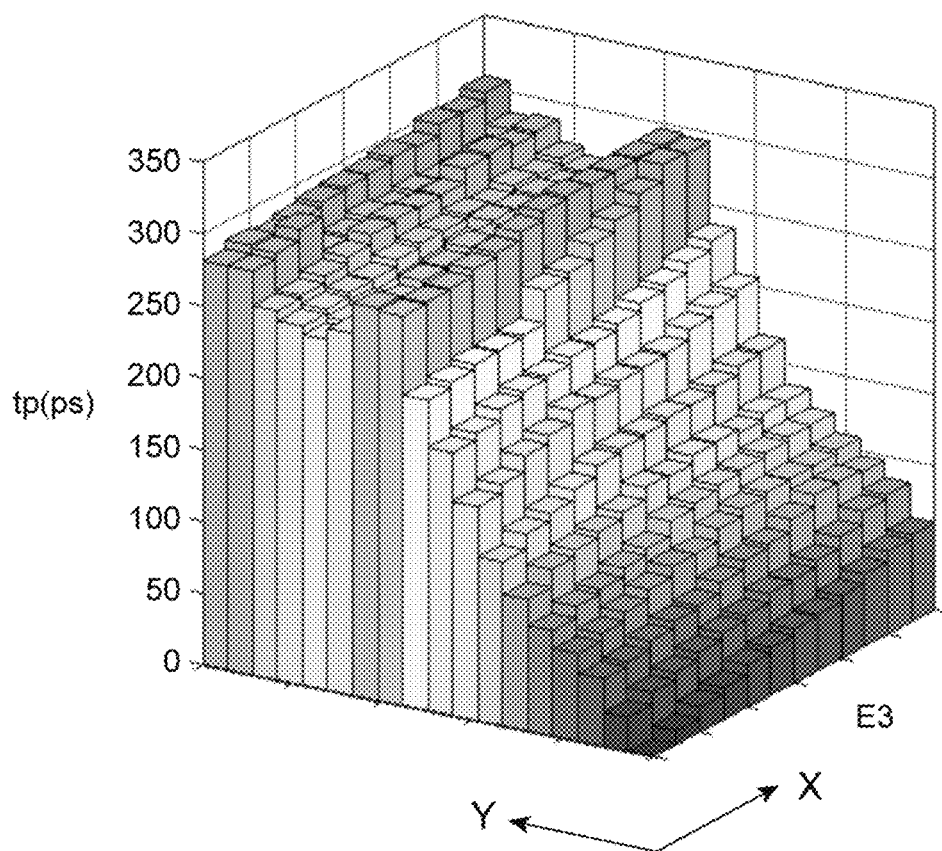
FIG. 69 is a graph illustrating the distance from each photodiode to the electrode pad (common electrode) and the difference tp (ps) of signal transmission time from the reference (in a comparative example)

FIG. 69 is a graph (comparative example) illustrating the distance from each photodiode (pixel) to the electrode pad and the difference tp (ps) of signal transmission time from the reference. The comparative example is one which uses only the lower auxiliary readout line 5A in the above-mentioned first example for signal transmission without forming the upper readout line 5B2. The width of one auxiliary readout line 5A is 2 μm in the comparative example.

While the difference tp (ps) in signal transmission time from each photodiode to the electrode pad E3 tends to become longer with distance from the electrode pad, the time differences tp mostly exceed 160 ps and at the maximum surpass 300 ps, and their variations within the plane are large.

Figure 70:
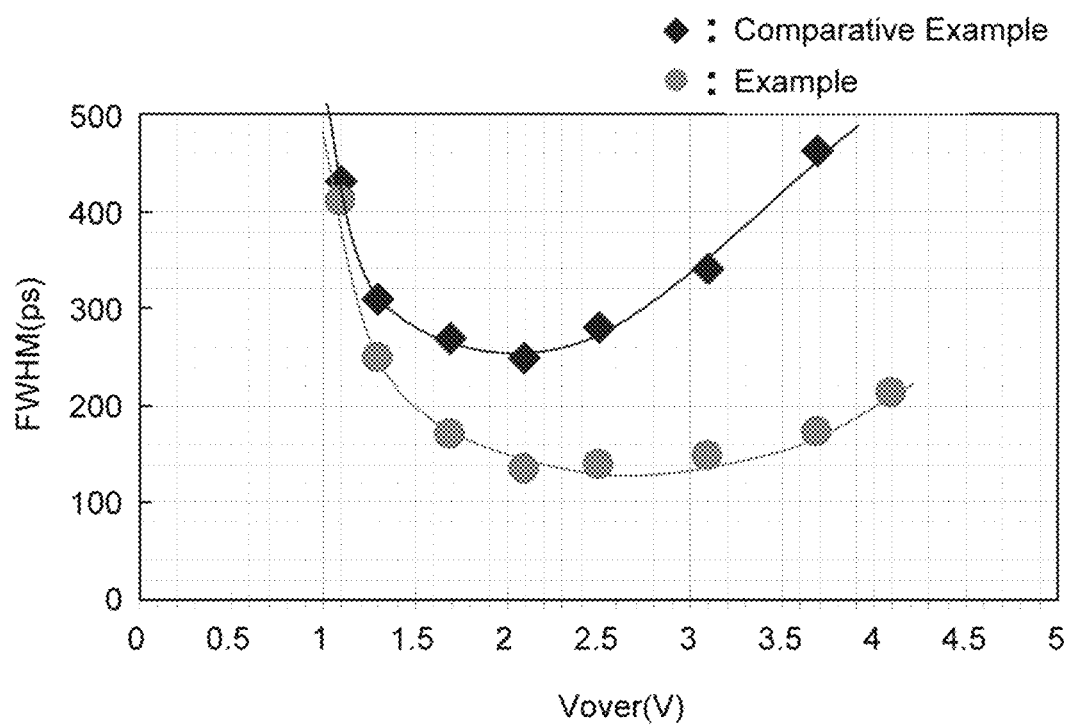
FIG. 70 is a graph illustrating the relationship between voltage Vover and FWHM (ps)
Figure 71:
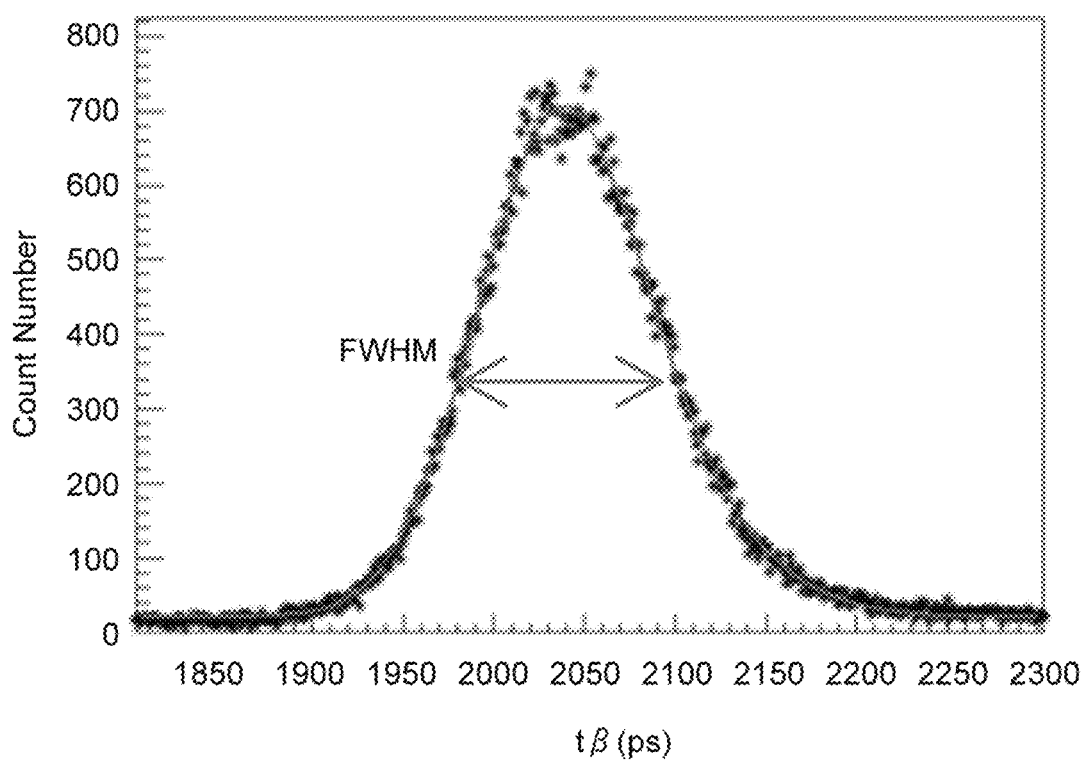
FIG. 71 is a graph illustrating the relationship between time tβ (ps) and count number.

FIG. 70 is a graph illustrating the relationship between voltage Vover and FWHM (ps) indicating variations in output pulse arrival time, whereas FIG. 71 is a graph illustrating the relationship between arrival time tβ (ps) and count number.

In order for each photodiode to operate in Geiger mode, a reverse-bias voltage (70+Vover) greater than the breakdown voltage (70 V) by a voltage Vover is applied to the photodiode. When this excess voltage is 1.5 to 4 V (reverse-bias voltage=71.5 V to 74 V), the full width at half maximum (FWHM) becomes 200 ps or less and can be as small as 130 ps in the example, but is 220 ps or greater in the comparative example. The following is a method for measuring the FWHM. Forming a two-layer metal line can reduce the wiring resistance, thereby achieving a high time resolution. Forming one semiconductor chip or each active channel with a plurality of common electrodes and through holes instead of one can further ameliorate variations in time.

First, the whole surface of each photodiode array is irradiated with laser light. In this case, the photodiodes output a plurality of pulse signals corresponding to photons incident thereon. Since the photodiodes are distributed within a plane, laser light incident on the photodiodes at the same time reaches the electrode pad with a slight temporal extent. FIG. 71 is a graph illustrating as a histogram the pulse signal count number (pulse number) of pulse signals for each period of time tβ from a laser emission timing to the time when a carrier reaches the electrode pad. The pulse number is the largest in the vicinity of the arrival time tβ of 2040 (ps), at which the arrival time peaks while being normally distributed. The arrival time varies less as the of the graph is smaller.

It is seen that the FWHM is so small in the photodiode array of this example that variations in the arrival time tβ within the plane are suppressed more sufficiently than in the comparative example.

Figure 72:
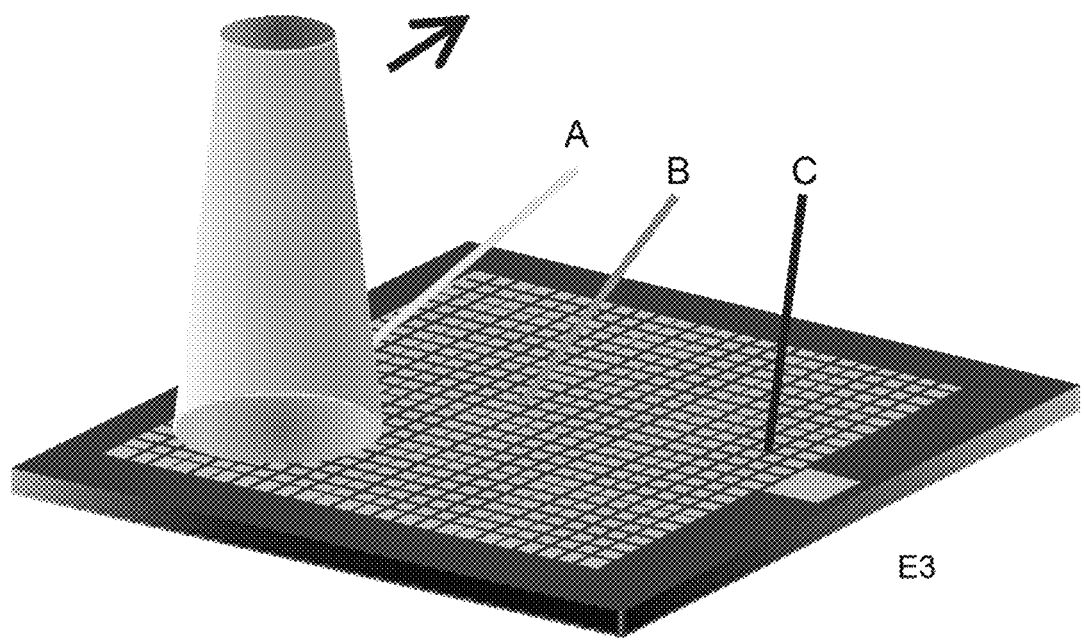
FIG. 72 is a diagram for explaining laser beam irradiation.
Figure 73:
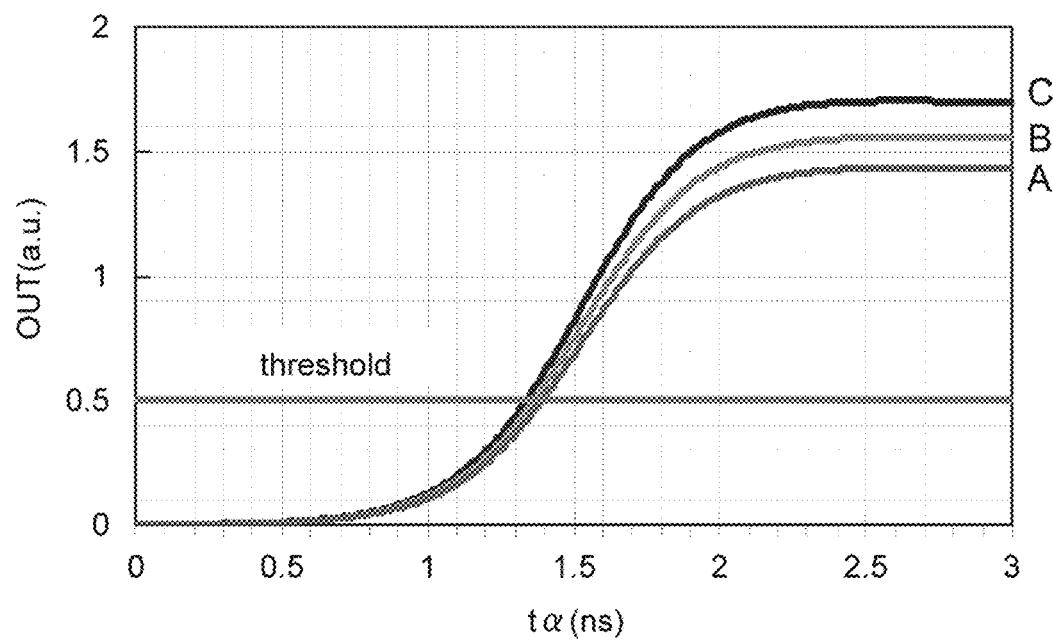
FIG. 73 is a graph illustrating the relationship between time tα (ns) and output OUT (a. u.)

The graphs of FIGS. 68 and 69 are determined by using a method of the following FIGS. 72 and 73.

FIG. 72 is a diagram for explaining laser beam irradiation, while FIG. 73 is a graph (simulation) illustrating the relationship between the period of time tα (ns) from the laser light emission timing to the arrival of the carrier at the electrode pad and output OUT (a. u.).

As illustrated in FIG. 72, a group of photodiodes located at far, middle, and near positions A, B, C with respect to the electrode pad, respectively, are irradiated with a laser beam having a diameter of 1 mm, which is scanned along a lateral direction (X direction) indicated by the arrow in the drawing. The graph of FIG. 73 indicates respective average values of outputs from the far, middle, and near positions A, B, C after the scanning.

In this case, as illustrated in FIG. 73, the output OUT (a. u.) indicating the output pulse voltage increases with the time tα (ns) and is saturated at a fixed value when tα=2.5 ns or longer. The rising time tα at which the threshold=0.5 or greater is 1.4 ns.

FIGS. 68 and 69 map temporal delays of pulses at the laser irradiation positions with reference to the time tα of the position C closest to the pad by actually measuring output pulses corresponding to the simulated diagram of FIG. 73. This mapping was performed by using the time tα at the threshold.

As explained in the foregoing, the photodiode array in accordance with the above-mentioned embodiment is a photodiode array comprising a plurality of photodetector units each having an avalanche diode adapted to operate in Geiger mode, each photodetector unit 10 comprising an avalanche photodiode PD having the semiconductor region 14 for outputting a carrier, a surface electrode 3B, electrically connected to the semiconductor region 14, surrounding the semiconductor region 14 along the outer edge thereof, and the quenching resistance 4 for connecting the surface electrode 3B and readout line 5B2 (TL) to each other; letting a plane including the front face of the semiconductor region 14 be a reference plane, the distance tb from the reference plane to the readout line 5B2 is longer than the distance ta from the reference plane to the surface electrode 3B, while the readout line 5B2 is located between the avalanche photodiodes PD (semiconductor regions 14) adjacent to each other.

Carriers generated in response to light incident on the semiconductor region 14 travel from the second semiconductor region 14 through the surface electrode 3B, quenching resistance 4, and readout line 5B2 in sequence to the common electrode E3, through electrode, bump electrode, and wiring board. The readout line 5B2 is formed as a layer located higher than the surface electrode 3B and thus is free from spatial restrictions imposed by the surface electrode 3B, whereby its width and the like can be made greater. Therefore, the time constant can be made smaller, so as to improve the signal readout speed. The surface electrode can generate a fixed electric field at the outer edge of the second semiconductor region, thereby improving the output stability of the APD.

When the above-mentioned photodiode array is seen in a direction perpendicular to the reference plane, the readout line 5B2 overlaps a part of the surface electrode 3B (the third, sixth, and seventh examples). In this case, the region formed with the readout line 5B2 utilizes a region on the surface electrode 3B2 which is a dead space for light incident thereon, thereby making it possible to increase the size of the readout line 5B2 and lower the resistance value without reducing the aperture ratio of the photodiode.

The above-mentioned photodiode array comprises the first insulating layer 17 formed on the quenching resistance 4, the auxiliary readout line 5A electrically connected to the quenching resistance 4 through the contact hole provided in the first insulating layer 17, and the second insulating layer 18 formed on the auxiliary readout line 5A, while the readout line 5B2 is electrically connected to the auxiliary readout line 5A through the contact hole provided in the second insulating layer 18 and extends in parallel with the auxiliary readout line 5A so as to be connected to the common electrode E3 together with the auxiliary readout line 5A (the first, second, and third examples).

Utilizing two readout lines can lower the resistance value in the part from the photodiode to the common electrode E3.

The above-mentioned photodiode array comprises the insulating layer 18 formed on the quenching resistance 4, the readout line 5B2 is electrically connected to the quenching resistance 4 through the contact hole provided in the insulating layer 18 and electrically connects the quenching resistance 4 and common electrode E3 to each other (the first to seventh examples). The auxiliary readout line 5A may not directly be connected to the common electrode (the fourth to seventh examples). These cases can increase the degree of freedom in designing the readout line 5B, so as to lower the time constant, thereby improving the signal readout speed.

The resistance value of the quenching resistance 4 is preferably 100 to 1000 kΩ. The resistance value of the line from the semiconductor region 14 of the photodiode to the common electrode serving as the electrode pad, which is more preferred as it becomes lower, is preferably 20Ω or less, further preferably 5Ω or less.

When the through electrode is used, as explained in the foregoing, the dead space is small for tiling over a large area, so as to yield a symmetrical arrangement, which makes it easier to reconstruct images in PET systems, CT systems, and the like. A symmetrical form is preferred in this structure, since corrections are necessary for reconstructing images in an asymmetrical chip equipped with a wire-bonding pad.

The through hole may have a tapered form such as a truncated pyramid or a rectangular parallelepiped or circular columnar form (straight form). The inside of the through hole may be hollow or filled with a metal or insulator. One or a plurality of through holes may be provided for one active channel. The size of the active channel may be any of 1×1 mm, 3×3 mm, and 6×6 or larger or smaller than them. The form may not be a square, but in such a size as 2×3 mm, for example. The cathode may be in direct contact with a rear face part of a bulk semiconductor substrate through a bump electrode, for example.

REFERENCE SIGNS LIST

1Na, 1Nb: principal surface; 12: first semiconductor region; 14 (13): second semiconductor region; BE, B2: bump electrode; E3: common electrode; PDA: photodiode array; R1: quenching resistance; TE: through electrode; 20: wiring board.

The invention claimed is:

1. A detector comprising:
a wiring board;
a plurality of semiconductor chips arranged on the wiring board while being two-dimensionally separated from each other; and
first and second bump electrodes arranged between each of the semiconductor chips and the wiring board;
wherein each of the semiconductor chips comprises:
a semiconductor substrate having a plurality of photodetector units arranged two-dimensionally;
a first insulating layer formed on a front face of the semiconductor substrate;
a common electrode arranged on the first insulating layer and arranged so as to be surrounded on all sides by the photodetector units;
a readout line for electrically connecting a quenching resistor of each of the photodetector units and the common electrode to each other;
a through electrode extending from the common electrode to a rear face of the semiconductor substrate through a through hole of the semiconductor substrate, the through hole tapering toward the common electrode; and
a second insulating layer arranged between an inner surface of the through hole and the through electrode;
wherein sheets are bonded to the semiconductor chips, respectively;

wherein the respective sheets are separate from each other;
wherein each of the photodetector units comprises:
an APD having a first semiconductor region of a first conduction type and a second semiconductor region of a second conduction type for constructing a p-n junction with the first semiconductor region and outputting a carrier; and
the quenching resistor electrically connected to the second semiconductor region of the APD;
wherein the first bump electrode electrically connects the through electrode and the wiring board to each other;
wherein the second bump electrode electrically connects the first semiconductor region of the APD and the wiring board to each other; and
wherein a size of the common electrode is more than two times a size of each of the APDs of the photodetector units.

2. A detector according to claim 1, wherein a scintillator is disposed on a front face of each of the semiconductor chips with an insulator interposed therebetween.

3. A detector according to claim 1, wherein each of the photodetector units comprises a surface electrode electrically connected to the second semiconductor region, the surface electrode surrounding the second semiconductor region along an outer edge thereof.

4. A detector according to claim 3, wherein, letting a plane including the front face of the second semiconductor region be a reference plane, the distance from the reference plane to the readout line is longer than that from the reference plane to the surface electrode; and
wherein the readout line is located between the APDs adjacent to each other.

5. A detector according to claim 1, comprising:
a first contact electrode in contact with the second semiconductor region; and
a second contact electrode, arranged at such a position as to overlap the first contact electrode while in contact with the first contact electrode, including a material different from that of the first contact electrode;
wherein the quenching resistor is continuous with the second contact electrode.

6. A detector according to claim 5, wherein the second contact electrode and quenching resistor comprise SiCr.

7. A detector according to claim 1, wherein the common electrode is placed at the center part of the semiconductor chip.

8. A detector according to claim 1, wherein the semiconductor comprises:
another common electrode arranged on the first insulating layer; and
another through electrode extending from the another common electrode to a rear face of the semiconductor substrate through a through hole of the semiconductor substrate.

9. A detector according to claim 1,
wherein the sheet is comprised of a material that can pass fluorescence from a scintillator.

10. A detector according to claim 9,
wherein the sheet is comprised of a material that can diffuse fluorescence from the scintillator.

11. A detector according to claim 9,
wherein the sheet is comprised of a glass.

12. A detector according to claim 1,
wherein the quenching resistor is electrically connected in series to the second semiconductor region of the APD.

13. A detector according to claim 1,
wherein the respective APDs of the photodetector units are electrically connected in parallel.

14. A detector according to claim 1,
wherein the semiconductor substrate comprises Si.

15. A detector according to claim 1,
wherein the size of the common electrode is more than three times the size of each of the APDs of the photodetector units.

16. A detector according to claim 1,
wherein the size of the common electrode is more than four times the size of each of the APDs of the photodetector units.

17. A detector according to claim 1,
wherein the first bump electrode is arranged outside the through hole of the semiconductor substrate.

18. A detector according to claim 1,
wherein the semiconductor chips are arranged on the wiring board so that a first distance (d1) separates each semiconductor chip from adjacent semiconductor chips,
wherein the respective second semiconductor regions in adjacent semiconductor chips are separated from each other by a second distance (d2), and
wherein the first distance (d1) and the second distance (d2) satisfy the following expression: $d1+100$ $\mu m \leq d2 \leq d1+200$ $\mu m$.

19. A PET system comprising:
a cradle; and
a gantry having an opening for placing the cradle;
wherein a plurality of the detectors according to claim 1 are arranged so as to surround the opening of the gantry.

20. An X-ray CT system comprising:
a cradle; and
a gantry having an opening for placing the cradle and incorporating an X-ray source for emitting an X-ray within the opening;
wherein a plurality of the detectors according to claim 1 are arranged at positions where the X-ray from the X-ray source is incident.

21. A detector according to claim 20,
wherein the respective APDs of the photodetector units are electrically connected in parallel.

22. A detector comprising:
a wiring board;
a plurality of semiconductor chips arranged on the wiring board while being two-dimensionally separated from each other; and
first and second bump electrodes arranged between each of the semiconductor chips and the wiring board;
wherein each of the semiconductor chips comprises:
a semiconductor substrate having a plurality of photodetector units arranged two-dimensionally;
a first insulating layer formed on a front face of the semiconductor substrate;
a common electrode arranged on the first insulating layer and arranged so as to be sandwiched by the photodetector units;
a readout line for electrically connecting a quenching resistor of each of the photodetector units and the common electrode to each other;
a through electrode extending from the common electrode to a rear face of the semiconductor substrate through a through hole of the semiconductor substrate, the through hole tapering toward the common electrode; and a second insulating layer arranged between an inner surface of the through hole and the through electrode;

wherein sheets are bonded to the semiconductor chips, respectively;

wherein the respective sheets are separate from each other;

wherein each of the photodetector units comprises:
- an APD having a first semiconductor region of a first conduction type and a second semiconductor region of a second conduction type for constructing a p-n junction with the first semiconductor region and outputting a carrier; and
- the quenching resistor electrically connected to the second semiconductor region of the APD;

wherein the first bump electrode electrically connects the through electrode and the wiring board to each other;

wherein the second bump electrode electrically connects the first semiconductor region of the APD and the wiring board to each other; and wherein a size of the common electrode is more than two times a size of each of the APDs of the photodetector units.

23. A detector according to claim 22, wherein the semiconductor substrate comprises Si.

24. A detector according to claim 22, wherein the size of the common electrode is more than three times the size of each of the APDs of the photodetector units.

25. A detector according to claim 22, wherein the size of the common electrode is more than four times the size of each of the APDs of the photodetector units.

26. A detector according to claim 22, wherein the first bump electrode is arranged outside the through hole of the semiconductor substrate.

27. A detector according to claim 22, wherein the semiconductor chips are arranged on the wiring board so that a first distance (d1) separates each semiconductor chip from adjacent semiconductor chips, wherein the respective second semiconductor regions in adjacent semiconductor chips are separated from each other by a second distance (d2), and wherein the first distance (d1) and the second distance (d2) satisfy the following expression: d1+100 µm≤d2≤d1+200 µm.

28. A detector comprising:
a wiring board;
semiconductor chips arranged on the wiring board, each of the semiconductor chips comprising:
- a semiconductor substrate comprising APDs, each of the APDs including a p-n junction constructed by a first semiconductor region of a first conduction type and a second semiconductor region of a second conduction type;
- quenching resistors electrically connected to the APDs, respectively;
- a first insulating layer arranged on a front face of the semiconductor substrate;
- a first electrode arranged on the first insulating layer, connected to the APDs, and arranged so as to be sandwiched by the APDs;
- a second electrode extending from the first electrode to a rear face of the semiconductor substrate through a through hole of the semiconductor substrate, the through hole tapering toward the first electrode; and
- a second insulating layer arranged between an inner surface of the through hole and the second electrode;

bump electrodes arranged between each of the semiconductor chips and the wiring board, the second electrode and the APDs being electrically connected to the wiring board via the bump electrodes; and sheets bonded to the semiconductor chips, respectively, wherein a size of the first electrode is more than two times a size of each of the APDs.

29. A detector according to claim 28, wherein the semiconductor substrate comprises Si.

30. A detector according to claim 28, wherein the size of the first electrode is more than three times the size of each of the APDs.

31. A detector according to claim 28, wherein the size of the first electrode is more than four times the size of each of the APDs.

32. A detector according to claim 28, wherein the bump electrodes are arranged outside the through hole of the semiconductor substrate.

33. A detector according to claim 28, wherein the semiconductor chips are arranged on the wiring board so that a first distance (d1) separates each semiconductor chip from adjacent semiconductor chips, wherein the respective second semiconductor regions in adjacent semiconductor chips are separated from each other by a second distance (d2), and wherein the first distance (d1) and the second distance (d2) satisfy the following expression: d1+100 µm≤d2≤d1+200 µm.

* * * * *